US009939697B2

(12) United States Patent
Sugimoto et al.

(10) Patent No.: US 9,939,697 B2
(45) Date of Patent: Apr. 10, 2018

(54) ELECTRO-OPTICAL DEVICE AND ELECTRONIC APPARATUS

(71) Applicant: Seiko Epson Corporation, Tokyo (JP)

(72) Inventors: Yohei Sugimoto, Fujimi-machi (JP); Minoru Moriwaki, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/120,106

(22) PCT Filed: Mar. 31, 2015

(86) PCT No.: PCT/JP2015/001864
§ 371 (c)(1),
(2) Date: Aug. 18, 2016

(87) PCT Pub. No.: WO2015/151517
PCT Pub. Date: Oct. 8, 2015

(65) Prior Publication Data
US 2017/0031221 A1  Feb. 2, 2017

(30) Foreign Application Priority Data

Apr. 1, 2014 (JP) .................. 2014-075179
Apr. 1, 2014 (JP) .................. 2014-075180
Apr. 1, 2014 (JP) .................. 2014-075181

(51) Int. Cl.
*H01L 29/12* (2006.01)
*G02F 1/1362* (2006.01)
(Continued)

(52) U.S. Cl.
CPC ...... *G02F 1/136213* (2013.01); *G02F 1/1368* (2013.01); *G02F 1/136227* (2013.01);
(Continued)

(58) Field of Classification Search
CPC ............ G02F 1/136213; G02F 1/1368; H04N 9/3105; H01L 27/1222; H01L 27/1255
See application file for complete search history.

(56) References Cited

U.S. PATENT DOCUMENTS

2004/0119899 A1\* 6/2004 Miyazaki .......... G02F 1/136227
349/38
2004/0145541 A1 7/2004 Iki et al.
(Continued)

FOREIGN PATENT DOCUMENTS

JP 2006-064967 A 3/2006
JP 2008-151901 A 7/2008
(Continued)

OTHER PUBLICATIONS

International Search Report, International Application No. PCT/JP2015/001864, dated Jun. 30, 2015.

*Primary Examiner* — Selim Ahmed
*Assistant Examiner* — Evan Clinton
(74) *Attorney, Agent, or Firm* — ALG Intellectual Property, LLC

(57) ABSTRACT

An electro-optical device is capable of high quality images. An electro-optical device (200) includes a first capacitive element (491), a second capacitive element (492), and a third capacitive element (493). The first capacitive element (491) includes a first conductive film (408), a first part of a second conductive film (411), and a first dielectric film (410). The second capacitive element (492) includes a third conductive film (416), a second part of a fourth conductive film (418), and a second dielectric film (417). The third capacitive element (493) includes the third conductive film (416), a third part of the fourth conductive film (418), and the second dielectric film (417). Since a capacitive element that includes a large capacitance value is formed in a narrow region, even if the pixel becomes smaller as the definition is (Continued)

increased, it is possible to realize an excellent electro-optical device in which display defects are suppressed.

15 Claims, 30 Drawing Sheets

(51) Int. Cl.
    *G02F 1/1368*     (2006.01)
    *H04N 9/31*     (2006.01)
    *H01L 27/12*     (2006.01)
    *H01L 29/786*     (2006.01)

(52) U.S. Cl.
    CPC ...... *G02F 1/136286* (2013.01); *H01L 27/124* (2013.01); *H01L 27/1222* (2013.01); *H01L 27/1255* (2013.01); *H01L 27/1274* (2013.01); *H01L 29/78678* (2013.01); *H04N 9/312* (2013.01); *H04N 9/3105* (2013.01)

(56) References Cited

U.S. PATENT DOCUMENTS

| | | |
|---|---|---|
| 2008/0143664 A1 | 6/2008 | Nakagawa |
| 2008/0197355 A1 | 8/2008 | Ishii et al. |
| 2011/0242470 A1 | 10/2011 | Moriwaki |
| 2011/0249227 A1 | 10/2011 | Moriwaki et al. |
| 2013/0044284 A1 | 2/2013 | Moriwaki |
| 2013/0082269 A1* | 4/2013 | Hanamura .......... H01L 27/1255 257/71 |
| 2014/0141223 A1 | 5/2014 | Yoda et al. |

FOREIGN PATENT DOCUMENTS

| | | |
|---|---|---|
| JP | 2011-221071 A | 11/2011 |
| JP | 2011-237776 A | 11/2011 |
| JP | 2012-078624 A | 4/2012 |
| JP | 2013-041131 A | 2/2013 |
| JP | 2013-080040 A | 5/2013 |
| JP | 2014-056212 A | 3/2014 |

* cited by examiner

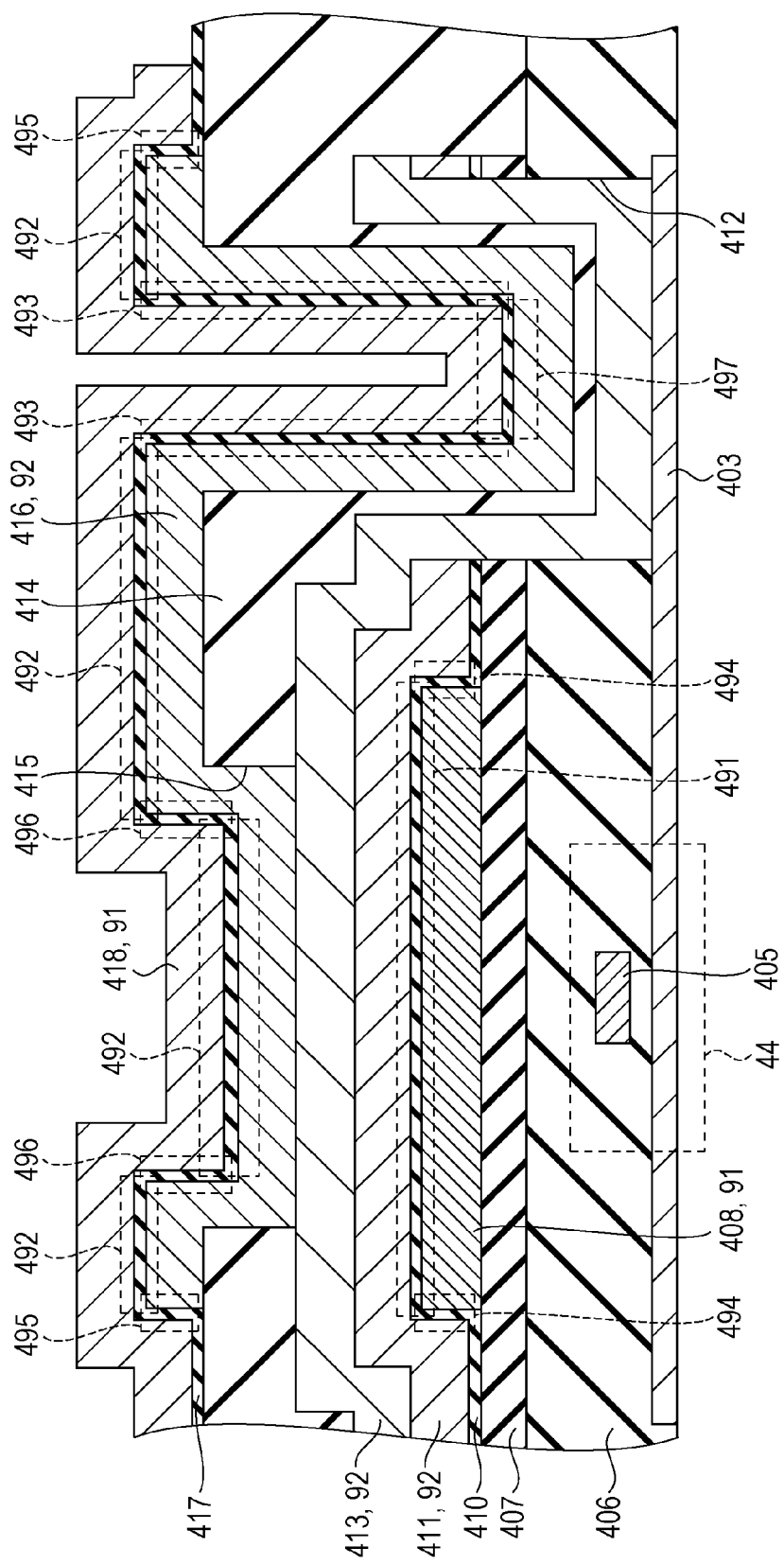

ELECTRO-OPTICAL DEVICE AND ELECTRONIC APPARATUS

TECHNICAL FIELD

The present invention relates to an electro-optical device and an electronic apparatus.

BACKGROUND ART

In general, transmissive-type electro-optical devices or reflective-type electro-optical devices are used in electronic apparatuses with a display function. These electro-optical devices are irradiated with light, and transmitted light or reflected light modulated by the electro-optical device becomes a display image; or becomes a projected image by being projected on a screen. A liquid crystal device is known as an electro-optical device used in such an electronic apparatus, and is a device that forms an image by using dielectric anisotropy of the liquid crystal and optical rotation of light in a liquid crystal layer. In the liquid crystal device, scanning lines and signal lines are arranged in an image display region, and pixels are arranged in a matrix form at the intersections thereof. A pixel transistor and a pixel capacitor are provided in the pixel, image signals are supplied to each pixel via the pixel transistor, and the image signals are held by image capacitor, thereby forming an image.

Meanwhile, in the electro-optical device, in order to increase display quality, the increase in the definition of the pixels proceeds. The capacitance value of the pixel capacitor is reduced accompanying the increase in definition, and there has been a situation in which it is difficult to stably hold the image signal. In a liquid crystal device, when it is difficult to hold the image signal, display defects occur. A method for solving this problem is described in PTL 1. In PTL 1, two capacitive elements are connected in parallel and these two capacitive elements are stacked.

CITATION LIST

Patent Literature

[PTL 1]
JP-A-2011-237776

SUMMARY OF INVENTION

Technical Problem

However, in the electro-optical device disclosed in PTL 1, the capacitance value is lowered along with further increases in the definition, and a situation in which defects may occur arises. In other words, in the electro-optical device of the related art, there is problem in which displaying a high definition image with high display quality is difficult. In a driving circuit in which a capacitive element with a large capacitance value is necessary, there is a problem of further increases in definition being difficult.

Solution to Problem

The invention was made in order to solve at least part of the above-described problem and can be realized in the following forms or application examples.

Application Example 1

According to this application example of the invention, there is provided electro-optical device including a first capacitive element; and a second capacitive element, in which the first capacitive element includes a first conductive film, a first part of a second conductive film, and a first dielectric film arranged between the first conductive film and the second dielectric film, the second capacitive element includes the first conductive film, a second part of the second conductive film, and the first dielectric film, the first conductive film includes a first surface and a second surface that intersects the first face, the first part is arranged so as to face the first surface, and the second part is arranged so as to face the second surface.

In this case, since the first capacitive element is formed using the first surface of the first conductive film and the first part of the second conductive film and the second capacitive element is formed using the second surface of the first conductive film and the second part of the second conductive film, the capacitance value per unit area can be increased. A capacitive element having a large capacitance value can be formed in a narrow region. Accordingly, when the first capacitive element and the second capacitive element are applied to the pixel, even if the pixel becomes smaller as the definition is increased, an excellent electro-optical device can be realized in which display defects are suppressed. For example, since the circuit area can be narrowed when the first capacitive element and the second capacitive element are applied to a signal line driving circuit or the like using a capacitance division digital-analogue conversion circuit (Digital to Analogue Converter, DAC), higher definition and gradation expression using digital driving can both be realized.

Application Example 2

The electro-optical device according to Application Example 1 preferably further includes a third capacitive element and it is preferable that the third capacitive element includes a third conductive film, a third part of a fourth conductive film, and a second dielectric film arranged between the third conductive film and the fourth conductive film, the third conductive film includes a third surface, and the third part is arranged so as to face the third surface.

In this case, by forming the third capacitive element using the third surface of the third conductive film and the third part of the fourth conductive film and stacking the third capacitive element on the first capacitive element, the capacitance value per unit area can be increased. A capacitive element having a large capacitance value can be formed in a narrow region. Accordingly, when the first capacitive element, second capacitive element, and third capacitive element are applied to the pixel, even if the pixel becomes smaller as the definition is increased, an excellent electro-optical device can be realized in which display defects are suppressed. For example, since the circuit area can be narrowed when the first capacitive element, the second capacitive element, and the third capacitive element are applied to a signal line driving circuit or the like using a capacitance division DAC, higher definition and gradation expression using digital driving can both be realized.

Application Example 3

In the electro-optical device according to Application Example 2, it is preferable that the first capacitive element and the third capacitive element are electrically connected in parallel.

In this case, since the first capacitive element, the second capacitive element, and the third capacitive element are connected in parallel, a capacitive element having a large capacitance value can be formed in a narrow region. Accordingly, when the first capacitive element, second capacitive element, and third capacitive element are applied to the pixel, even if the pixel becomes smaller as the definition is increased, an excellent electro-optical device can be realized in which display defects are suppressed. For example, since the circuit area can be narrowed when the first capacitive element, the second capacitive element, and the third capacitive element are applied to a signal line driving circuit or the like using a capacitance division DAC, higher definition and gradation expression using digital driving can both be realized.

Application Example 4

The electro-optical device according to Application Examples 2 or 3 preferably further includes a fourth capacitive element and it is preferable that the fourth capacitive element includes the third conductive film, a fourth part of the fourth conductive film, and the second dielectric film, the third conductive film includes a fourth surface that intersects the third surface, and the fourth part is arranged so as to face the fourth surface.

In this case, since the third capacitive element is formed using the third surface of the third conductive film and the third part of the fourth conductive film and the fourth capacitive element is formed using the fourth surface of the third conductive film and the fourth part of the fourth conductive film, the capacitance value per unit area can be increased. A capacitive element having a large capacitance value can be formed in a narrow region. Accordingly, for example, when the first capacitive element, the second capacitive element, the third capacitive element, and the fourth capacitive element are applied to the pixel, even if the pixel becomes smaller as the definition is increased, an excellent electro-optical device can be realized in which display defects are suppressed. For example, since the circuit area can be narrowed when the first capacitive element, the second capacitive element, the third capacitive element, and the fourth capacitive element are applied to a signal line driving circuit or the like using a capacitance division DAC, higher definition and gradation expression using digital driving can both be realized.

Application Example 5

The electro-optical device according to Application Example 4 preferably further includes a fifth capacitive element and it is preferable that the fifth capacitive element includes the third conductive film, a fifth part of the fourth conductive film, and the second dielectric film, the third conductive film includes a fifth surface that intersects the third surface of the third conductive film and is different from the fourth surface, and a fifth part is arranged so as to face the fifth surface.

In this case, since the third capacitive element is formed using the third surface of the third conductive film and the third part of the fourth conductive film, the fourth capacitive element is formed using the fourth surface of the third conductive film and the fourth part of the fourth conductive film, and the fifth capacitive element is formed using the fifth surface of the third conductive film and the fifth part of the fourth conductive film, the capacitance value per unit area can be increased. A capacitive element having a large capacitance value can be formed in a narrow region. Accordingly, for example, when the first capacitive element, the second capacitive element, the third capacitive element, the fourth capacitive element and the fifth capacitive element are applied to the pixel, even if the pixel becomes smaller as the definition is increased, an excellent electro-optical device can be realized in which display defects are suppressed. For example, since the circuit area can be narrowed when the first capacitive element, the second capacitive element, the third capacitive element, the fourth capacitive element and the fifth capacitive element are applied to a signal line driving circuit or the like using a capacitance division DAC, higher definition and gradation expression using digital driving can both be realized.

Application Example 6

In the electro-optical device according to any one of Application Examples 2 to 5, it is preferable that the thickness of the first conductive film and the third conductive film is 600 nanometers or less.

In this case, since the first conductive film and the third conductive film are thin at 600 nanometers or less, stress stemming from the first conductive film and the third conductive film is weak, and the occurrence of cracks can be suppressed. Accordingly, the reliability of the electro-optical device can be increased.

Application Example 7

The electro-optical device according to any one of application examples 1 to 6 preferably further includes a scanning line; a signal line; and a pixel transistor and it is preferable that a gate of the pixel transistor is electrically connected to the scanning line, one of a source and drain of the pixel transistor is electrically connected to the signal line, and the other of the source and drain of the pixel transistor is electrically connected to the second conductive film.

In this case, a capacitive element having a large capacitance value can be formed in a narrow region. Accordingly, even if the increase in definition proceeds and the pixels are made smaller, an excellent electro-optical device can be realized in which display defects are suppressed.

Application Example 8

According to this application example of the invention, there is provided an electro-optical device including a transistor; a first capacitive element; a second capacitive element; and a third capacitive element, in which the first capacitive element includes a first conductive film, a first part of a second conductive film, and a first dielectric film arranged between the first conductive film and the second conductive film, the first conductive film includes a first surface, the first part is arranged so as to face the first surface, the second capacitive element includes a third conductive film, a second part of a fourth conductive film, and a second dielectric film arranged between the third conductive film and the fourth conductive film, the third conductive film includes a second surface, the second part is arranged so as to face the second surface, the third capacitive element includes the third conductive film, a third part of the fourth conductive film, and the second dielectric film, the third conductive film includes a third surface, the third part is arranged so as to face the third surface, an insulating film covers a semiconductor film of the transistor, at least a portion of the third surface is opened in the insulating film, and is formed inside a contact hole for electrically connecting one or the other of a source and drain of the transistor and the second conductive film, and one or the other of the source and drain of the transistor and the second conductive film are electrically connected by a fifth conductive film.

In this case, the first capacitive element is formed using the first surface of the first conductive film and the first part of the second conductive film, the second capacitive element is formed using the second surface of the third conductive film and the second part of the fourth conductive film, and the third capacitive element is formed using the third surface of the third conductive film and the third part of the fourth conductive film. Since the second conductive film is connected to one or the other of the source and drain of the transistor via the fifth conductive film, information writing and holding to the first capacitive element can be controlled using the transistor. Since the third capacitive element is formed inside the contact hole, the capacitance value per unit area may be increased. That is, a capacitive element having a large capacitance value can be formed in a narrow region, and can be controlled by the transistor. Accordingly, when the configuration is applied to a pixel, even if the pixels are made smaller as the increase in definition proceeds, an excellent electro-optical device can be realized in which display defects are suppressed. For example, since the circuit area can be narrowed when the configuration is applied to a signal line driving circuit or the like using a capacitance division digital-analogue conversion circuit (Digital to Analogue Converter, DAC), an electro-optical device can be realized in which higher definition and gradation expression using digital driving are both realized.

Application Example 9

According to this application example of the invention, there is provided an electro-optical device including a transistor; a first capacitive element; a second capacitive element; and a third capacitive element, in which the first capacitive element includes a first conductive film, a first part of a second conductive film, and a first dielectric film arranged between the first conductive film and the second conductive film, the first conductive film includes a first surface, the first part is arranged so as to face the first surface, the second capacitive element includes a third conductive film, a second part of a fourth conductive film, and a second dielectric film arranged between the third conductive film and the fourth conductive film, the third conductive film includes a second surface, the second part is arranged so as to face the second surface, the third capacitive element includes the third conductive film, a third part of the fourth conductive film, and the second dielectric film, the third conductive film includes a third surface, the third part is arranged so as to face the third surface, an insulating film covers a semiconductor film of the transistor, in cross-sectional view, the first conductive film is arranged between the semiconductor film and the fourth conductive film, the second conductive film is arranged between the first conductive film and the fourth conductive film, and the third conductive film is arranged between the second conductive film and the fourth conductive film, and at least a portion of the third surface is opened in the insulating film, and is formed inside a contact hole for electrically connecting one or the other of a source and drain of the transistor and the second conductive film.

In this case, the first capacitive element is formed using the first surface of the first conductive film and the first part of the second conductive film, the second capacitive element is formed using the second surface of the third conductive film and the second part of the fourth conductive film, and the third capacitive element is formed using the third surface of the third conductive film and the third part of the fourth conductive film. Since the first capacitive element and the second capacitive element are stacked, and the third capacitive element is formed inside the contact hole, the capacitance value per unit area can be increased. That is, a capacitive element having a large capacitance value can be formed in a narrow region. Accordingly, when the configuration is applied to a pixel, even if the pixels are made smaller as the increase in definition proceeds, an excellent electro-optical device can be realized in which display defects are suppressed. For example, since the circuit area can be narrowed when the configuration is applied to a signal line driving circuit or the like using a capacitance division digital-analogue conversion circuit (DAC), an electro-optical device can be realized in which higher definition and gradation expression using digital driving are both realized.

Application Example 10

In the electro-optical device according to Application Examples 8 or 9, it is preferable that at least one of the first surface of the first conductive film and the first part of the second conductive film covers the transistor.

In this case, the first capacitive element and the transistor can be stacked. Accordingly, the capacitance value per unit area can be increased.

Application Example 11

In the electro-optical device according to any one of Application Examples 8 to 10, it is preferable that at least one of the second surface of the third conductive film and the second part of the fourth conductive film cover the first capacitive element.

In this case, the first capacitive element and the second capacitance element can be stacked. Accordingly, the capacitance value per unit area can be increased.

Application Example 12

In the electro-optical device according to any one of Application Examples 8, 10 or 11, it is preferable that the third conductive film and the fifth conductive film are electrically connected.

In this case, since the first capacitive element, the second capacitive element, and the third capacitive element are connected in parallel, a capacitive element having a large capacitance value can be formed in a narrow region.

Application Example 13

In the electro-optical device according to any one of Application Examples 9 to 11, it is preferable that the first capacitive element and the second capacitive element are electrically connected in parallel.

In this case, since the first capacitive element, the second capacitive element, and the third capacitive element are connected in parallel, a capacitive element having a large capacitance value can be formed in a narrow region.

Application Example 14

The electro-optical device according to any one of Application Examples 8 to 13 preferably further includes a fourth capacitive element and it is preferable that the fourth capacitive element includes the first conductive film, a fourth part of the second conductive film, and the first dielectric film, the first conductive film includes a fourth surface, the fourth part is arranged so as to face the fourth surface, and the first surface intersects the fourth surface.

In this case, since the fourth capacitive element is formed using the fourth surface of the first conductive film and the fourth part of the second conductive film, the capacitance value per unit area can be increased.

Application Example 15

In the electro-optical device according to any one of Application Examples 8 to 14, it is preferable that a first protective film is arranged between the insulating film and the first conductive film.

In this case, even if a step of removing the insulating film from the first surface or the fourth surface of the first conductive film is performed, there is no concern of the insulating film present on the lower portion of the first conductive film being removed. When the insulating film is removed from the first surface or the fourth surface of the first conductive film, the first capacitive element or the fourth capacitive element can be formed using the first surface or the fourth surface of the first conductive film. Accordingly, the first capacitive element and the fourth capacitive element can be formed and the reliability of the electro-optical device can be increased.

Application Example 16

The electro-optical device according to any one of Application Examples 9 to 15 preferably further includes a contact hole that electrically connects the first conductive film and the fourth conductive film.

In this case, the first conductive film and the fourth conductive film provided by stacking on the narrow region can be given the same potential.

Application Example 17

The electro-optical device according to any one of Application Examples 8 to 16 preferably further includes a scanning line; a signal line; and a pixel switching element, and it is preferable that the pixel switching element includes the transistor, a gate of the transistor is electrically connected to the scanning line, one of a source and drain of the transistor is electrically connected to the signal line, and the other of the source and drain of the transistor is electrically connected to the second conductive film.

In this case, a capacitive element having a large capacitance value can be formed in a small pixel. Accordingly, even if the pixels are made smaller as the increase in definition proceeds, display defects stemming from insufficient capacity can be suppressed and an excellent electro-optical device can be realized.

Application Example 18

According to this application example of the invention, there is provided an electronic apparatus including the electro-optical device according to any one of Application Examples 1 to 17.

In this case, an electronic apparatus can be provided with an excellent electro-optical device with a high resolution, in which display defects are suppressed, the electro-optical device capable of high resolution and gradation expression using digital driving or the like.

BRIEF DESCRIPTION OF DRAWINGS

FIG. 5 is a cross-sectional view describing the configuration of a semiconductor circuit according to Embodiment 1.

DESCRIPTION OF EMBODIMENTS

Below, embodiments of the invention will be described with reference to the drawings. Moreover, in each of the drawings below, because each of the layer and members is made to a visually recognizable size, the measurements of each layer and member are different in practice.

[Electronic Apparatus]
[Outline of Electronic Apparatus]

Figure 1:
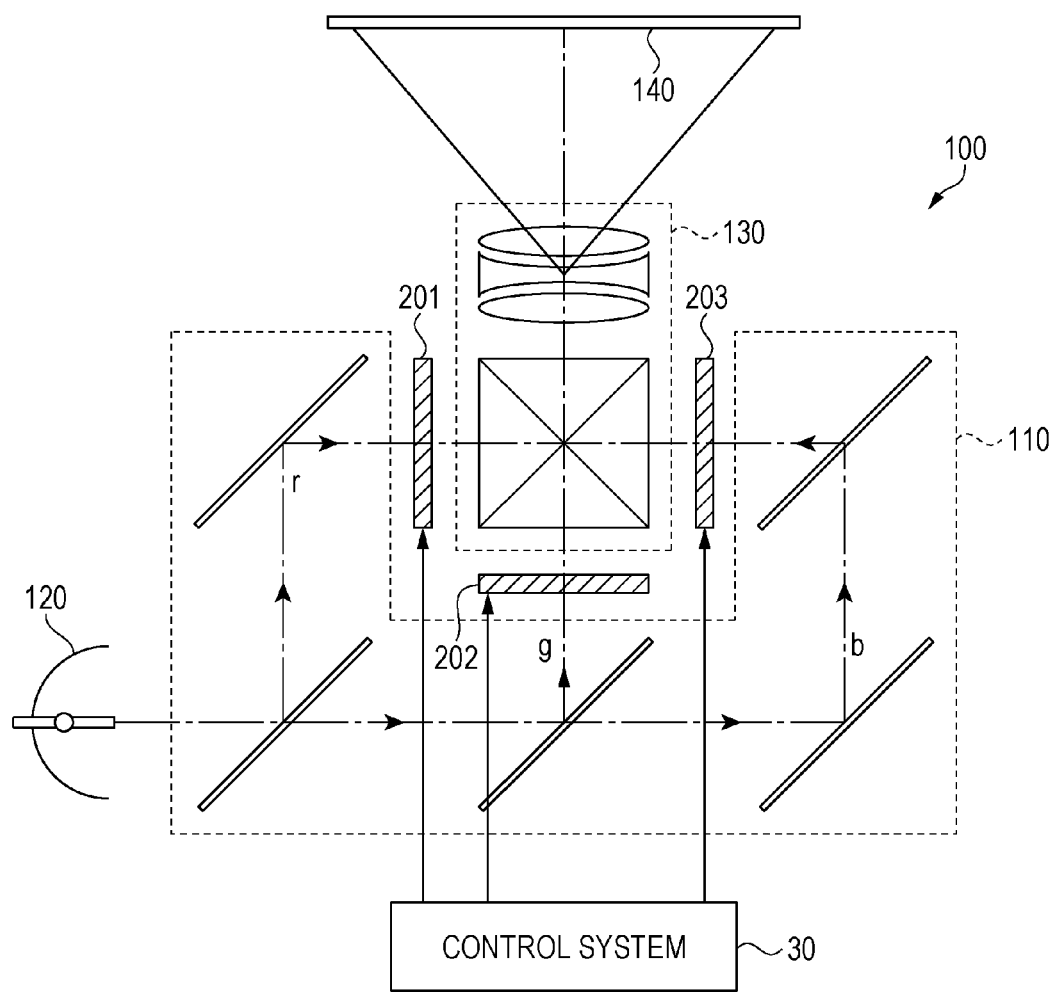
FIG. 1 is a schematic view of a projection-type display device that is an example of electronic apparatus.

FIG. 1 is a schematic diagram of a projection-type display device (3-plate type projector) that is an example of an item of the electronic apparatus. Below, a configuration of the electronic apparatus will be described with reference to FIG. 1.

The electronic apparatus (projection-type display device 100) has at least three electro-optical devices 200 (refer to FIG. 2, below, referred to as first panel 201, second panel 202, and third panel 203) and a control device 30 that supplies a control signal to the electro-optical devices 200. The first panel 201, second panel 202, and third panel 203 are three electro-optical devices 200 corresponding to display colors different from one another (red, green, and blue). Below, if there is no particular need to distinguish between the first panel 201, second panel 202, and third panel 203, these will simply be collectively referred to as the electro-optical device 200.

The illumination optical system 110 supplies a red component r to the first panel 201, supplies a green component g to the second panel 202, and supplies a blue component b to the third panel 203 from light emitted from the illumination device (light source) 120. Each electro-optical device 200 functions as an optical modulator (light valve) that modulates each color of light supplied from the illumination optical system 110 according to a display image. A projection optical system 130 synthesizes the light emitted from the electro-optical devices 200 and projects the light on a projection surface 140.

[Circuit Configuration of Electronic Apparatus]

Figure 2:
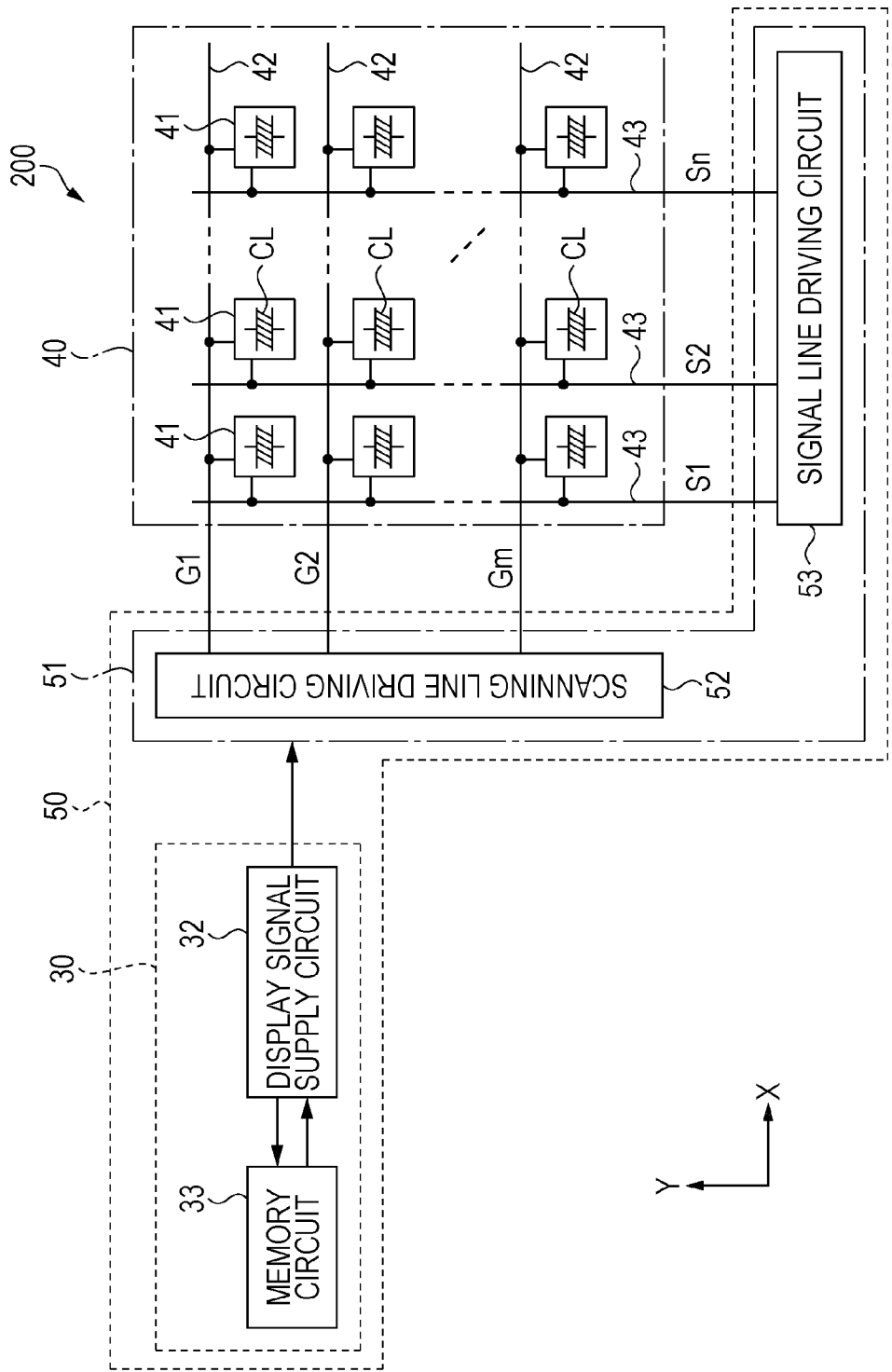
FIG. 2 is a circuit block diagram of the electro-optical device.

FIG. 2 is a circuit block diagram of the electro-optical device. Next, the circuit block configuration of the electro-optical device 200 will be described with reference to FIG. 2.

As shown in FIG. 2, the electro-optical device 200 is provided with at least a display region 40 and a driving portion 50. The electro-optical device 200 is further provided with amounting region 20 (refer to FIG. 4). A plurality of scanning lines 42 and a plurality of signal lines 43 that mutually intersect are formed and pixels 41 are arranged in a matrix corresponding to each intersection of the scanning lines 42 and the signal lines 43 in the display region 40 of the electro-optical device 200. The scanning lines 42 extend in the row direction and the signal lines 43 extend in the column direction. In the description, the direction parallel to the X axis is the row direction, and the direction parallel to the Y axis is the column direction. When i rows of scanning lines 42 are specified in the scanning lines 42, scanning lines Gi is denoted, and when j columns of signal lines 43 in the signal lines 43 are specified, signal lines Sj is denoted. M scanning lines 42 and n signal lines 43 (m is an integer or 2 or more, n is an integer of 2 or more) are formed in the display region 40. In the embodiment, the electro-optical device 200 will be described with m=2168, n=4112 as an example. In this case, a so-called 4K image with 2160 rows×4096 rows is displayed with respect to a display region 40 with 2168 rows×4112 columns.

Various signals are supplied from the driving portion 50 to the display region 40, and the image is displayed in the display region 40. That is, the driving portion 50 supplies driving signals to the plurality of scanning lines 42 and the plurality of signal lines 43. The driving portion 50 is configured to include a driving circuit 51 that drive each pixel 41, a display signal supply circuit 32 that supplies control signals to the driving circuit 51, and a memory circuit 33 that temporarily stores frame images. The display signal supply circuit 32 creates the display signal (image signal, clock signal or the like) from a frame image stored in the memory circuit 33, and supplies the signal to the driving circuit 51. The display signal supply circuit 32 also creates a pre-charge signal, and supplies the signal to the driving circuit 51.

The driving circuit 51 is configured to include a scanning line driving circuit 52 and a signal line driving circuit 53. The scanning line driving circuit 52 outputs scanning signals selecting or not selecting pixels 41 in the row direction to each scanning line 42, and the scanning lines 42 transfer these scanning signals to the pixels 41. In other words, the scanning signal has a selection state and a non-selection state, and the scanning lines 42 are sequentially selectable by receiving the scanning signals from the scanning line driving circuit 52. The scanning line driving circuit 52 is provided with a shift register circuit, not shown, and the signal that shifts the shift register circuit is output as a shift output signal for each stage. A scanning signal is formed using this shift output signal. It is possible for the signal line driving circuit 53 to supply the pre-charge signal or the image signal to each of the n signal lines 43 by synchronization to the selection of the scanning lines 42.

One display image is formed in one frame period. Each scanning line 42 is selected at least once in one frame period. Ordinarily, each scanning line 42 is selected one at a time. Since the period in which one scanning line is selected is referred to as a horizontal scanning period, at least m horizontal scanning periods are included in one frame period. Since one frame period is configured by sequentially selecting the scanning lines 42 from the first scanning line G1 to in order to the m-th scanning line Gm (alternatively, from the m-th scanning line Gm in order to the first scanning line G1), the frame period is also referred to as a vertical scanning period.

In the embodiment, the electro-optical device 200 is formed using an element substrate 62 (refer to FIG. 4), and the driving circuit 51 is formed on the element substrate 62 using a thin film element, such as a thin film transistor. The display signal supply circuit 32 and the memory circuit 33 are included in the control device 30 and the control device 30 is formed by a semiconductor circuit formed on a single crystal semiconductor substrate. A mounting region 20 is provided on the element substrate 62, and a display signal is supplied from the control device 30 to the driving circuit 51 via a terminal arranged in the mounting region 20 and a flexible printed substrate (Flexible Printed Circuit; FPC).

[Configuration of Pixel]

Figure 3:
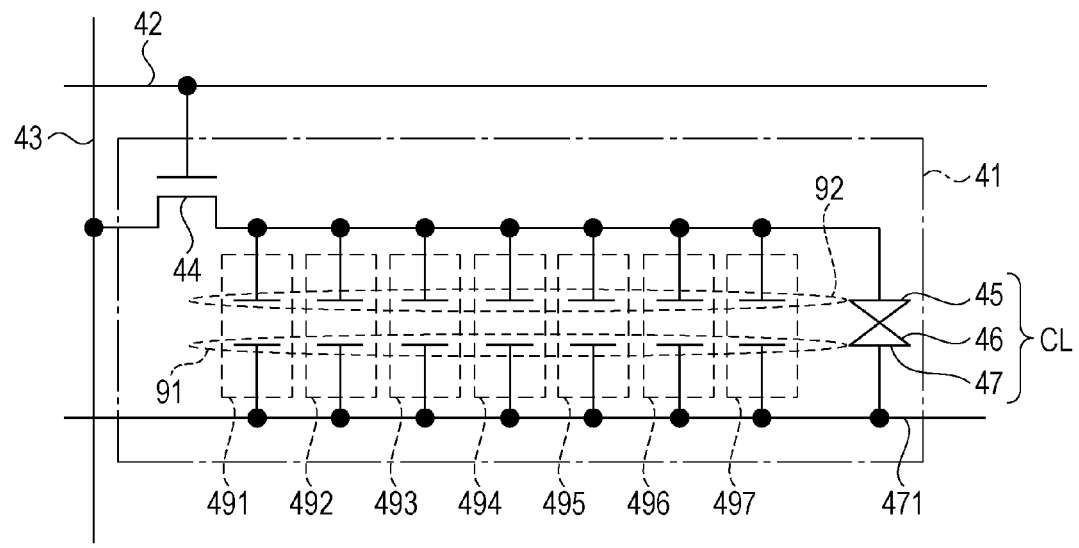
FIG. 3 is a circuit diagram of a pixel.

FIG. 3 is a circuit diagram of a pixel. Next, the configuration of the pixel 41 will be described with reference to FIG. 3.

The electro-optical device 200 of the embodiment is a liquid crystal device, and the electro-optical material is a liquid crystal 46. As shown in FIG. 3, each pixel 41 is configured to include a liquid crystal element CL, a pixel switching element, and a capacitive element. The pixel switching element is formed from a transistor, and is referred to in the description as a pixel transistor 44. The capacitive element includes a first capacitive element 491, a second capacitive element 492, a third capacitive element 493, a fourth capacitive element 494, a fifth capacitive element 495, a sixth capacitive element 496, and a seventh capacitive element 497. The first capacitive element 491, second capacitive element 492, third capacitive element 493, fourth capacitive element 494, fifth capacitive element 495, sixth capacitive element 496, and seventh capacitive element 497 are electrically connected in parallel, and a capacitive element having a large capacitance value in a narrow region, such as a pixel 41, is realized.

The liquid crystal element CL includes a pixel electrode 45 and a common electrode 47 opposing one another, and a liquid crystal 46 that is an electro-optical material is arranged between both electrodes. As a result, the transmissivity of light passing through the liquid crystal 46 changes according to the electric field applied between the pixel electrode 45 and the common electrode 47. An electrophoresis material may be used instead of the liquid crystal 46 as the electro-optical material. In this case, the electro-optical device 200 is an electrophoresis device, and is used in an electronic book or the like. Alternatively, an organic EL material may be used instead of the liquid crystal 46 as the electro-optical material. In this case, the electro-optical device 200 is an organic EL device, and is used in a smartphone, tablet terminal, or the like.

The pixel transistor 44 is formed by an N-channel thin film transistor in which a gate is connected to the scanning line 42, and is interposed between the liquid crystal element CL and the signal line 43, thereby controlling the electrical connection (connection/disconnection) of both. That is, the gate of the pixel transistor 44 is electrically connected to the scanning line 42, one of the source and drain of the pixel transistor 44 is electrically connected to the signal line 43, and the other of the source and drain of the pixel transistor is electrically connected to the second electrode 92 and the pixel electrode 45 of the capacitive element. The first electrode 91 and the common electrode 47 are electrically connected to the common potential line 471. A common potential is supplied to the common potential line 471. Accordingly, the pixel 41 (liquid crystal element CL) holds a potential (image signal) supplied to the signal line 43 when the pixel transistor 44 is in an on state in the capacitive element and performed display according to the image signal. Even if the pixels 41 become smaller as the increase in definition proceeds, since a capacitive element that includes a large capacitance value is formed in a narrow region such as the pixel 41, an excellent electro-optical device with high resolution and in which display defects stemming from an insufficient capacitance value in the capacitive element are suppressed.

In a case in which the electro-optical device 200 has an organic EL device, the circuit configuration of the pixel 41 of the organic EL device is slightly different from the configuration shown in FIG. 3, and further includes a driving transistor, not shown. In this case, the output (the other of the source and drain) of the pixel transistor 44 is electrically connected to the second electrode 92 of the capacitive element and the gate of the driving transistor, one of the source and drain of the driving transistor is connected to a power source, and the other of the source and drain of the driving transistor is connected to the pixel electrode 45. Since a capacitive element that includes a large capacitance value is formed in a narrow region such as the pixel 41 is formed also in a case of an organic EL device, an excellent electro-optical device with high resolution and in which display defects are suppressed.

In the description, the wording the terminal 1 and the terminal 2 are electrically connected indicates the terminals 1 and 2 being able to have the same logical state (potential in terms of the design concept). Specifically, in addition to a case in which the terminals 1 and 2 are directly connected by a wiring, a case of being connected via a resistance element, switching element or the like is included. That is, even if the potential in the terminal 1 and the potential in the terminal 2 differ slightly, in a case in which the same logic is held in the circuit, the terminal 1 and the terminal 2 are electrically connected. Accordingly, for example, as shown in FIG. 3, even in a case in which the pixel transistor 44 is arranged between the signal line 43 and the pixel electrode 45, since the image signal of the signal line 43 is supplied to the pixel electrode 45 with the pixel transistor 44 in an on state, the signal line 43 and the pixel electrode 45 are electrically connected.

[Structure of Liquid Crystal Device]

Figure 4:
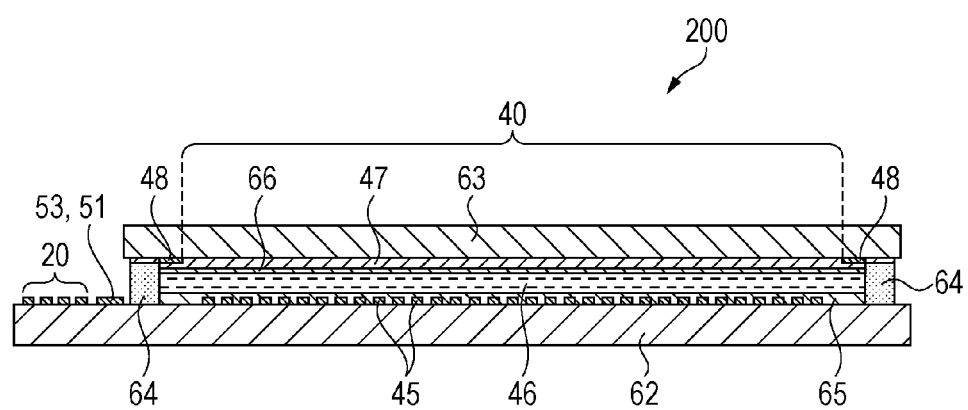
FIG. 4 is a schematic cross-sectional view of a liquid crystal device.

FIG. 4 is a schematic cross-sectional view of a liquid crystal device. Below, description will be given of the cross-sectional structure of the liquid crystal device with reference to FIG. 4. Moreover, in the following forms, for example, a case where "on part XX" is disclosed indicates a case of being arranged so as to contact the top of the part XX, a case of being arranged via another constituent component on top of the part XX, and a case where a portion is arranged so as to contact the top of the part XX, and a portion is arranged via another constituent component.

In the electro-optical device 200 (liquid crystal device), the element substrate 62 and the counter substrate 63 that configure a pair of substrates are bonded by a seal material 64 arranged in a substantially rectangular shape in plan view. The liquid crystal device is a configuration in which a liquid crystal 46 is sealed in a region surrounded by the seal material 64. A liquid crystal material having positive dielectric anisotropy is used as the liquid crystal 46. In the liquid crystal device, a light blocking film 48 with a rectangular frame shape in plan view formed from a light blocking material is formed on the counter substrate 63 along the vicinity of the inner periphery of the seal material 64, and the region on the inside of the light blocking film 48 is the display region 40. The light blocking film 48 is formed with aluminum (Al) that is a light blocking material, and is provided so as to divide the outer periphery of the display region 40 on the counter substrate 63 side.

As shown in FIG. 4, a plurality of pixel electrodes 45 are formed on the liquid crystal 46 side of the element substrate 62, and a first alignment film 65 is formed so as to cover the pixel electrodes 45. The pixel electrode 45 is formed from a transparent conductive film, such as an indium tin oxide (ITO) film. Meanwhile, a light blocking film 48 is formed on the liquid crystal 46 side of the counter substrate 63, and a planar solid common electrode 47 thereupon. A second alignment film 66 is formed on the common electrode 47. The common electrode 47 is formed from a transparent conductive film, such as ITO.

The liquid crystal device is a transmissive type, and is used by polarization plates (not shown) and the like being arranged on the incident side and the emission side of the light, respectively, in the element substrate 62 and the counter substrate 63. The configuration of the liquid crystal device is not limited thereto, and the configuration is preferably a reflective type or a semi-transmissive type.

In the semiconductor circuit of the related art that includes a transistor and a capacitive element, there is a problem of the capacitance value of the capacitive element decreasing remarkably accompanying the progression of miniaturization. In the semiconductor circuit used in an electro-optical device or the like, there frequently are cases in which the scaling law is not directly applicable with respect to the electro-optical material. For example, if the design rule is set to 0.5 times, there are frequently cases where the applied voltage to the electro-optical material does not fall to 0.5 times, and the thickness of the dielectric film of the capacitive element thereby enters a situation of not being able to reach 0.5 times. In this way, in a case in which the design rule is set to 0.5 times, the capacitance value of the capacitive element is reduced below 0.5 times, and the range of ordinary operation as a semiconductor circuit is limited. In contrast, in the semiconductor circuit shown in the embodiment, reductions in the capacitance value of the capacitive element are suppressed even if miniaturization progresses, and increases are further possible depending on the case. Below, these features will be described.

Embodiment 1

[Electro-Optical Device 1]

FIG. 5 is a cross-sectional view describing the configuration of a semiconductor circuit of the electro-optical device 200 according to Embodiment 1. Next, the configuration of a semiconductor circuit of the electro-optical device 200 according to Embodiment 1 will be described with reference to FIG. 5.

As shown in FIG. 5, the semiconductor circuit of the embodiment includes a transistor and a capacitive element, and the semiconductor circuit is a pixel circuit used in the pixel 41 of the electro-optical device 200.

Specifically, the transistor having a pixel circuit (semiconductor circuit) is a pixel transistor 44. The capacitive element including a pixel circuit includes a first capacitive element 491, a second capacitive element 492, a third capacitive element 493, a fourth capacitive element 494, a fifth capacitive element 495, a sixth capacitive element 496, and a seventh capacitive element 497.

The one or the other of the source and drain of the pixel transistor 44 is electrically connected to the first electrode 91 or the second electrode 92 of the capacitive element, and, in the embodiment, the other of the source and drain of the pixel transistor 44 is electrically connected to the second electrode 92 of the capacitive element.

The transistor (pixel transistor 44) includes the semiconductor film 403, a gate insulating film and a gate (in the embodiment, seventh conductive film 405), and these layers are covered by the first interlayer insulating film 406. In short, the semiconductor film 403 of the pixel transistor 44 is covered by the first interlayer insulating film 406. In the embodiment, the first protective film 407 further covers the first interlayer insulating film 406. A first conductive film 408 is formed on the first protective film 407, and the first dielectric film 410 covers the first conductive film 408. The second conductive film 411 is formed on the first dielectric film 410, and the second conductive film 411 is electrically connected to the fifth conductive film 413. The fifth conductive film 413 is also electrically connected to the third conductive film 416. The second dielectric film 417 covers the third conductive film 416, and the fourth conductive film 418 is formed on the second dielectric film 417. Accordingly, in cross-sectional view, the first conductive film 408 is arranged between the semiconductor film 403 and the fourth conductive film 418, the second conductive film 411 is arranged between the first conductive film 408 and the fourth conductive film 418, the third conductive film 416 is arranged between the second conductive film 411 and the fourth conductive film 418, and the fifth conductive film 413 is arranged between the second conductive film 411 and the third conductive film 416. Alternatively, in cross-sectional view, the first conductive film 408 is arranged between the semiconductor film 403 and the second conductive film 411, the second conductive film 411 is arranged between the first conductive film 408 and the third conductive film 416, and the third conductive film 416 is arranged between the second conductive film 411 and the fourth conductive film 418.

The second contact hole 412 is opened in the first interlayer insulating film 406 and the first protective film 407. This is because the second contact hole 412 electrically connects one or the other of the source and drain (in the embodiment, the other of the source and drain of the pixel transistor 44) of the transistor and the first electrode 91 or the second electrode 92 (in the embodiment, second conductive film 411 and third conductive film 416 in the second electrode 92). In practice, the fifth conductive film 413 electrically connects the other of the source and drain of the pixel transistor 44 and the second conductive film 411 and the third conductive film 416 via the second contact hole 412.

The first capacitive element 491 includes the first conductive film 408, the first part of the second conductive film 411 (one plane of the second conductive film 411, in the embodiment, bottom surface) and the first dielectric film 410 arranged between the first conductive film 408 and the second conductive film 411. The first conductive film 408 includes a first surface (one plane of the first conductive film 408, in the embodiment, upper surface), and a fourth surface (other surface of first conductive film 408, in the embodiment, side surface) that intersects the first surface. In the embodiment, since the planar shape of the first conductive film 408 is a polygonal shape (refer to FIG. 9A), the fourth surface that is the side surface includes the same number of flat cross-sections (cross-section configured from plane) as the number of sides of the polygon. However, if the planar shape of the first conductive film 408 is a shape drawn by curve, such as a circle or ellipse, the fourth surface is a cross-section configured from one continuous curved surface. In the first capacitive element 491, the first part (in the embodiment, bottom surface of the second conductive film 411) is arranged so as to face the first surface (in the embodiment, upper surface of the first conductive film 408). In this way, the first capacitive element 491 is formed using the first surface of the first conductive film 408 and the first part of the second conductive film 411.

The fourth capacitive element 494 includes the first conductive film 408, the fourth part of the second conductive film 411 and the first dielectric film 410 arranged between the first conductive film 408 and the second conductive film 411. The fourth part of the second conductive film 411 is a surface that intersects the first part in a portion of the second conductive film 411, and is the side surface in the embodiment. Accordingly, the fourth part of the second conductive film 411 (in the embodiment, side surface of the second conductive film 411) is arranged so as to face the fourth surface of the first conductive film 408 (in the embodiment, side surface of first conductive film 408). In this way, the fourth capacitive element 494 is formed using the fourth surface of the first conductive film 408 and the fourth part of the second conductive film 411. The first conductive film 408 functions as the first electrode 91 of the capacitive element, and the second conductive film 411 functions as the second electrode 92 of the capacitive element.

Figure 9A:
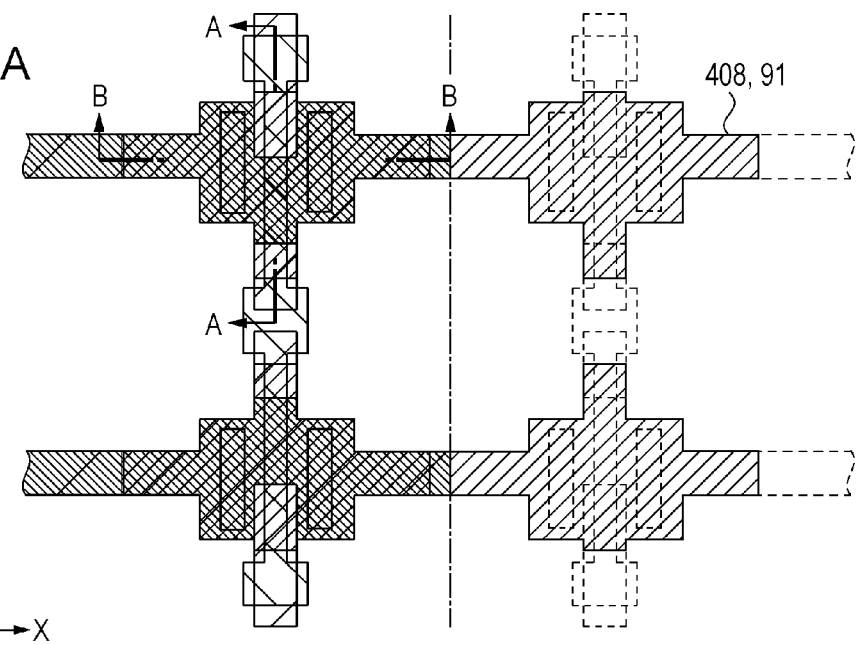
FIG. 9A is a drawing describing a method of manufacturing of an electro-optical device according to Embodiment 1.
Figure 12A:
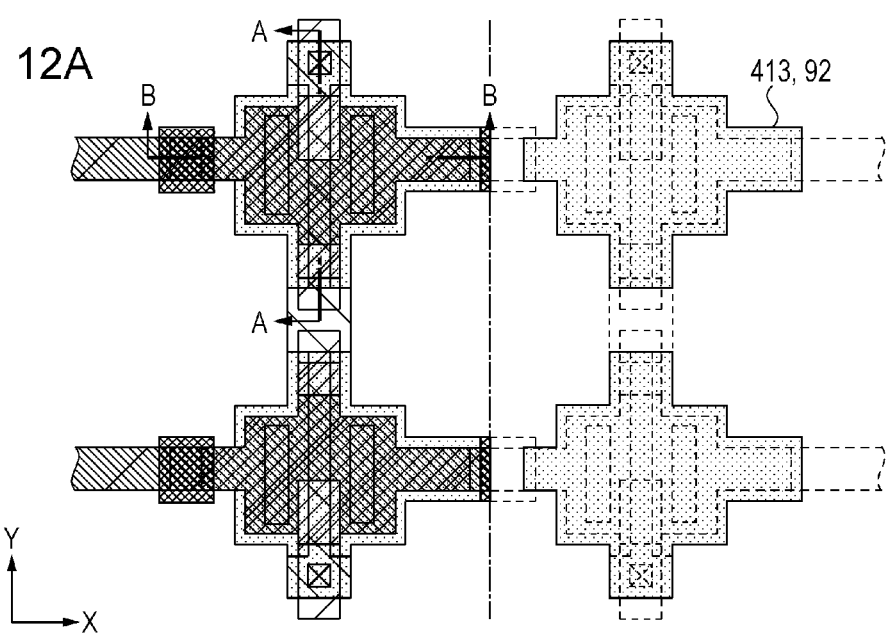
FIG. 12A is a drawing describing a method of manufacturing of an electro-optical device according to Embodiment 1.

The fourth capacitive element 494 is to be formed and the second conductive film 411 is formed so as to cover at least a portion of the outer circumference (fourth surface) of the first conductive film 408 in plan view. In the embodiment, since the planar shape of the second conductive film 411 and the planar shape of the fifth conductive film 413 are the same (refer to FIG. 12A), the second conductive film 411 is formed covering the majority of the outer periphery (fourth surface) of the first conductive film 408 by removing the formation portion of fifth contact hole 421 (refer to FIGS. 16A to 16C) from the first conductive film 408, thereby increasing the capacitance value. The planar shape of the first conductive film 408 is depicted in FIG. 9A, and the planar shape (planar shape of the fifth conductive film 413) of the second conductive film 411 is depicted in FIG. 12A.

It is preferable that at least one of the first surface of the first conductive film 408 and the first part of the second conductive film 411 cover the transistor. That is, it is preferable that the region (channel formation region) that overlaps the gate and the semiconductor film 403 of the transistor formed from the seventh conductive film 405 in plan view and the boundary portion of the channel formation region (boundary portion of the channel formation region and the source, and the boundary portion of the channel formation region and the drain) are covered by the first surface of the first conductive film 408 or the first part of the second conductive film 411 or both the first surface of the first conductive film 408 and first part of the second conductive film 411. Thus, since the first capacitive element 491 and the transistor are stacked, the transistor controls signal propagation to the capacitive element in the semiconductor circuit including the transistor and the capacitive element, and it is possible to increase the capacitance value per unit area. The reason the capacitive element obtains a comparatively large capacitance value is because charge of the capacitive element that corresponds to the information to be held leaks via the transistor due to the temperature or light. When the first capacitive element 491 and the transistor are stacked, since the leakage current of the transistor stemming from light is suppressed, the information maintenance capacity of the capacitive element is further improved, and the range of normal operations of the semiconductor circuit is further widened.

The second capacitive element 492 includes the third conductive film 416, the second part of the fourth conductive film 418 (at least one plane of the fourth conductive film 418, in the embodiment, bottom surface) and the second dielectric film 417 arranged between the third conductive film 416 and the fourth conductive film 418. The third conductive film 416 includes the second surface (one plane of the third conductive film 416, in the embodiment, upper surface). In the second capacitive element 492, the second part (in the embodiment, bottom surface of the fourth conductive film 418) is arranged so as to face the second surface (in the embodiment, upper surface of the third conductive film 416). In this way, the second capacitive element 492 is formed using the second surface of the third conductive film 416 and the second part of the fourth conductive film 418.

It is preferable that at least the second surface of the third conductive film 416 and the second part of the fourth conductive film 418 cover the first capacitive element 491. That is, it is preferable that the region (first capacitive element 491) adjacent to the first surface of the first conductive film 408 and the first part of the second conductive film 411 in plan view be covered by the second surface of the third conductive film 416 or the second part of the fourth conductive film 418, or both of the second surface of the third conductive film 416 and the second part of the fourth conductive film 418. Thus, it is possible for the first capacitive element 491 and the second capacitive element 492 to be stacked. Accordingly, it is possible for the capacitance value per unit area to be increased. It is possible for the light blocking capacity from above the transistor to be further increased. As a result, it is possible for the range of normal operations of the semiconductor circuit to be further widened.

The fifth conductive film 413 is arranged between the second conductive film 411 and the third conductive film 416, and the second conductive film 411 and the third conductive film 416 are electrically connected. Accordingly, the potential of the second conductive film 411 and the potential of the third conductive film 416 are substantially the same, and the third conductive film 416 functions as the second electrode 92 of the capacitive element. In short, the second electrode 92 of the capacitive element is electrically connected to the second conductive film 411, the third conductive film 416, the fifth conductive film 413, or the like. Meanwhile, the first conductive film 408 and the fourth conductive film 418 function as the first electrode 91 of the capacitive element.

The second interlayer insulating film 414 is arranged between the fifth conductive film 413 and the third conductive film 416, and the third contact hole 415 is formed in the second interlayer insulating film 414. Since the third conductive film 416 is formed so as to cover the third contact hole 415 in plan view, the third conductive film 416 includes a step difference at the boundary of the third contact hole 415 as shown in FIG. 5. As a result, the second surface (in the embodiment, upper surface of the third conductive film 416) of the third conductive film 416 includes an upper surface (inside upper surface) formed on the inside of the third contact hole 415 and an upper surface (outside upper surface) formed on the outside of the third contact hole 415. Similarly, the second part (in the embodiment, bottom surface of the fourth conductive film 418) of the fourth conductive film 418 includes a bottom surface (inside bottom surface) formed on the inside of the third contact hole 415 and a bottom surface (outside bottom surface) formed on the outside of the third contact hole 415. Accordingly, the second capacitive element 492 includes a part formed on the inside upper surface and the inside bottom surface, and a part formed on the outside upper surface and the outside bottom surface.

The fifth capacitive element 495 includes the third conductive film 416, a fifth part of the fourth conductive film 418, and the second dielectric film 417. The third conductive film 416 includes a fifth surface (another surface of the third conductive film 416, in the embodiment, outer peripheral side surface) that intersects the second surface. In the embodiment, since the planar shape of the third conductive film 416 is a polygon (refer to FIG. 14A), the fifth surface that is the outer peripheral side surface includes the same number of flat cross-sections (cross-section configured from the plane) as the number of sides of the planar polygon of the third conductive film 416. If the planar shape of the third conductive film 416 is a shape drawn by a curve such as a circle or ellipse, the fifth surface is a cross-section configured from one continuous curved surface. The fifth part of the fourth conductive film 418 is a surface that intersects the second part at a portion of the fourth conductive film 418, and is arranged so as to face the fifth surface (in the embodiment, outer peripheral side surface of the third conductive film 416) of the third conductive film 416. In this way, the fifth capacitive element 495 is formed using the fifth surface of the third conductive film 416 and the fifth part of the fourth conductive film 418.

Figure 14A:
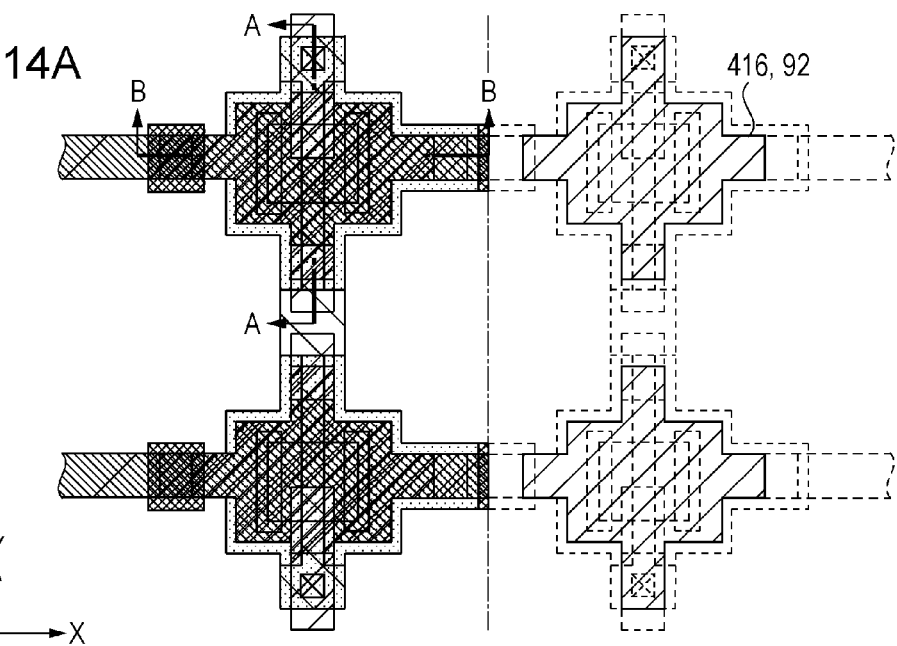
FIG. 14A is a drawing describing a method of manufacturing of an electro-optical device according to Embodiment 1.
Figure 15A:
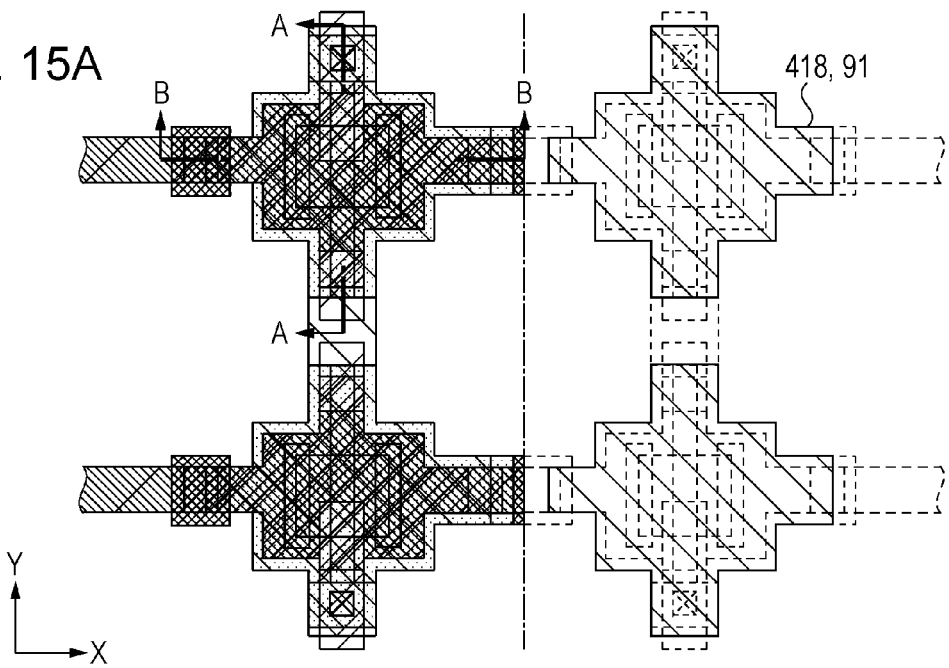
FIG. 15A is a drawing describing a method of manufacturing of an electro-optical device according to Embodiment 1.

The fifth capacitive element 495 is to be formed and the fourth conductive film 418 is formed so as to cover at least a portion of the outer circumference (fifth surface) of the third conductive film 416 in plan view. In the embodiment, the fourth conductive film 418 is formed so as to cover the majority of the outer peripheral surface (fifth surface) of the third conductive film 416, and the capacitance value is increased. The planar shape of the third conductive film 416 is depicted in FIG. 14A and the planar shape of the fourth conductive film 418 is depicted in FIG. 15A.

The sixth capacitive element 496 includes the third conductive film 416, a sixth part of the fourth conductive film 418, and the second dielectric film 417. The third conductive film 416 includes a sixth surface different from the fifth surface and that intersects the second surface of the third conductive film 416. As shown in FIG. 5, since the third conductive film 416 has a step difference that stems from the third contact hole 415, the sixth surface (inner peripheral side surface) of the third conductive film 416 is formed at the step difference portion. The sixth part of the fourth conductive film 418 is arranged so as to face the sixth surface.

The third capacitive element 493 includes the third conductive film 416, a third part of the fourth conductive film 418, and the second dielectric film 417. The third conductive film 416 includes the third surface, intersects the second surface, and is different from the fifth and sixth surfaces. The third capacitive element 493 is formed in the inside of the second contact hole 412. That is, at least a portion of the third surface is formed on the inside of the second contact hole 412. Specifically, the third conductive film 416 is formed so as to cover at least a portion of the second contact hole 412 in plan view. In the embodiment, the third conductive film 416 is formed so as to cover the entire second contact hole 412 and the third surface is a surface substantially parallel to the side surface (referred to as the contact hole side surface) of the second contact hole 412. The second dielectric film 417 is also formed so as to cover at least a portion of the second contact hole 412 in plan view, and, in the embodiment, is formed so as to cover the entire second contact hole 412. The fourth conductive film 418 is also formed so as to cover at least a portion of the second contact hole 412 in plan view, and, in the embodiment, is formed so as to cover the entire second contact hole 412. Since the third part of the fourth conductive film 418 is arranged so as to face the third surface of the third conductive film 416 via the second dielectric film 417, the third part becomes a surface substantially parallel to the contact hole side surface.

The seventh capacitive element 497 includes the third conductive film 416, the seventh part of the fourth conductive film 418, and the second dielectric film 417. The third conductive film 416 includes a seventh surface (in the embodiment, upper surface substantially parallel to the bottom surface (referred to as the contact hole bottom surface) of the second contact hole 412) different from the second surface (in the embodiment, upper surface of third contact hole 416) and that intersects the third surface (surface substantially parallel to the contact hole side surface) of the third conductive film 416. Since the seventh part of the fourth conductive film 418 is arranged so as to face the seventh surface of the third conductive film 416 via the second dielectric film 417, the seventh part becomes a surface substantially parallel to the contact hole bottom surface. In short, the third capacitive element 493 and the seventh capacitive element 497 are formed in the inside of the second contact hole 412.

In this way, since the second capacitive element 492 is formed using the second surface of the third conductive film 416 and the second part of the fourth conductive film 418, the third capacitive element 493 is formed using the third surface of the third conductive film 416 and the third part of the fourth conductive film 418, the fifth capacitive element 495 is formed using the fifth surface of the third conductive film 416 and the fifth part of the fourth conductive film 418, the sixth capacitive element 496 is formed using the sixth surface of the third conductive film 416 and the sixth part of the fourth conductive film 418, and the seventh capacitive element 497 is formed using the seventh surface of the third conductive film 416 and the seventh part of the fourth conductive film 418, it is possible for the capacitance value per unit area to be increased. In other words, the capacitive element (a first capacitive element 491, a second capacitive element 492, a third capacitive element 493, a fourth capacitive element 494, a fifth capacitive element 495, a sixth capacitive element 496, and a seventh capacitive element 497 arranged in parallel) having a large capacitance value in a narrow region such as a pixel 41 is formed. Accordingly, even if the pixels 41 are made smaller as the increase in definition proceeds, display defects stemming from insufficient capacity are suppressed.

As determined when viewing FIG. 5, although it is preferable that the capacitance value of the fourth capacitive element 494 and the capacitance value of the fifth capacitive element 495 increase as the first conductive film 408 or the third conductive film 416 becomes thicker, it is preferable that the thickness of the first conductive film 408 and the third conductive film 416 be 600 nanometers (nm) or less. This is because when the first conductive film 408 and the third conductive film 416 is as thin as 600 nanometers (nm) or less, the stress stemming from the first conductive film 408 and the third conductive film 416 weakens, and situations in which cracks occur in the second interlayer insulating film 414 or the like are suppressed. In short, by making the first conductive film 408 and the third conductive film 416 as thin as 600 nanometers (nm) or less, the reliability of the electro-optical device increases.

Although it is preferable that the capacitance value of the sixth capacitive element 496 increase as the second interlayer insulating film 414 becomes thicker, it is preferable that the thickness of the second interlayer insulating film 414 be 400 nanometers (nm) or less. When the second interlayer insulating film 414 is as thin as 400 nanometers (nm), the step difference stemming from the second interlayer insulating film 414 becomes smaller. Therefore, the connection reliability of the various wirings, such as the signal lines 43 formed on the second interlayer insulating film 414 is improved. Since the second interlayer insulating film 414 is as thin as 400 nanometers or less, the light blocking properties are improved in a case of using a conductive film, such as the third conductive film 416 formed on the second interlayer insulating film 414, as the light blocking film of the pixel transistor 44. That is, it is possible for the light leakage current of the pixel transistor 44 to be suppressed, and for the operational reliability of the electro-optical device 200 to be improved. In short, by making the thickness of the second interlayer insulating film 414 as thin as 400 nanometers (nm) or less, it is possible for disconnection defects stemming from the step difference to be suppressed, the light leakage current of the transistor to be suppressed, and the reliability of the electro-optical device 200 to be increased.

In the embodiment, although the first conductive film 408, the first dielectric film 410, the second conductive film 411, the fifth conductive film 413, the third conductive film 416, the second dielectric film 417, and the fourth conductive film 418 are stacked on the transistor in order that the capacitance value per unit area increase, the cross-sectional configuration is not limited thereto. For example, the transistor and the first capacitive element 491 are preferably formed at different positions in plan view, without stacking the transistor and the first capacitive element 491. Alternatively, the transistor and the second capacitive element 492 are preferably formed at different positions in plan view, without stacking the transistor and the second capacitive element 492. Alternatively, the first capacitive element 491 and the second capacitive element 492 are preferably formed at different positions in plan view, without stacking the first capacitive element 491 and the second capacitive element 492. The first capacitive element 491 and the second capacitive element 492 are preferably formed at different positions in plan view and a part of all of a film that configures the first capacitive element 491 and the second capacitive element 492 is preferably as made the same layer viewed in cross-section. For example, the first conductive film 408 and the fourth conductive film 418 are preferably same layer, or the first dielectric film 410 and the second dielectric film 417 are preferably the same layer, or the second conductive film 411 and the third conductive film 416 are preferably the same layer. In any case, one or the other of the source and drain of the transistor is electrically connected to the second conductive film 411 and the third conductive film 416 with the fifth conductive film 413.

[Method of Manufacturing 1]

FIGS. 6A to 17C are drawings describing the method of manufacturing of an electro-optical device according to Embodiment 1, in which A is a plan view, B is a cross-sectional view taken along line A-A in A, and C is a cross-sectional view taken along line B-B in A. Next, the method of manufacturing of the electro-optical device will be described with reference to FIGS. 6A to 17C. For ease of understanding of the description in FIGS. 7A to 17C, the layers appearing up to the drawing are overwritten on the left side of the single-dotted line, the layers appearing previous to the drawing are indicated by a broken line on the right side of the single-dotted line, and the newly added layers in the drawing are depicted using solid lines and hatching. Hatching is not used in the contact hole.

Figure 6A:
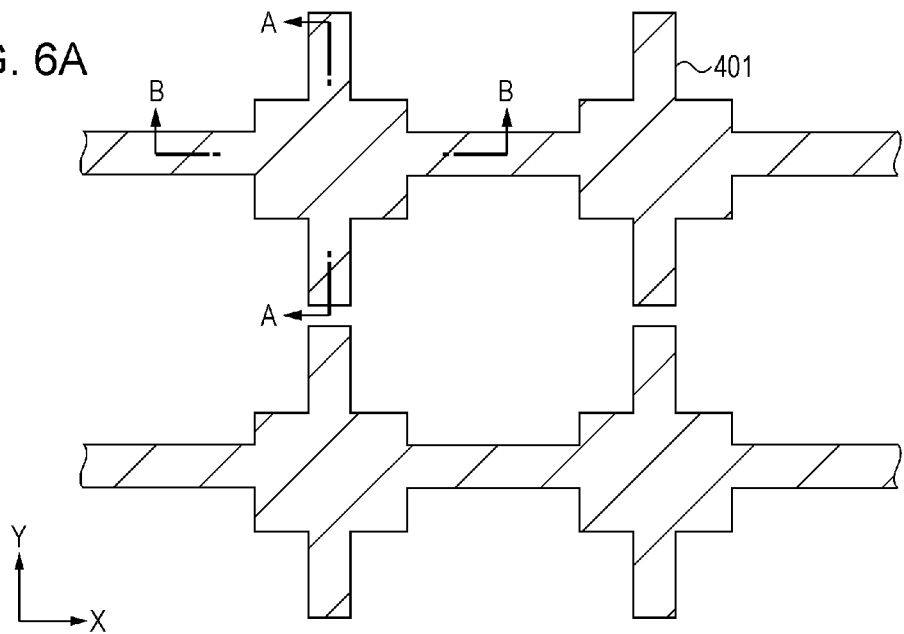
FIG. 6A is a drawing describing a method of manufacturing of an electro-optical device according to Embodiment 1.
Figure 6B:
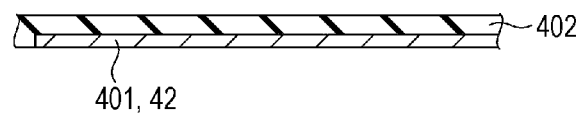
FIG. 6B is a drawing describing a method of manufacturing of an electro-optical device according to Embodiment 1.
Figure 6C:
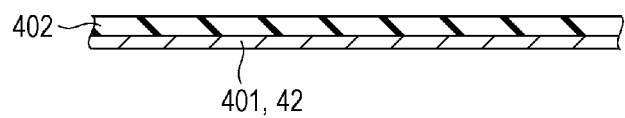
FIG. 6C is a drawing describing a method of manufacturing of an electro-optical device according to Embodiment 1.

A transparent substrate main body, such as a quartz substrate or a glass substrate, is used as the element substrate 62. As shown in FIGS. 6A to 6C, first, the sixth conductive film 401 is formed on the substrate surface (surface side facing the counter substrate 63) of the liquid crystal 46 side of the substrate main body. The sixth conductive film 401 is a lower light blocking film serving as a lower scanning line 42, and is formed from a conductive film, such as a conductive polysilicon film, a metal silicide film, a metal film or a metal compound film.

The sixth conductive film 401 in the embodiment is formed from a light blocking metal film, such as tungsten silicide (WSi), and prevents light incident from the element substrate 62 side from being incident on the semiconductor film 403 (refer to FIGS. 7A to 7C) of the pixel transistor 44 and misoperations stemming from a light current on the pixel transistor 44. The sixth conductive film 401 is provided with a main line part extending linearly in the X direction, a sub-line part extending in the Y direction extended so as to overlap the signal line 43 formed thereafter, and a rectangular part in which the pixel transistor 44 or the capacitive element is formed.

On the surface side of the substrate main body, a light blocking base insulating film 402 is formed on the upper layer side of the sixth conductive film 401 (lower scanning line 42 serving as lower light blocking film), and a pixel transistor 44 provided with a semiconductor film 403 is formed on the surface side of the base insulating film 402. The base insulating film 402 is formed from a silicon oxide film to which impurities are not intentionally introduced (referred to as Nondoped silicate glass, NSG film), or a silicon nitride film. Such a base insulating film 402 is formed by a normal pressure CVD method, a reduced pressure CVD method, or a plasma CVD method using silane gas ($SiH_4$), dichlorosilane ($SiCl_2H_2$), TEOS (tetraethoxysilane/tetraethyl ortho silicate/$Si(OC_2H_5)_4$), ammonia ($NH_3$), or the like.

Figure 7A:
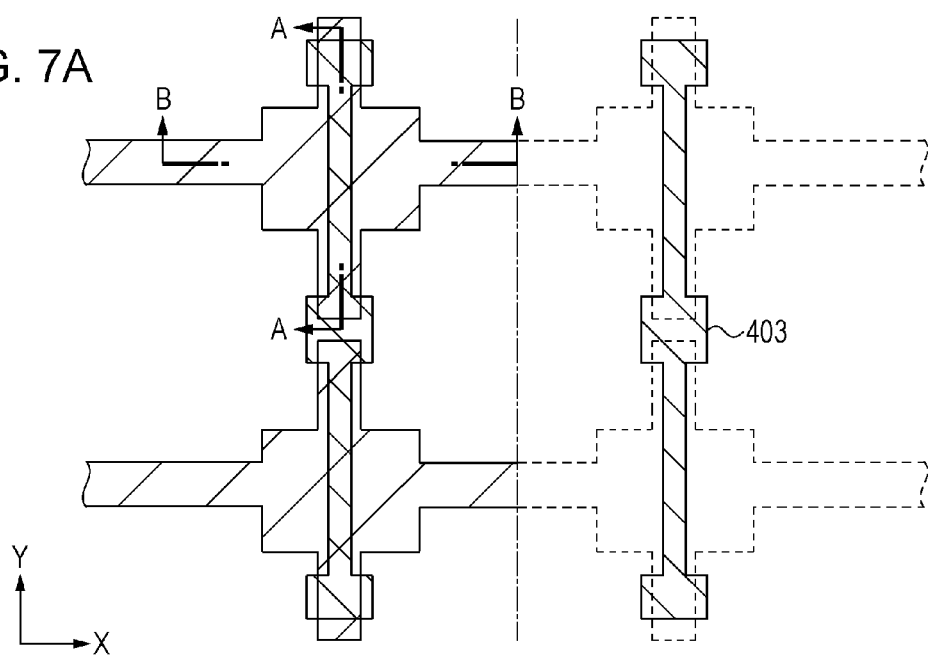
FIG. 7A is a drawing describing a method of manufacturing of an electro-optical device according to Embodiment 1.
Figure 7B:
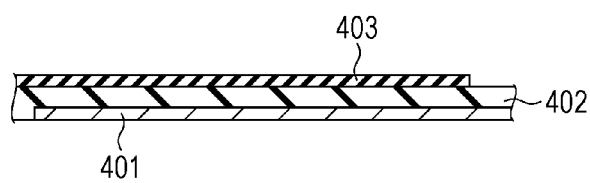
FIG. 7B is a drawing describing a method of manufacturing of an electro-optical device according to Embodiment 1.
Figure 7C:
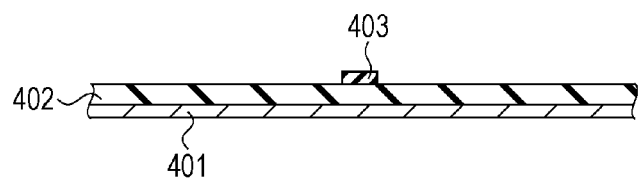
FIG. 7C is a drawing describing a method of manufacturing of an electro-optical device according to Embodiment 1.

Next, as shown in FIGS. 7A to 7C, the process proceeds to the step for forming the semiconductor film 403 on the base insulating film 402. The semiconductor film 403 is formed by a polysilicon film (polycrystalline silicon film) or the like. The pixel transistor 44 uses the semiconductor film 403 as the active layer. The semiconductor film 403 is a polycrystalline film in which an amorphous silicon film is first deposited with a reduced pressure CVD method or the like, and thereafter subjected to crystallization. After the amorphous silicon film is deposited, the semiconductor film 403 is subjected to patterning work to a shape following the extension direction (Y direction) of the signal line 43. In the next step, the amorphous silicon film is modified to a polycrystalline film when forming the gate insulating film. The gate insulating film is formed from a two layer structure with a first gate insulating film formed from a silicon oxide film in which the semiconductor film 403 is thermally oxidized and a second gate insulating film formed from a silicon oxide film formed with a reduced pressure CVD method in temperature conditions of a temperature 700 degrees Celsius to 900 degrees Celsius.

Figure 8A:
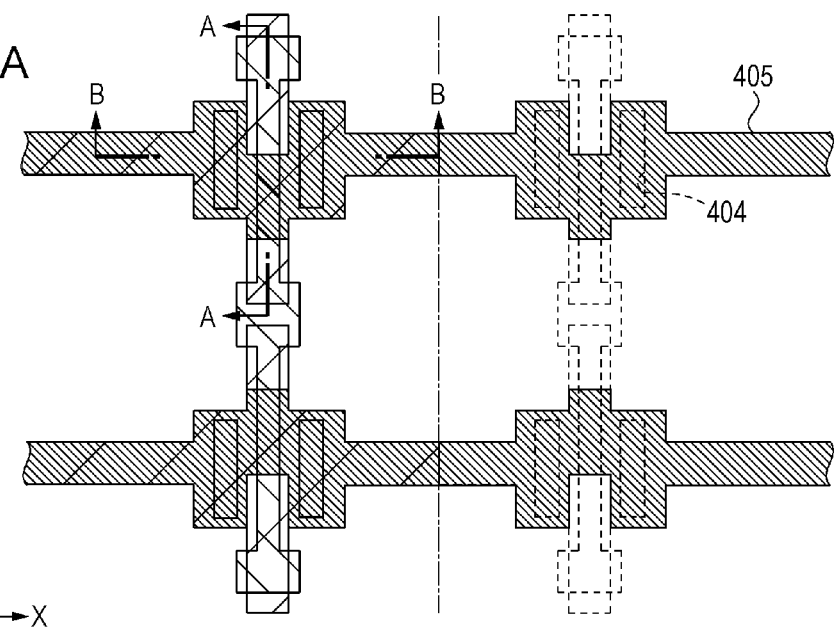
FIG. 8A is a drawing describing a method of manufacturing of an electro-optical device according to Embodiment 1.
Figure 8B:
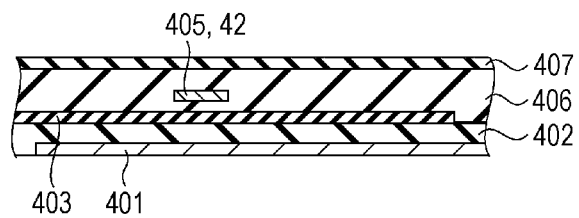
FIG. 8B is a drawing describing a method of manufacturing of an electro-optical device according to Embodiment 1.
Figure 8C:
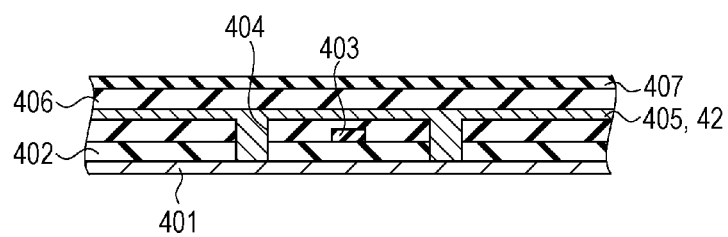
FIG. 8C is a drawing describing a method of manufacturing of an electro-optical device according to Embodiment 1.

Next, as shown in FIGS. 8A to 8C, after the first contact hole 404 is opened in the gate insulating film and the base insulating film 402, a seventh conductive film 405 is formed on the gate insulating film. The first contact hole 404 establishes the electrical connection between the sixth conductive film 401 and the seventh conductive film 405. The seventh conductive film 405 functions as an upper side scanning line 42 and the semiconductor film 403 facing the seventh conductive film 405 via the gate insulating film becomes a channel forming region. Accordingly, the part that overlaps the semiconductor film 403 at the seventh conductive film 405 in plan view is the gate of the pixel transistor 44. The pixel transistor 44 is provided with a source and a drain on both sides of the channel forming region in plan view and has an LDD structure. That is, the source and drain are each provided with a low density region on both sides of the channel forming region, and are provided a high density region in a neighboring region on the opposite side of the channel forming region with respect to the low density region.

The seventh conductive film 405 (scanning line 42 on the upper side) is formed from a conductive film, such as a degenerate semiconductor (conductive polysilicon film), a metal silicide film, a metal film or a metal compound film, or the like. In the embodiment, the seventh conductive film 405 forms a two layer structure with a conductive polysilicon film and tungsten silicide film. Phosphorous diffusion is performed after the polycrystalline silicon film doped with phosphorous is deposited with a reduced pressure CVD method, the conductive polysilicon film is formed such that the phosphorous atoms are included in the semiconductor at a concentration of $1 \times 10^{19}/cm^3$ or more.

Next, the process proceeds to a step for forming the first interlayer insulating film 406 so as to cover the seventh conductive film 405. The first interlayer insulating film 406 is formed from an NSG film or a silicon oxide film such as a silicon oxide film that includes or phosphorous (referred to as a phospho silicate glass, PSG film), silicon oxide film that includes boron (referred to as boro silicate glass, BSG film), or a silicon oxide film that includes boron and phosphorous (referred to as borophospho silicate glass, BPSG film). Such an insulating film is formed by a normal pressure CVD method, a reduced pressure CVD method, or a plasma CVD method using silane gas, dichlorosilane, TEOS, TEB (Triethyl borate), TMOP (Trimethyl phosphate).

Next, the process proceeds to a step for forming the first protective film 407 so as to cover the first interlayer insulating film 406. The first protective film 407 is formed from a silicon nitride film (SiN), and is formed by a normal pressure CVD method, a reduced pressure CVD method or a plasma CVD method or the like using silane gas, dichlorosilane, ammonia ($NH_3$), nitrogen ($N_2$) or the like.

Figure 9B:
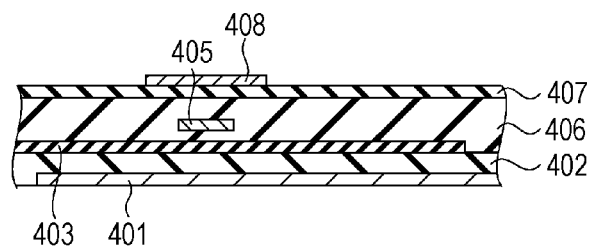
FIG. 9B is a drawing describing a method of manufacturing of an electro-optical device according to Embodiment 1.
Figure 9C:
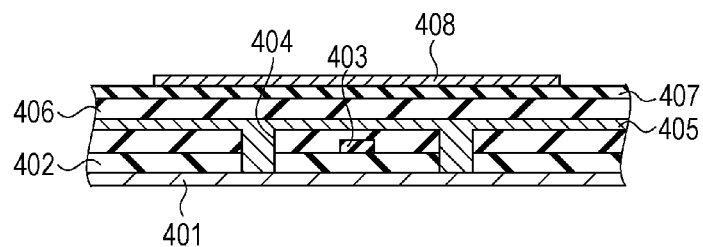
FIG. 9C is a drawing describing a method of manufacturing of an electro-optical device according to Embodiment 1.

Next, as shown in FIGS. 9A to 9C, the process proceeds to a step for forming the first conductive film 408 on the first protective film 407. The first conductive film 408 is a degenerate semiconductor in which phosphorous atoms are included at a concentration of $1 \times 10^{19}/cm^3$ or more.

Figure 10A:
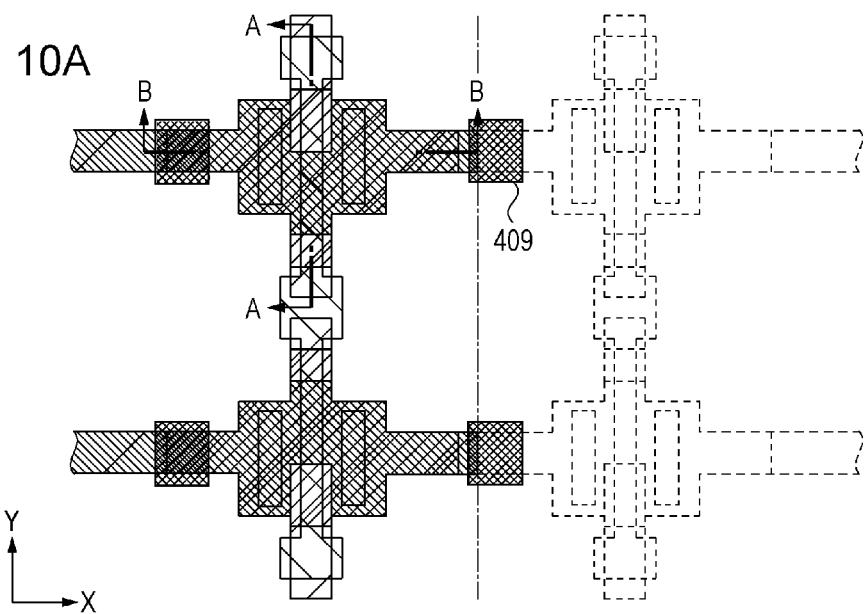
FIG. 10A is a drawing describing a method of manufacturing of an electro-optical device according to Embodiment 1.
Figure 10B:
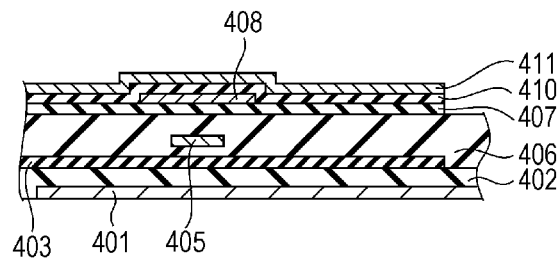
FIG. 10B is a drawing describing a method of manufacturing of an electro-optical device according to Embodiment 1.
Figure 10C:
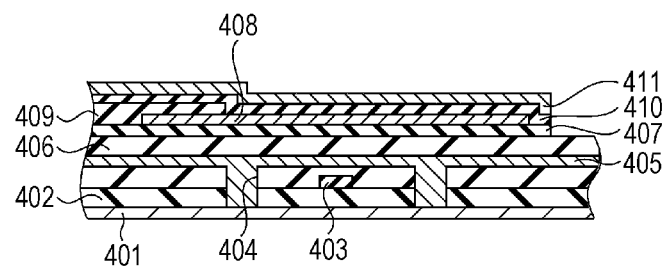
FIG. 10C is a drawing describing a method of manufacturing of an electro-optical device according to Embodiment 1.

Next, as shown in FIGS. 10A to 10C, the process proceeds to a step for forming the second protective film 409 on the first conductive film 408, and a step for removing the second protective film 409 from the upper surface and a portion of the outer periphery of the first conductive film 408. The second protective film 409 is formed from a silicon oxide film, such as an NSG film, a PSG film, a BSG film, and a BPSG film, and is subjected to patterning work so as to cover a portion (location at which the fifth contact hole 421 is later formed) of the first conductive film 408 after being deposited similarly to the first interlayer insulating film 406. This is the step for forming the second protective film 409. After the step for forming the second protective film 409, the second protective film 409 remaining on the upper surface (first surface) and the outer peripheral side surface (fourth surface) of the first conductive film 408 with a wet etching method using a hydrofluoric acid aqueous solution. This is the step for removing the second protective film 409 from a portion of the outer periphery of the first conductive film 408. In short, the second protective film 409 is removed from a region in which the first capacitive element 491 and the fourth capacitive element 494. Because both the second protective film 409 and the first interlayer insulating film 406 are oxide films, etching with wet etching is possible. By providing the first protective film 407 formed from a nitride film, the concern of the first interlayer insulating film 406 being etched by the step for removing the second protective film 409 from a portion of the outer periphery of the first conductive film 408 is eliminated, and the concern of the bottom portion of the first conductive film 408 being etched is eliminated. That is, the first protective film 407 is an etching stopper in the step for removing the second protective film 409 from a portion of the outer periphery of the first conductive film 408.

After the oxide film is removed from the first surface and the fourth surface of the first conductive film 408, the process proceeds to a step for forming the first dielectric film 410 and a step for forming the second conductive film 411. It is possible for the first dielectric film 410 to use a dielectric layer with a high dielectric constant, such as an aluminum oxide film, a titanium oxide film, a tantalum oxide film, a niobium oxide film, a hafnium oxide film, a lanthanum oxide film, and a zirconium oxide film, in addition being able to use the silicon compounds such as a silicon oxide film and a silicon nitride film. It is possible for the second conductive film 411 to use a conductive film such as a conductive polysilicon film, a metal silicide film, a metal film, or a metal compound film. In the embodiment, the first dielectric film 410 is a silicon nitride film and the second conductive film 411 is a degenerate semiconductor.

Figure 11A:
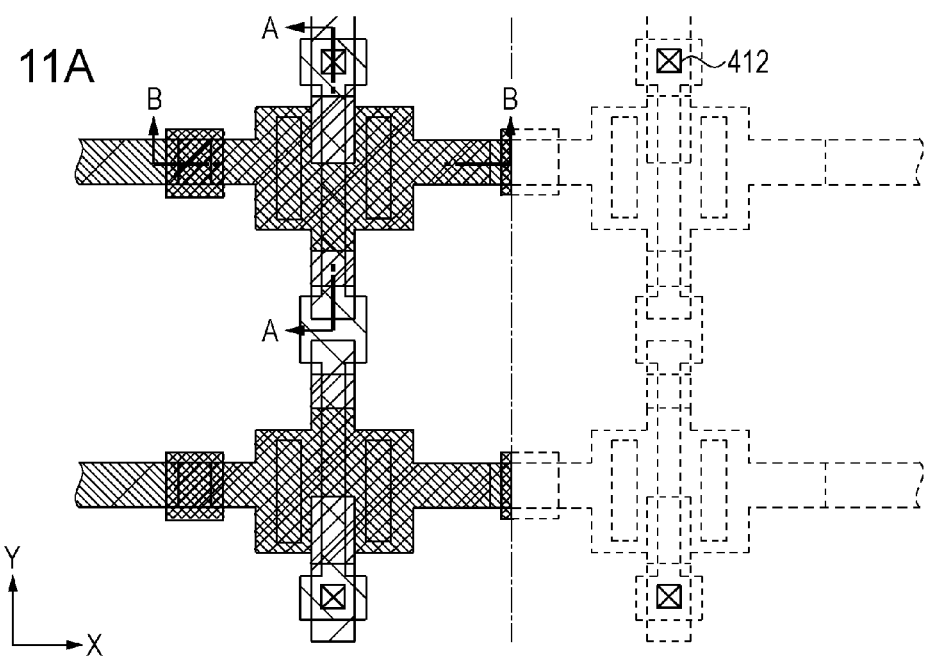
FIG. 11A is a drawing describing a method of manufacturing of an electro-optical device according to Embodiment 1.
Figure 11B:
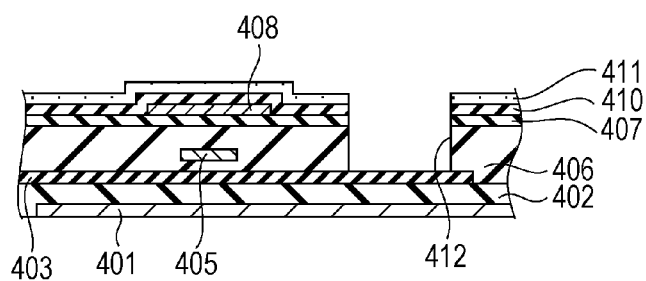
FIG. 11B is a drawing describing a method of manufacturing of an electro-optical device according to Embodiment 1.
Figure 11C:
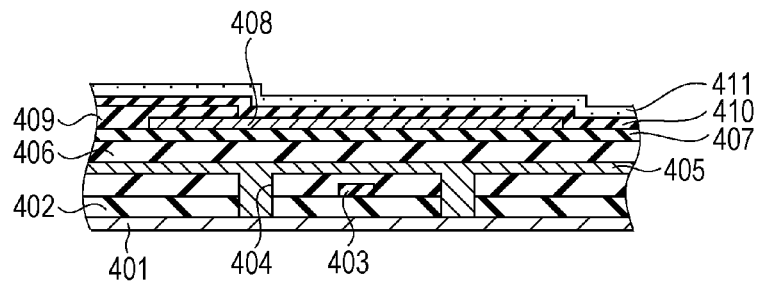
FIG. 11C is a drawing describing a method of manufacturing of an electro-optical device according to Embodiment 1.

Next, as shown in FIGS. 11A to 11C the second contact hole 412 that electrically connects the other of the source and drain of the pixel transistor 44 and the second electrode 92 of the capacitive element is opened. In short, the process proceeds to a step for opening the second contact hole 412 in the first dielectric film 410, the first protective film 407, the first interlayer insulating film 406, and the gate insulating film between the step for forming the second conductive film 411 and the step for forming the fifth conductive film 413. It is possible for the wet etching using the hydrofluoric acid aqueous solution to be applied to the opening of the second contact hole 412. The second conductive film 411 also serves a role of protecting the first dielectric film 410 in this case from the hydrofluoric acid aqueous solution.

Figure 12B:
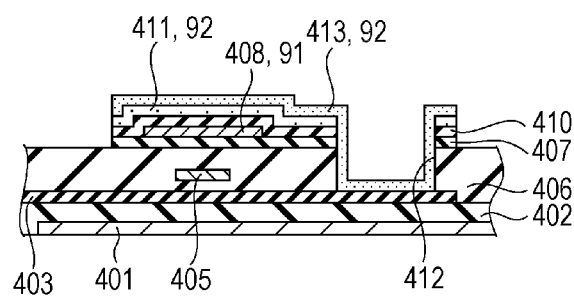
FIG. 12B is a drawing describing a method of manufacturing of an electro-optical device according to Embodiment 1.
Figure 12C:
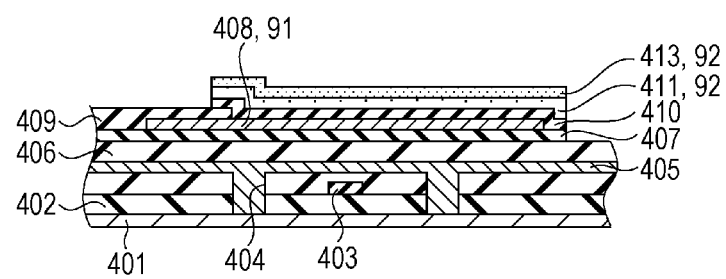
FIG. 12C is a drawing describing a method of manufacturing of an electro-optical device according to Embodiment 1.

Next, as shown in FIGS. 12A to 12C, the process proceeds to a step for forming the fifth conductive film 413 on the second conductive film 411. It is possible for the fifth conductive film 413 to use a degenerate semiconductor in which phosphorous atoms are included at a concentration of $1 \times 10^{19}/cm^3$ or more. The other of the source and drain of the pixel transistor 44 and the second electrode 92 of the capacitive element are electrically connected by the fifth conductive film 413. During the patterning work on the fifth conductive film 413, it is preferable that the first protective film 407 present in the opening region (in the pixel 41, region not overlapping on the sixth conductive film 401, the fifth conductive film 413, or the signal line 43 (refer to FIGS. 17A to 17C) formed thereafter in plan view) of the pixel 41 be removed. By doing so, hydrogen is diffused in the semiconductor film 403 in the forming gas (gas including hydrogen in an inert gas at a concentration of less than 4%) annealing or hydrogen plasma process performed later and the termination of defects (such as unpaired bonding pairs or stacking defects) in the semiconductor film 403 is promoted. In this case, the second protective film 409 functions as an etching stopper. The part of the first electrode 91 (first conductive film 408) covered by the second protective film 409 is electrically connected to the common electrode line in a later step. In a case where the second protective film 409 is not present, during etching of the second electrode 92 (second conductive film 411 or fifth conductive film 413), although the first electrode 91 (first conductive film 408) is subjected to etching and is not easily electrically connected to the common electrode, the electrical connection of the first conductive film 408 to the common potential line 471 is reliable by the second protective film 409 being present. The second protective film 409 is formed sufficiently thicker than the first dielectric film 410 and the first protective film 407, and, after the first dielectric film 410 and the first protective film 407 are removed, is formed to a thickness so as to remain covering the first conductive film 408.

Figure 13A:
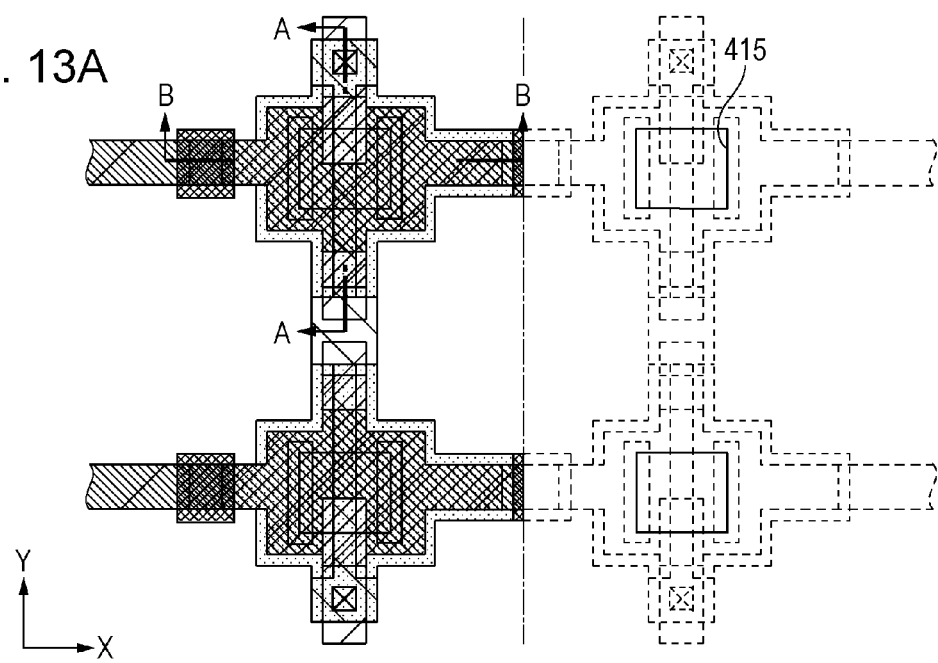
FIG. 13A is a drawing describing a method of manufacturing of an electro-optical device according to Embodiment 1.
Figure 13B:
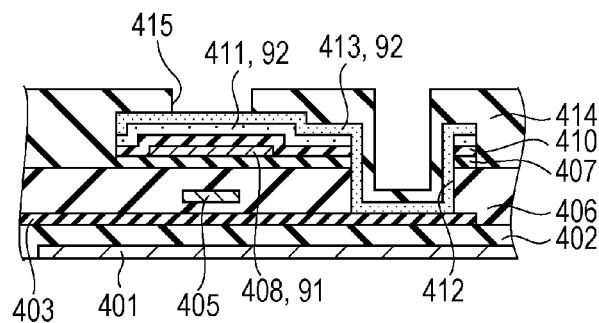
FIG. 13B is a drawing describing a method of manufacturing of an electro-optical device according to Embodiment 1.
Figure 13C:
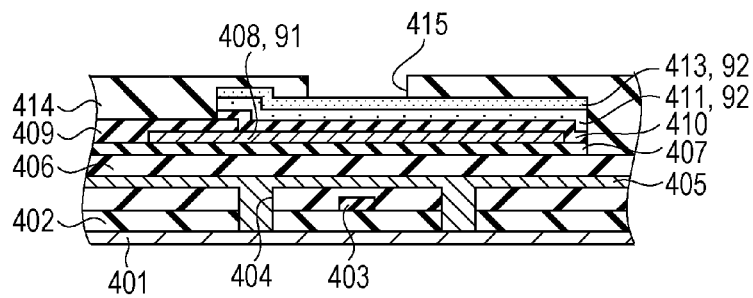
FIG. 13C is a drawing describing a method of manufacturing of an electro-optical device according to Embodiment 1.

Next, as shown in FIGS. 13A to 13C, the process proceeds to the step for forming the second interlayer insulating film 414. The second interlayer insulating film 414 is formed from an NSG film or a silicon oxide film such as a PSG film, a BSG film, or a BPSG film. The insulating films are formed by a normal pressure CVD method, a reduced pressure CVD method, or a plasma CVD method using silane gas, dichlorosilane, TEOS, TEB, TMOP, or the like. After the second interlayer insulating film 414 is deposited, the third contact hole 415 is opened on the inside of the fifth conductive film 413.

Figure 14B:
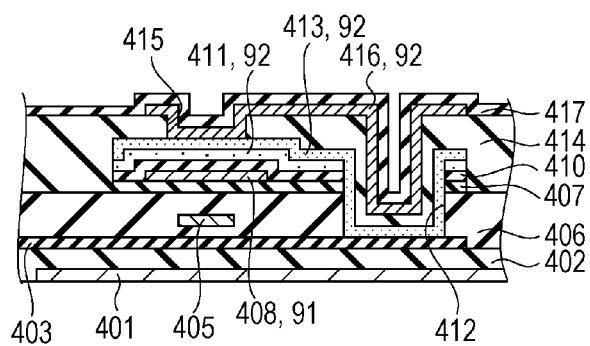
FIG. 14B is a drawing describing a method of manufacturing of an electro-optical device according to Embodiment 1.
Figure 14C:
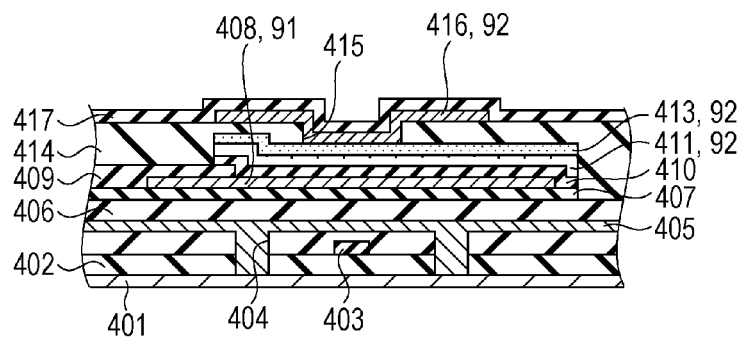
FIG. 14C is a drawing describing a method of manufacturing of an electro-optical device according to Embodiment 1.

Next, as shown in FIGS. 14A to 14C, the process proceeds to a step of forming the third conductive film 416 on the fifth conductive film 413, and a step for forming the second dielectric film 417. It is possible for the third conductive film 416 to use a conductive film such as a conductive polysilicon film, a metal silicide film, a metal film, or a metal compound film. It is possible for the second dielectric film 417 to use a dielectric layer with a high dielectric constant, such as an aluminum oxide film, a titanium oxide film, a tantalum oxide film, a niobium oxide film, a hafnium oxide film, a lanthanum oxide film, and a zirconium oxide film, in addition being able to use the silicon compounds such as a silicon oxide film and a silicon nitride film. In the embodiment, the third conductive film 416 is a degenerate semiconductor, and the second dielectric film 417 is a silicon nitride film. The third conductive film 416 is formed so as to completely cover the third contact hole 415 in plan view.

Figure 15B:
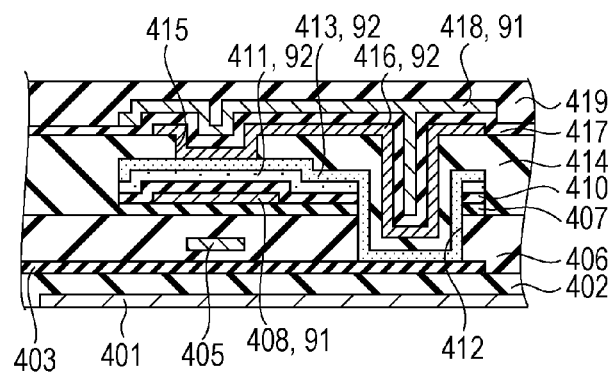
FIG. 15B is a drawing describing a method of manufacturing of an electro-optical device according to Embodiment 1.
Figure 15C:
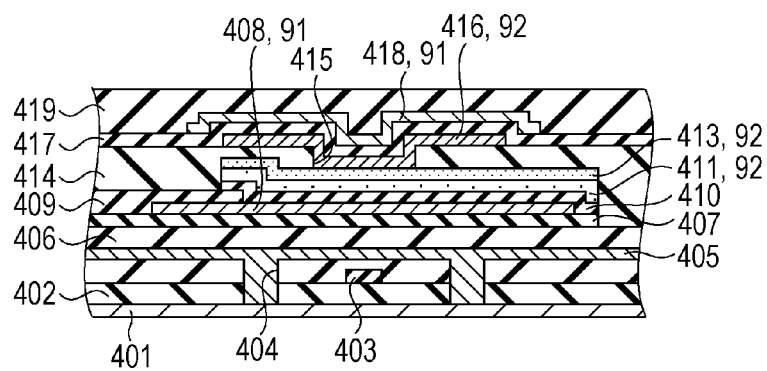
FIG. 15C is a drawing describing a method of manufacturing of an electro-optical device according to Embodiment 1.

Next, as shown in FIGS. 15A to 15C, the process proceeds to the step for forming the fourth conductive film 418. It is possible for the fourth conductive film 418 to use a conductive film such as a conductive film polysilicon film or metal silicide film, metal film or metal compound film, and in the embodiment, the fourth conductive film 418 is a metal film, and, specifically, is a tungsten silicide film. The fourth conductive film 418 is formed so as to cover the third conductive film 416 as much as possible in plan view in a range not impairing the aperture ratio (proportion of the opening region in the pixel 41). In so doing, it is possible for the capacitance value of the fifth capacitive element 495 to be increased. The process proceeds to a step for forming the third interlayer insulating film 419 so as to cover the fourth conductive film 418. The third interlayer insulating film 419 is formed from an NSG film or a silicon oxide film such as a PSG film, a BSG film, or a BPSG film. The insulating films are formed by a normal pressure CVD method, a reduced pressure CVD method, or a plasma CVD method using silane gas, dichlorosilane, TEOS, TEB, TMOP, or the like.

Figure 16A:
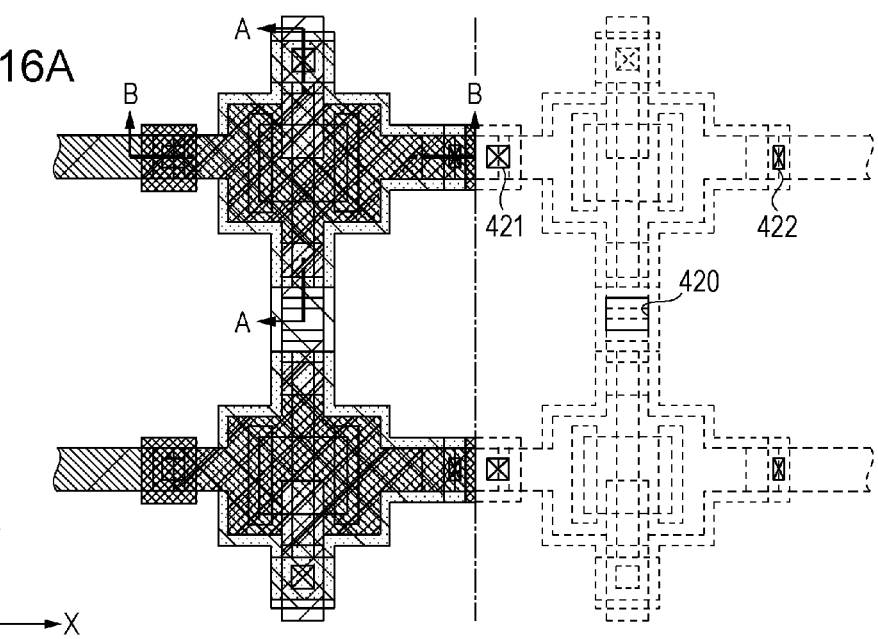
FIG. 16A is a drawing describing a method of manufacturing of an electro-optical device according to Embodiment 1.
Figure 16B:
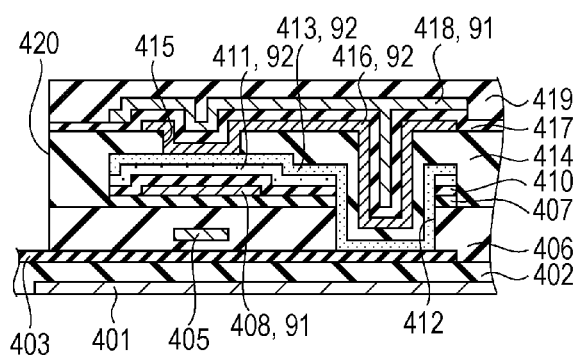
FIG. 16B is a drawing describing a method of manufacturing of an electro-optical device according to Embodiment 1.
Figure 16C:
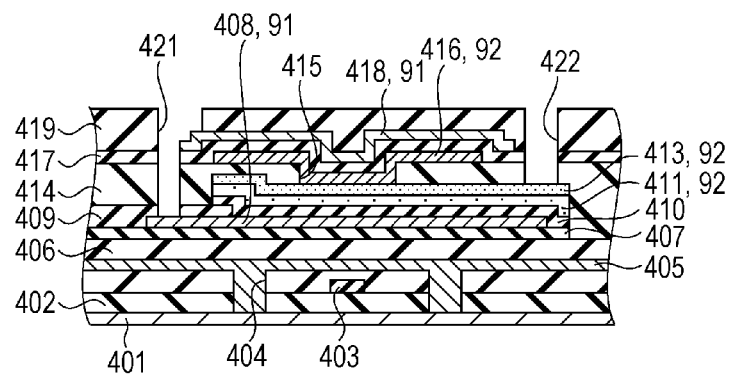
FIG. 16C is a drawing describing a method of manufacturing of an electro-optical device according to Embodiment 1.

Next, as shown in FIGS. 16A to 16C, the process proceeds to a step for opening the fourth contact hole 420 or the like. In this step, the fifth contact hole 421 and the sixth contact hole 422 are also opened in addition to the fourth contact hole 420. The fourth contact hole 420 is a contact hole for electrically connecting the signal line 43 and one of the source and drain of the pixel transistor 44. The fifth contact hole 421 is a contact hole for electrically connecting the first electrode 91 (first conductive film 408 and fourth conductive film 418) and the common potential line relay electrode 472 (refer to FIGS. 17A to 17C). The sixth contact hole 422 is a contact hole for electrically connecting the second electrode 92 (fifth conductive film 413, or second conductive film 411 or third conductive film 416 that electrically connects thereto) and the pixel electrode relay electrode 452 (refer to FIGS. 17A to 17C).

Figure 17A:
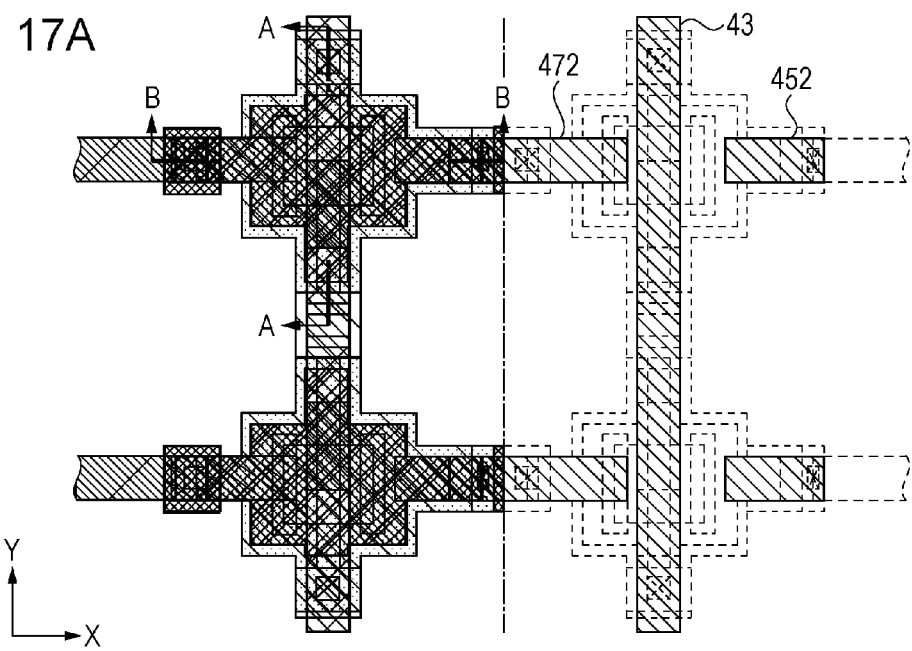
FIG. 17A is a drawing describing a method of manufacturing of an electro-optical device according to Embodiment 1.
Figure 17B:
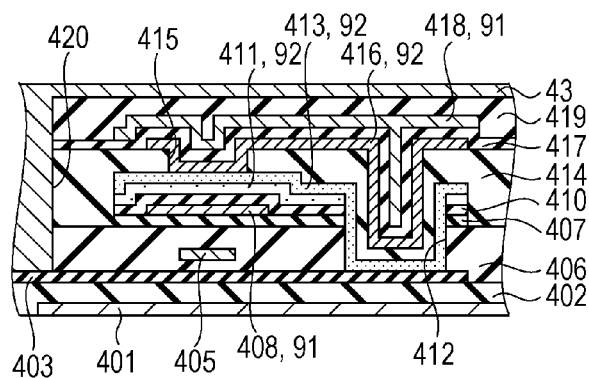
FIG. 17B is a drawing describing a method of manufacturing of an electro-optical device according to Embodiment 1.
Figure 17C:
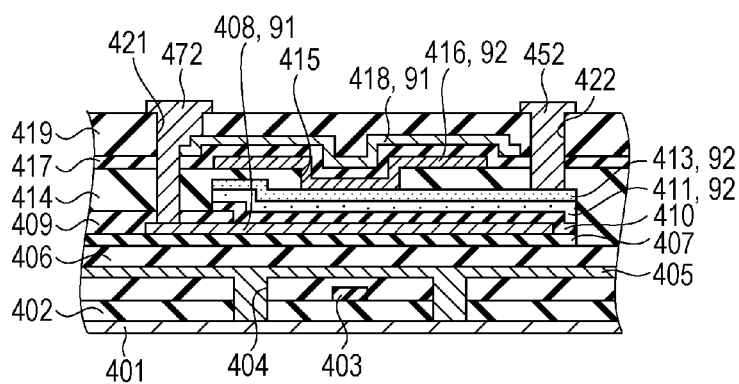
FIG. 17C is a drawing describing a method of manufacturing of an electro-optical device according to Embodiment 1.

Next, as shown in FIGS. 17A to 17C, the process proceeds to the step for forming the signal line 43. In this step, the common potential line relay electrode 472 and the pixel electrode relay electrode 452 are formed. The signal line 43, the common potential line relay electrode 472, and the pixel electrode relay electrode 452 are formed from a conductive film, such as a conductive polysilicon film, a metal silicide film, a metal film, or a metal compound film. In the embodiment, the signal line 43 and the common potential line relay electrode 472 or the pixel electrode relay electrode 452 are formed from an aluminum alloy film or a laminated film with two to four layers of a titanium nitride film and an aluminum film.

A transmissive fourth interlayer insulating film, not shown, formed from a silicon oxide film is formed on the upper layer side of the signal line 43 and the common potential line relay electrode 472 or the pixel electrode relay electrode 452, and the surface of the fourth interlayer insulating film is planarized. The common potential line 471 that includes an aluminum film, an aluminum alloy film, or the like, is formed on the upper layer side of the fourth interlayer insulating film. The common potential line 471 is electrically connected to the common potential line relay electrode 472 via the seventh contact hole, not shown, opened in the fourth interlayer insulating film.

A transmissive fifth interlayer insulating film, not shown, formed from a silicon oxide film is formed on the upper layer side of the common potential line 471, and the surface of the fifth interlayer insulating film is planarized. A transparent conductive film formed from ITO or the like is formed as the pixel electrode 45 on the upper layer side of the fifth interlayer insulating film. The pixel electrode 45 is electrically connected to the pixel electrode relay electrode 452 via the eighth contact hole, not shown, opened in the fourth and fifth interlayer insulating films.

Thereafter, the first alignment film 65 is formed so as to cover the pixel electrode 45 and the element substrate 62 that configures the electro-optical device 200 is completed.

Embodiment 2

[Electro-Optical Device 2]

Figure 18:
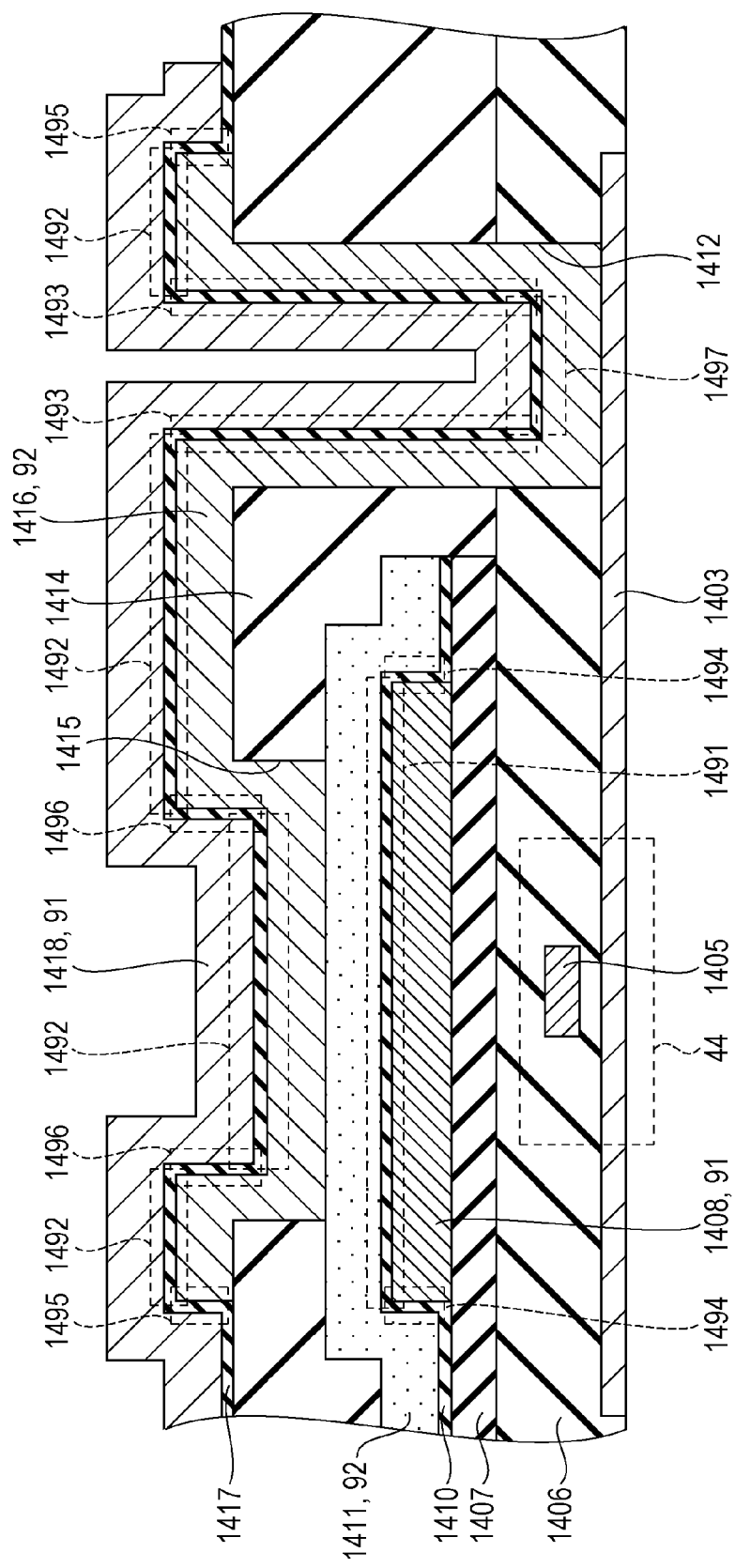
FIG. 18 is a cross-sectional view describing the configuration of a semiconductor circuit according to Embodiment 2.

FIG. 18 is a cross-sectional view describing the configuration of a semiconductor circuit of the electro-optical device 200 according to Embodiment 2. Next, the configuration of a semiconductor circuit of the electro-optical device 200 according to Embodiment 2 will be described with reference to FIG. 18.

The same constituent parts as Embodiment 1 are given the same reference symbols and overlapping description will not be made.

As shown in FIG. 18, the semiconductor circuit of the embodiment includes a transistor and a capacitive element, and the semiconductor circuit is a pixel circuit used in the pixel 41 of the electro-optical device 200.

Specifically, the transistor having a pixel circuit (semiconductor circuit) is the pixel transistor 44 (refer to FIG. 3). The capacitive element included in the pixel circuit includes a first capacitive element 1491, a second capacitive element 1492, a third capacitive element 1493, a fourth capacitive element 1494, a fifth capacitive element 1495, a sixth capacitive element 1496, and a seventh capacitive element 1497.

Because the electrical connection of the pixel transistor 44 is the same as Embodiment 1, description thereof will not be provided.

The transistor (pixel transistor 44) includes the semiconductor film 1403, a gate insulating film and a gate (in the embodiment, sixth conductive film 1405), and these layers are covered by the first interlayer insulating film 1406. In short, the semiconductor film of the transistor is covered by the first interlayer insulating film 1406. In the embodiment, the first protective film 1407 further covers the first interlayer insulating film 1406. A first conductive film 1408 is formed on the first protective film 1407, and the first dielectric film 1410 covers the first conductive film 1408. The second conductive film 1411 is formed on the first dielectric film 1410. The second interlayer insulating film 1414 covers the second conductive film 1411 and the second contact hole 1415 is opened in the second interlayer insulating film 1414. The third conductive film 1416 is formed on the second interlayer insulating film 1414, and the second conductive film 1411 and the third conductive film 1416 are electrically connected via the second contact hole 1415. The second dielectric film 1417 covers the third conductive film 1416, and the fourth conductive film 1418 is formed on the second dielectric film 1417. Accordingly, in cross-sectional view, the first conductive film 1408 is arranged between the semiconductor film 1403 and the fourth conductive film 1418, the second conductive film 1411 is arranged between the first conductive film 1408 and the fourth conductive film 1418, and the third conductive film 1416 is arranged between the second conductive film 1411 and the fourth conductive film 1418. Alternatively, in cross-sectional view, the first conductive film 1408 is arranged between the semiconductor film 1403 and the second conductive film 1411, the second conductive film 1411 is arranged between the first conductive film 1408 and the third conductive film 1416, and the third conductive film 1416 is arranged between the second conductive film 1411 and the fourth conductive film 1418.

The third contact hole 1412 is opened in the gate insulating film (sixth conductive film 1405), the first interlayer insulating film 1406, the first protective film 1407, the first dielectric film 1410, and the second interlayer insulating film 1414. This is because the third contact hole 1412 electrically connects one or the other of the source and drain (in the embodiment, the other of the source and drain of the pixel transistor 44) of the transistor and the first electrode 91 or the second electrode 92 (in the embodiment, second conductive film 1411 and third conductive film 1416 in the second electrode 92). In practice, the other of the source and drain of the pixel transistor 44 and the second conductive film 1411 are electrically connected via the third conductive film 1416 that extends to the third contact hole 1412.

The first capacitive element 1491 includes the first conductive film 1408, the first part of the second conductive film 1411 (one plane of the second conductive film 1411, in the embodiment, bottom surface) and the first dielectric film 1410 arranged between the first conductive film 1408 and the second conductive film 1411. The first conductive film 1408 includes a first surface (one plane of the first conductive film 1408, in the embodiment, upper surface), and a fourth surface (other surface of first conductive film 1408, in the embodiment, side surface) that intersects the first surface. In the embodiment, since the planar shape of the first conductive film 1408 is a polygonal shape (refer to FIG. 22A), the fourth surface that is the side surface includes the same number of flat cross-sections (cross-section configured from plane) as the number of sides of the polygon. However, if the planar shape of the first conductive film 1408 is a shape drawn by curve, such as a circle or ellipse, the fourth surface is a cross-section configured from one continuous curved surface. In the first capacitive element 1491, the first part (in the embodiment, bottom surface of the second conductive film 1411) is arranged so as to face the first surface (in the embodiment, upper surface of the first conductive film 1408). In this way, the first capacitive element 1491 is formed using the first surface of the first conductive film 1408 and the first part of the second conductive film 1411.

The fourth capacitive element 1494 includes the first conductive film 1408, the fourth part of the second conductive film 1411 and the first dielectric film 1410 arranged between the first conductive film 1408 and the second conductive film 1411. The fourth part of the second conductive film 1411 is a surface that intersects the first part in a portion of the second conductive film 1411, and is the side surface in the embodiment. Accordingly, the fourth part of the second conductive film 1411 (in the embodiment, side surface of the second conductive film 1411) is arranged so as to face the fourth surface of the first conductive film 1408 (in the embodiment, side surface of first conductive film 1408). In this way, the fourth capacitive element 1494 is formed using the fourth surface of the first conductive film 1408 and the fourth part of the second conductive film 1411. The first conductive film 1408 functions as the first electrode 91 of the capacitive element, and the second conductive film 1411 functions as the second electrode 92 of the capacitive element.

Figure 22A:
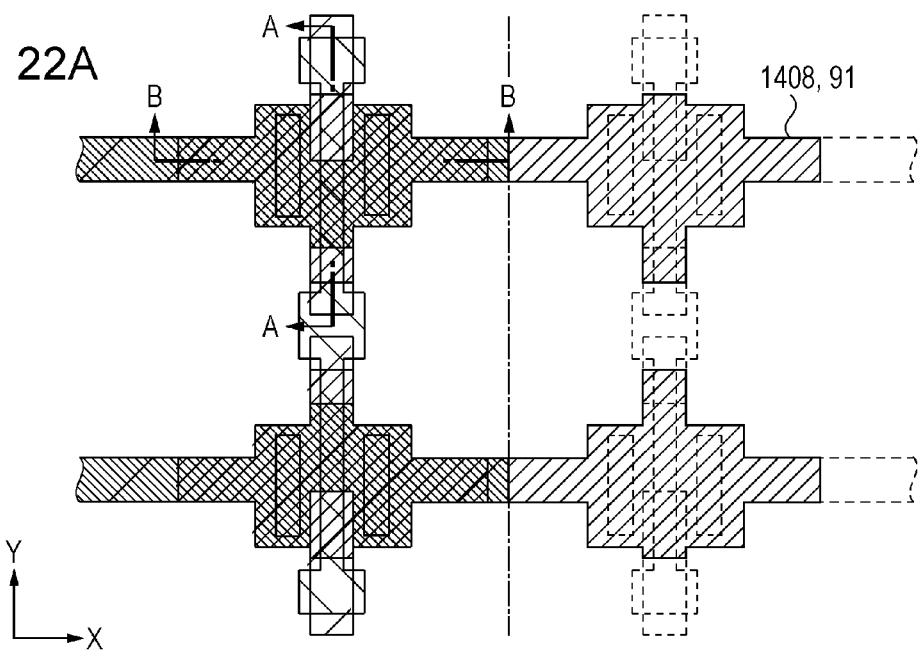
FIG. 22A is a drawing describing a method of manufacturing of an electro-optical device according to Embodiment 2.
Figure 24A:
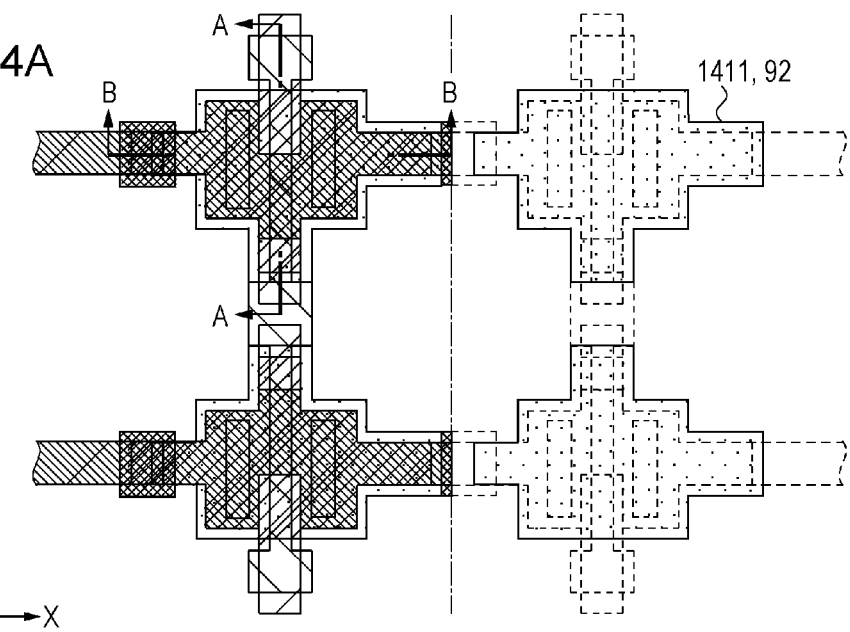
FIG. 24A is a drawing describing a method of manufacturing of an electro-optical device according to Embodiment 2.

The fourth capacitive element 1494 is to be formed and the second conductive film 1411 is formed so as to cover at least a portion of the outer circumference (fourth surface) of the first conductive film 1408 in plan view. The second conductive film 1411 is formed so as to cover the majority of the outer periphery (fourth surface) of the first conductive film 1408 except for the formation portion of the fifth contact hole 1421 (refer to FIGS. 29A to 29C) on the first conductive film 1408, and the capacitance value is increased. The planar shape of the first conductive film 1408 is depicted in FIG. 22A and the planar shape of the second conductive film 1411 is depicted in FIG. 24A.

It is preferable that at least one of the first surface of the first conductive film 1408 and the first part of the second conductive film 1411 cover the transistor. That is, it is preferable that the region (channel formation region) that overlaps the gate and the semiconductor film 1403 of the transistor formed from the sixth conductive film 1405 in plan view and the boundary portion of the channel formation region (boundary portion of the channel formation region and the source, and the boundary portion of the channel formation region and the drain) be covered by the first surface of the first conductive film 1408 or the first part of the second conductive film 1411 or both the first surface of the first conductive film 1408 and first part of the second conductive film 1411. Thus, since the first capacitive element 1491 and the transistor are stacked, the transistor controls signal propagation to the capacitive element in the semiconductor circuit including the transistor and the capacitive element, and it is possible to increase the capacitance value per unit area. The reason the capacitive element obtains a comparatively large capacitance value is because charge of the capacitive element that corresponds to the information to be held leaks via the transistor due to the temperature or light. When the first capacitive element 1491 and the transistor are stacked, since the leakage current of the transistor stemming from light is suppressed, the information maintenance capacity of the capacitive element is further improved, and the range of normal operations of the semiconductor circuit is further widened.

The second capacitive element 1492 includes the third conductive film 1416, the second part of the fourth conductive film 1418 (at least one plane of the fourth conductive film 1418, in the embodiment, bottom surface) and the second dielectric film 1417 arranged between the third conductive film 1416 and the fourth conductive film 1418. The third conductive film 1416 includes the second surface (one plane of the third conductive film 1416, in the embodiment, upper surface). In the second capacitive element 1492, the second part (in the embodiment, bottom surface of the fourth conductive film 1418) is arranged so as to face the second surface (in the embodiment, upper surface of the third conductive film 1416). In this way, the second capacitive element 1492 is formed using the second surface of the third conductive film 1416 and the second part of the fourth conductive film 1418.

It is preferable that at least the second surface of the third conductive film 1416 and the second part of the fourth conductive film 1418 cover the first capacitive element 1491. That is, it is preferable that the region (first capacitive element 1491) adjacent to the first surface of the first conductive film 1408 and the first part of the second conductive film 1411 in plan view be covered by the second surface of the third conductive film 1416 or the second part of the fourth conductive film 1418, or both of the second surface of the third conductive film 1416 and the second part of the fourth conductive film 1418. Thus, it is possible for the first capacitive element 1491 and the second capacitive element 1492 to be stacked. Accordingly, it is possible for the capacitance value per unit area to be increased. It is possible for the light blocking capacity from above the transistor to be further increased. As a result, it is possible for the range of normal operations of the semiconductor circuit to be further widened.

The second conductive film 1411 and the third conductive film 1416 are electrically connected, and the potential of the second conductive film 1411 and the potential of the third conductive film 1416 are substantially the same. In this way, the second conductive film 1411 and the third conductive film 1416 function as the second electrode 92 of the capacitive element. Meanwhile, the first conductive film 1408 and the fourth conductive film 1418 function as the first electrode 91 of the capacitive element.

The second interlayer insulating film 1414 is arranged between the second conductive film 1411 and the third conductive film 1416, and the second contact hole 1415 is formed in the second interlayer insulating film 1414. Since the third conductive film 1416 is formed so as to cover the second contact hole 1415 in plan view, the third conductive film 1416 includes a step difference at the boundary of the second contact hole 1415 as shown in FIG. 18. As a result, the second surface (in the embodiment, upper surface of the third conductive film 1416) of the third conductive film 1416 includes an upper surface (inside upper surface) formed on the inside of the second contact hole 1415 and an upper surface (outside upper surface) formed on the outside of the second contact hole 1415. Similarly, the second part (in the embodiment, bottom surface of the fourth conductive film 1418) of the fourth conductive film 1418 includes a bottom surface (inside bottom surface) formed on the inside of the second contact hole 1415 and a bottom surface (outside bottom surface) formed on the outside of the second contact hole 1415. Accordingly, the second capacitive element 1492 includes apart formed on the inside upper surface and the inside bottom surface, and a part formed on the outside upper surface and the outside bottom surface.

The fifth capacitive element 1495 includes the third conductive film 1416, a fifth part of the fourth conductive film 1418, and the second dielectric film 1417. The third conductive film 1416 includes a fifth surface (another surface of the third conductive film 1416, in the embodiment, outer peripheral side surface) that intersects the second surface. In the embodiment, since the planar shape of the third conductive film 1416 is a polygon (refer to FIG. 27A), the fifth surface that is the outer peripheral side surface includes the same number of flat cross-sections (cross-section configured from the plane) as the number of sides of the planar polygon of the third conductive film 1416. If the planar shape of the third conductive film 1416 is a shape drawn by a curve such as a circle or ellipse, the fifth surface is a cross-section configured from one continuous curved surface. The fifth part of the fourth conductive film 1418 is a surface that intersects the second part at a portion of the fourth conductive film 1418, and is arranged so as to face the fifth surface (in the embodiment, outer peripheral side surface of the third conductive film 1416) of the third conductive film 1416. In this way, the fifth capacitive element 1495 is formed using the fifth surface of the third conductive film 1416 and the fifth part of the fourth conductive film 1418.

Figure 27A:
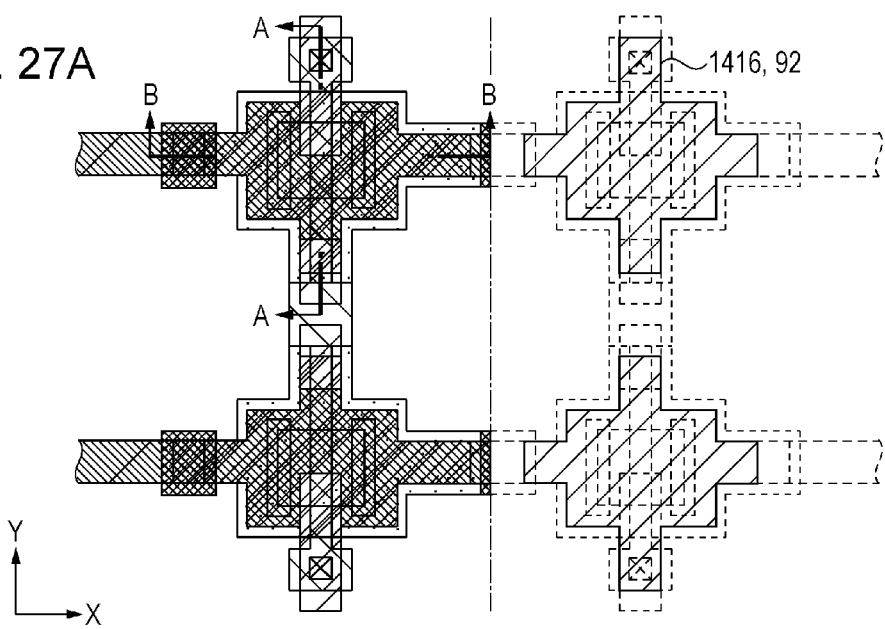
FIG. 27A is a drawing describing a method of manufacturing of an electro-optical device according to Embodiment 2.
Figure 28A:
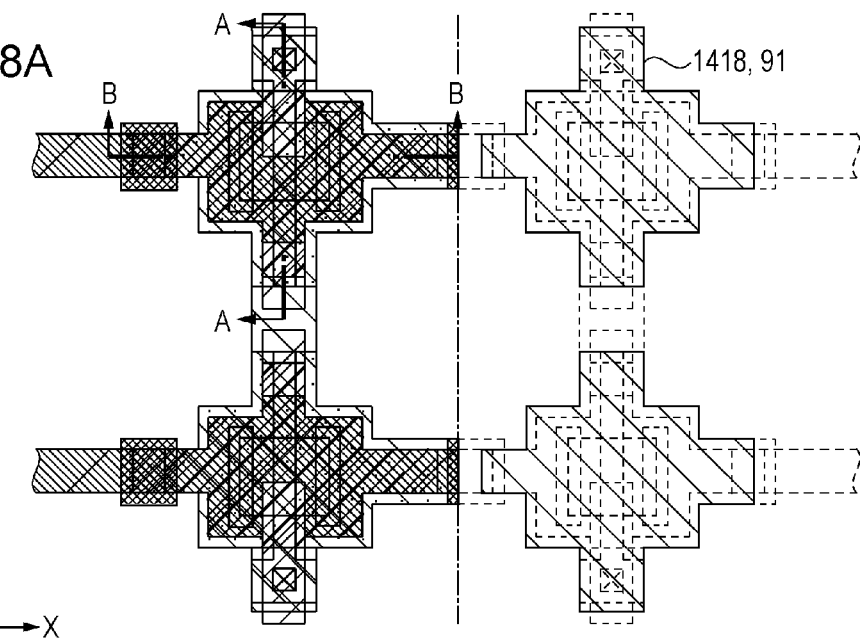
FIG. 28A is a drawing describing a method of manufacturing of an electro-optical device according to Embodiment 2.

In order to form the fifth capacitive element 1495, the fourth conductive film 1418 is formed so as to cover at least a portion of the outer circumference (fifth surface) of the third conductive film 1416 in plan view. In the embodiment, the fourth conductive film 1418 is formed so as to cover the majority of the outer peripheral surface (fifth surface) of the third conductive film 1416, and the capacitance value is increased. The planar shape of the third conductive film 1416 is depicted in FIG. 27A and the planar shape of the fourth conductive film 1418 is depicted in FIG. 28A.

The sixth capacitive element 1496 includes the third conductive film 1416, a sixth part of the fourth conductive film 1418, and the second dielectric film 1417. The third conductive film 1416 includes a sixth surface different from the fifth surface and that intersects the second surface of the third conductive film 1416. As shown in FIG. 18, since the third conductive film 1416 has a step difference that stems from the second contact hole 1415, the sixth surface (inner peripheral side surface) of the third conductive film 1416 is formed at the step difference portion. The sixth part of the fourth conductive film 1418 is arranged so as to face the sixth surface.

The third capacitive element 1493 includes the third conductive film 1416, a third part of the fourth conductive film 1418, and the second dielectric film 1417. The third conductive film 1416 includes the third surface, intersects the second surface, and is different from the fifth and sixth surfaces. The third capacitive element 1493 is formed in the inside of the third contact hole 1412. That is, at least a portion of the third surface is formed on the inside of the third contact hole 1412. Specifically, the third conductive film 1416 is formed so as to cover at least a portion of the third contact hole 1412 in plan view. In the embodiment, the third conductive film 1416 is formed so as to cover the entire third contact hole 1412 and the third surface is a surface substantially parallel to the side surface (referred to as the contact hole side surface) of the third contact hole 1412. The second dielectric film 1417 is also formed so as to cover at least a portion of the third contact hole 1412 in plan view, and, in the embodiment, is formed so as to cover the entire third contact hole 1412. The fourth conductive film 1418 is also formed so as to cover at least a portion of the third contact hole 1412 in plan view, and, in the embodiment, is formed so as to cover the entire third contact hole 1412. Since the third part of the fourth conductive film 1418 is arranged so as to face the third surface of the third conductive film 1416 via the second dielectric film 1417, the third part becomes a surface substantially parallel to the contact hole side surface.

The seventh capacitive element 1497 includes the third conductive film 1416, the seventh part of the fourth conductive film 1418, and the second dielectric film 1417. The third conductive film 1416 includes a seventh surface (in the embodiment, upper surface substantially parallel to the bottom surface (referred to as the contact hole bottom surface) of the third contact hole 1412) different from the second surface (in the embodiment, upper surface of third conductive film 1416) and that intersects the third surface (surface substantially parallel to the contact hole side surface) of the third conductive film 1416. Since the seventh part of the fourth conductive film 1418 is arranged so as to face the seventh surface of the third conductive film 1416 via the second dielectric film 1417, the seventh part becomes a surface substantially parallel to the contact hole bottom surface. In short, the third capacitive element 1493 and the seventh capacitive element 1497 are formed in the inside of the third contact hole 1412.

In this way, since the second capacitive element 1492 is formed using the second surface of the third conductive film 1416 and the second part of the fourth conductive film 1418, the third capacitive element 1493 is formed using the third surface of the third conductive film 1416 and the third part of the fourth conductive film 1418, the fifth capacitive element 1495 is formed using the fifth surface of the third conductive film 1416 and the fifth part of the fourth conductive film 1418, the sixth capacitive element 1496 is formed using the sixth surface of the third conductive film 1416 and the sixth part of the fourth conductive film 1418, and the seventh capacitive element 1497 is formed using the seventh surface of the third conductive film 1416 and the seventh part of the fourth conductive film 1418, it is possible for the capacitance value per unit area to be increased. In other words, the capacitive element (a first capacitive element 1491, a second capacitive element 1492, a third capacitive element 1493, a fourth capacitive element 1494, a fifth capacitive element 1495, a sixth capacitive element 1496, and a seventh capacitive element 1497 arranged in parallel) having a large capacitance value in a narrow region such as a pixel 41 is formed. Accordingly, even if the pixels 41 are made smaller as the increase in definition proceeds, display defects stemming from insufficient capacity are suppressed.

As determined when viewing FIG. 18, although it is preferable that the capacitance value of the fourth capacitive element 1494 and the capacitance value of the fifth capacitive element 1495 increase as the first conductive film 1408 or the third conductive film 1416 becomes thicker, it is preferable that the thickness of the first conductive film 1408 and the third conductive film 1416 be 600 nanometers (nm) or less. This is because when the first conductive film 1408 and the third conductive film 1416 is as thin as 600 nanometers (nm) or less, the stress stemming from the first conductive film 1408 and the third conductive film 1416 weakens, and situations in which cracks occur in the second interlayer insulating film 1414 or the like are suppressed. In short, by making the first conductive film 1408 and the third conductive film 1416 as thin as 600 nanometers (nm) or less, the reliability of the electro-optical device 200 increases.

Although it is preferable that the capacitance value of the sixth capacitive element 1496 increase as the second interlayer insulating film 1414 becomes thicker, it is preferable that the thickness of the second interlayer insulating film 1414 be 400 nanometers (nm) or less. When the second interlayer insulating film 1414 is as thin as 400 nanometers (nm), the step difference stemming from the second interlayer insulating film 1414 becomes smaller. Therefore, the connection reliability of the various wirings, such as the signal lines 43 formed on the second interlayer insulating film 1414, is improved. Since the second interlayer insulating film 1414 is as thin as 400 nanometers or less, the light blocking properties are improved in a case of using a conductive film, such as the third conductive film 1416 formed on the second interlayer insulating film 1414, as the light blocking film of the pixel transistor 44. That is, it is possible for the light leakage current of the pixel transistor 44 to be suppressed, and for the operational reliability of the electro-optical device 200 to be improved. In short, by making the thickness of the second interlayer insulating film 1414 as thin as 400 nanometers (nm) or less, it is possible for disconnection defects stemming from the step difference to be suppressed, the light leakage current of the transistor to be suppressed, and the reliability of the electro-optical device 200 to be increased.

In the embodiment, although the first conductive film 1408, the first dielectric film 1410, the second conductive film 1411, the third conductive film 1416, the second dielectric film 1417, and the fourth conductive film 1418 are stacked on the transistor in order that the capacitance value per unit area increase, the cross-sectional configuration is not limited thereto. For example, the transistor and the first capacitive element 1491 are preferably formed at different positions in plan view, without stacking the transistor and the first capacitive element 1491. Alternatively, the transistor and the second capacitive element 1492 are preferably formed at different positions in plan view, without stacking the transistor and the second capacitive element 1492. Alternatively, the first capacitive element 1491 and the second capacitive element 1492 are preferably formed at different positions in plan view, without stacking the first capacitive element 1491 and the second capacitive element 1492.

[Method of Manufacturing 2]

FIGS. 19A to 30C are drawings describing the method of manufacturing of an electro-optical device according to Embodiment 2, in which A is a plan view, B is a cross-sectional view taken along line A-A in A, and C is a cross-sectional view taken along line B-B in A. Next, the method of manufacturing of the electro-optical device will be described with reference to FIGS. 19A to 30C. For ease of understanding of the description in FIGS. 20A to 30C, the layers appearing up to the drawing are overwritten on the left side of the single-dotted line, the layers appearing previous to the drawing are indicated by a broken line on the right side of the single-dotted line, and the newly added layers in the drawing are depicted using solid lines and hatching. Hatching is not used in the contact hole.

Figure 19A:
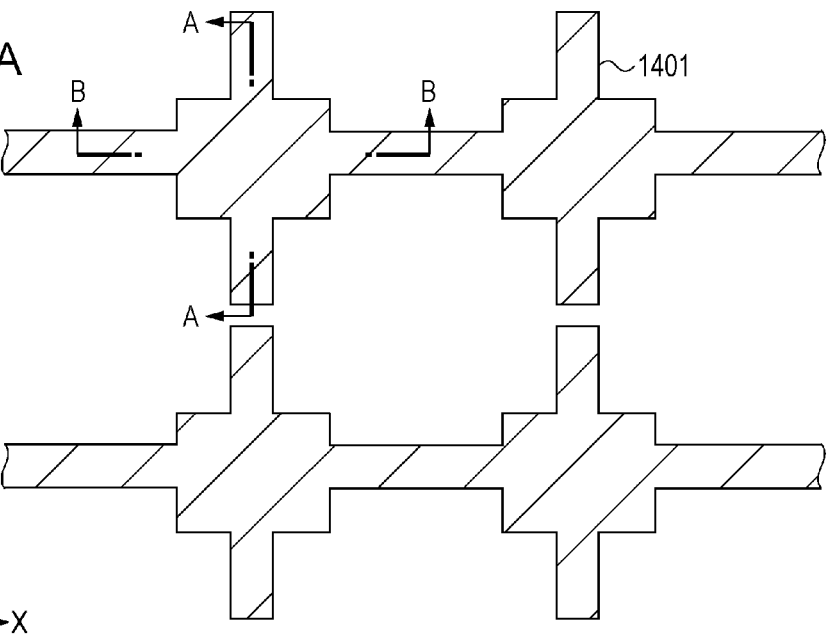
FIG. 19A is a drawing describing a method of manufacturing of an electro-optical device according to Embodiment 2.
Figure 19B:
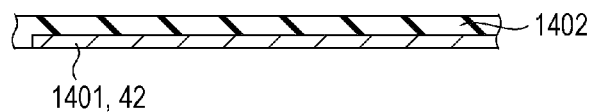
FIG. 19B is a drawing describing a method of manufacturing of an electro-optical device according to Embodiment 2.
Figure 19C:
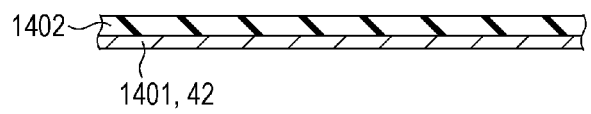
FIG. 19C is a drawing describing a method of manufacturing of an electro-optical device according to Embodiment 2.

A transparent substrate main body, such as a quartz substrate or a glass substrate, is used as the element substrate 62. As shown in FIGS. 19A to 19C, first, the fifth conductive film 1401 is formed on the substrate surface (surface side facing the counter substrate 63) of the liquid crystal 46 side of the substrate main body. The fifth conductive film 1401 is a lower light blocking film serving as a lower scanning line 42, and is formed from a conductive film, such as a conductive polysilicon film, a metal silicide film, a metal film or a metal compound film. In the embodiment, the fifth conductive film 1401 is formed from a light blocking metal film, such as tungsten silicide (WSi), and prevents light incident from the element substrate 62 side from being incident on the semiconductor film 1403 (refer to FIGS. 20A to 20C) of the pixel transistor 44 and misoperations stemming from a light current on the pixel transistor 44. The fifth conductive film 1401 is provided with a main line part extending linearly in the X direction, a sub-line part extending in the Y direction extended so as to overlap the signal line 43 formed thereafter, and a rectangular part in which the pixel transistor 44 or the capacitive element is formed.

On the surface side of the substrate main body, a light blocking base insulating film 1402 is formed on the upper layer side of the fifth conductive film 1401 (lower scanning line 42 serving as lower light blocking film), and a pixel transistor 44 provided with a semiconductor film 1403 is formed on the surface side of the base insulating film 1402. The base insulating film 1402 is formed from a silicon oxide film to which impurities are not intentionally introduced (NSG film), or a silicon nitride film. Such a base insulating film 402 is formed by a normal pressure CVD method, a reduced pressure CVD method, or a plasma CVD method using silane gas ($SiH_4$), dichlorosilane ($SiCl_2H_2$), TEOS (tetraethoxysilane/tetra ethyl ortho silicate/$Si(OC_2H_5)_4$), ammonia ($NH_3$), or the like.

Figure 20A:
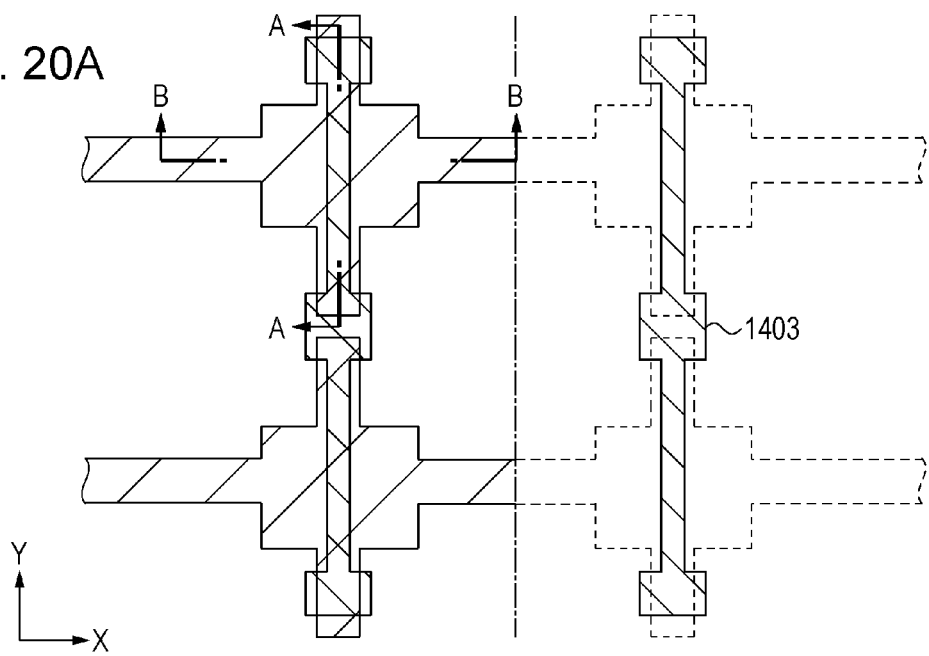
FIG. 20A is a drawing describing a method of manufacturing of an electro-optical device according to Embodiment 2.
Figure 20B:
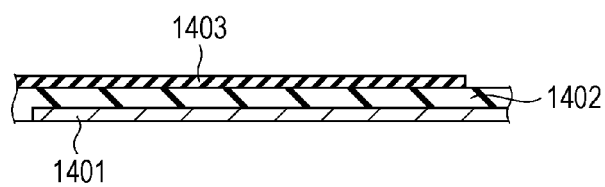
FIG. 20B is a drawing describing a method of manufacturing of an electro-optical device according to Embodiment 2.
Figure 20C:
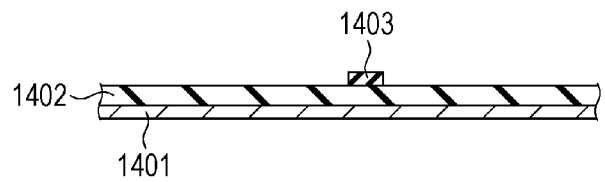
FIG. 20C is a drawing describing a method of manufacturing of an electro-optical device according to Embodiment 2.

Next, as shown in FIGS. 20A to 20C, the process proceeds to the step for forming the semiconductor film 1403 on the base insulating film 1402. The semiconductor film 1403 is formed with a polysilicon film (polycrystalline silicon film). The pixel transistor 44 uses the semiconductor film 1403 as the active layer. The semiconductor film 1403 is a polycrystalline film in which an amorphous silicon film is first deposited with a reduced pressure CVD method or the like, and thereafter subjected to crystallization. After the amorphous silicon film is deposited, the semiconductor film 1403 is subjected to patterning work to a shape following the extension direction (Y direction) of the signal line 43. In the next step, the amorphous silicon film is modified to a polycrystalline film when forming the gate insulating film. The gate insulating film is formed from a two layer structure with a first gate insulating film formed from a silicon oxide film in which the semiconductor film 1403 is thermally oxidized and a second gate insulating film formed from a silicon oxide film formed with a reduced pressure CVD method in temperature conditions of a temperature 700 degrees Celsius to 900 degrees Celsius.

Figure 21A:
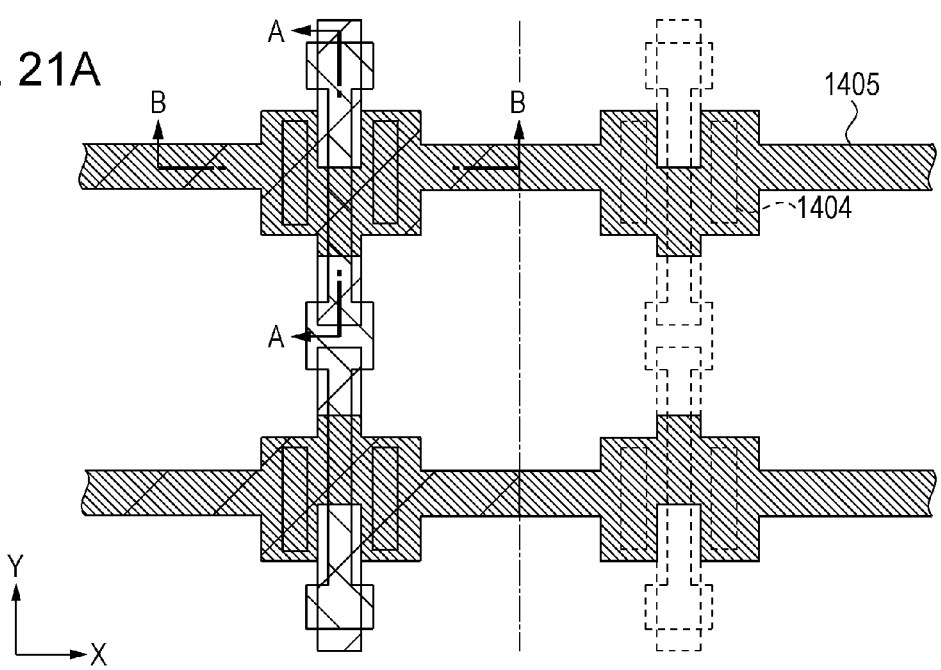
FIG. 21A is a drawing describing a method of manufacturing of an electro-optical device according to Embodiment 2.
Figure 21B:
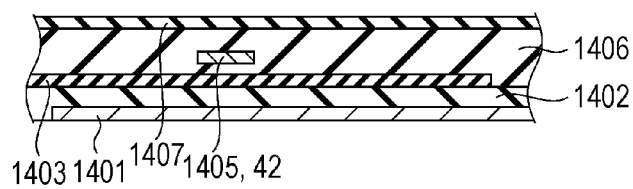
FIG. 21B is a drawing describing a method of manufacturing of an electro-optical device according to Embodiment 2.
Figure 21C:
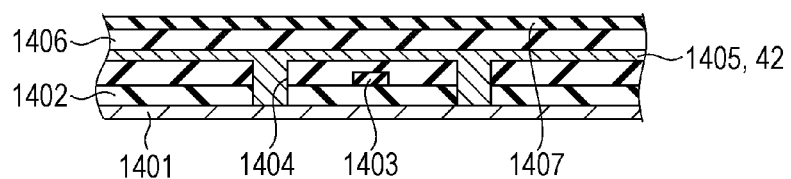
FIG. 21C is a drawing describing a method of manufacturing of an electro-optical device according to Embodiment 2.

Next, as shown in FIGS. 21A to 21C, after the first contact hole 1404 is opened in the gate insulating film and the base insulating film 1402, a sixth conductive film 1405 is formed on the gate insulating film. The first contact hole 1404 establishes the electrical connection between the fifth conductive film 1401 and the sixth conductive film 1405. The sixth conductive film 1405 functions as an upper side scanning line 42 and the semiconductor film 1403 facing the sixth conductive film 1405 via the gate insulating film becomes a channel forming region. Accordingly, the part that overlaps the semiconductor film 1403 at the sixth conductive film 1405 in plan view is the gate of the pixel transistor 44. The pixel transistor 44 is provided with a source and a drain on both sides of the channel forming region in plan view and has an LDD structure. That is, the source and drain are each provided with a low density region on both sides of the channel forming region, and are provided a high density region in a neighboring region on the opposite side of the channel forming region with respect to the low density region.

The sixth conductive film 1405 (scanning line 42 on the upper side) is formed from a conductive film, such as a degenerate semiconductor (conductive polysilicon film), a metal silicide film, a metal film or a metal compound film. In the embodiment, the sixth conductive film 1405 forms a two layer structure with a conductive polysilicon film and tungsten silicide film. Phosphorous diffusion is performed after the polycrystalline silicon film doped with phosphorous is deposited with a reduced pressure CVD method, the conductive polysilicon film is formed such that the phosphorous atoms are included in the semiconductor at a concentration of $1\times10^{19}/cm^3$ or more.

Next, the process proceeds to a step for forming the first interlayer insulating film 1406 so as to cover the sixth conductive film 1405. The first interlayer insulating film 1406 is formed from an NSG film or a silicon oxide film such as a silicon oxide film that includes or phosphorous (PSG film), silicon oxide film that includes boron (BSG film), or a silicon oxide film that includes boron and phosphorous (BPSG film). Such an insulating film is formed by a normal pressure CVD method, a reduced pressure CVD method, or a plasma CVD method using silane gas, dichlorosilane, TEOS, TEB (tetra ethyl borate), TMOP (tetra myethyl oxy phoslate).

Next, the process proceeds to a step for forming the first protective film 1407 so as to cover the first interlayer insulating film 1406. The first protective film 1407 is formed from a silicon nitride film (SiN), and is formed by a normal pressure CVD method, a reduced pressure CVD method or a plasma CVD method or the like using silane gas, dichlorosilane, ammonia ($NH_3$), nitrogen ($N_2$) or the like.

Figure 22B:
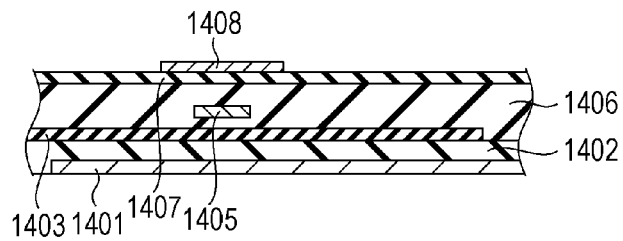
FIG. 22B is a drawing describing a method of manufacturing of an electro-optical device according to Embodiment 2.
Figure 22C:
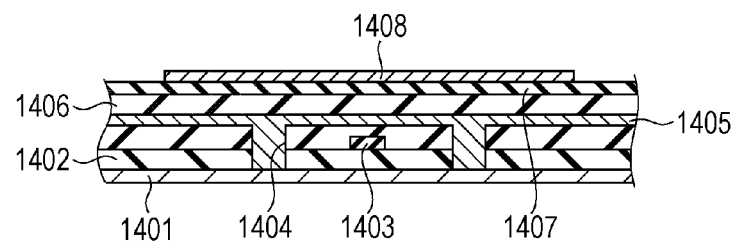
FIG. 22C is a drawing describing a method of manufacturing of an electro-optical device according to Embodiment 2.

Next, as shown in FIGS. 22A to 22C, the process proceeds to a step for forming the first conductive film 1408 on the first protective film 1407. The first conductive film 1408 is a degenerate semiconductor in which phosphorous atoms are included at a concentration of $1\times10^{19}/cm^3$ or more.

Figure 23A:
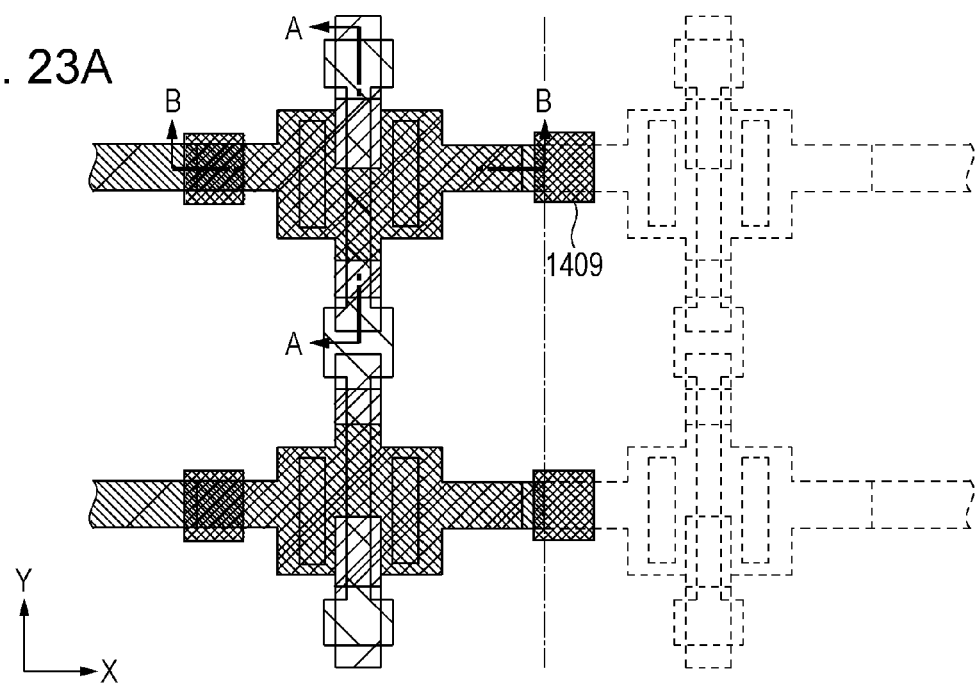
FIG. 23A is a drawing describing a method of manufacturing of an electro-optical device according to Embodiment 2.
Figure 23B:
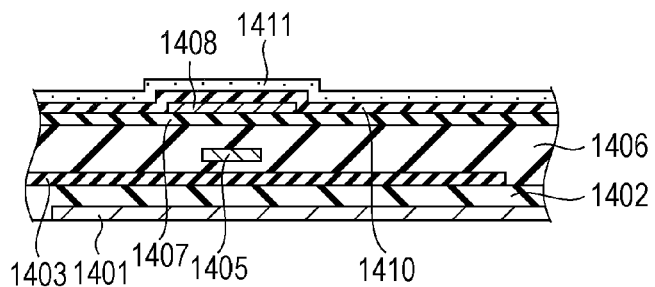
FIG. 23B is a drawing describing a method of manufacturing of an electro-optical device according to Embodiment 2.
Figure 23C:
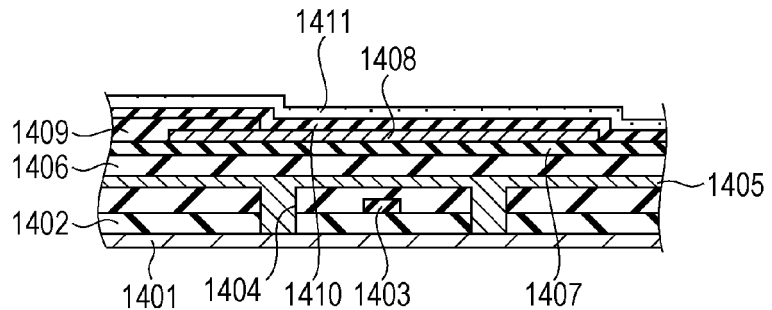
FIG. 23C is a drawing describing a method of manufacturing of an electro-optical device according to Embodiment 2.

Next, as shown in FIGS. 23A to 23C, the process proceeds to a step for forming the second protective film 1409 on the first conductive film 1408, and a step for removing the second protective film 1409 from the upper surface and a portion of the outer periphery of the first conductive film 1408. The second protective film 1409 is formed from a silicon oxide film, such as an NSG film, a PSG film, a BSG film, and a BPSG film, and is subjected to patterning work so as to cover a portion (location at which the fifth contact hole 1421 is later formed) of the first conductive film 1408 after being deposited similarly to the first interlayer insulating film 1406. This is the step for forming the second protective film 1409. After the step for forming the second protective film 1409, the second protective film 1409 remaining on the upper surface (first surface) and the outer peripheral side surface (fourth surface) of the first conductive film 1408 with a wet etching method using a hydrofluoric acid aqueous solution. This is the step for removing the second protective film 1409 from a portion of the outer periphery of the first conductive film 1408. In short, the second protective film 1409 is removed from a region in which the first capacitive element 1491 and the fourth capacitive element 1494. Because both the second protective film 1409 and the first interlayer insulating film 1406 are oxide films, etching with wet etching is possible. By providing the first protective film 1407 formed from a nitride film, the concern of the first interlayer insulating film 1406 being etched by the step for removing the second protective film 1409 from a portion of the outer periphery of the first conductive film 1408 is eliminated, and the concern of the bottom portion of the first conductive film 1408 being etched is eliminated. That is, the first protective film 1407 is an etching stopper in the step for removing the second protective film 1409 from a portion of the outer periphery of the first conductive film 1408.

After the oxide film is removed from the first surface and the fourth surface of the first conductive film 1408, the process proceeds to a step for forming the first dielectric film 1410 and a step for forming the second conductive film 1411. As the first dielectric film 1410, it is possible to use a dielectric layer with a high dielectric constant, such as an aluminum oxide film, a titanium oxide film, a tantalum oxide film, a niobium oxide film, a hafnium oxide film, a lanthanum oxide film, and a zirconium oxide film, in addition to the silicon compounds such as a silicon oxide film and a silicon nitride film. It is possible for the second conductive film 1411 to use a conductive film such as a conductive polysilicon film, a metal silicide film, a metal film, or a metal compound film. In the embodiment, the first dielectric film 1410 is a silicon nitride film and the second conductive film 1411 is a degenerate semiconductor.

Figure 24B:
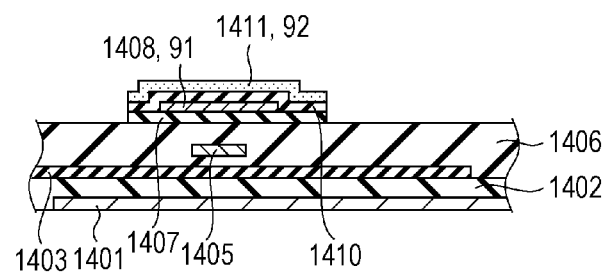
FIG. 24B is a drawing describing a method of manufacturing of an electro-optical device according to Embodiment 2.
Figure 24C:
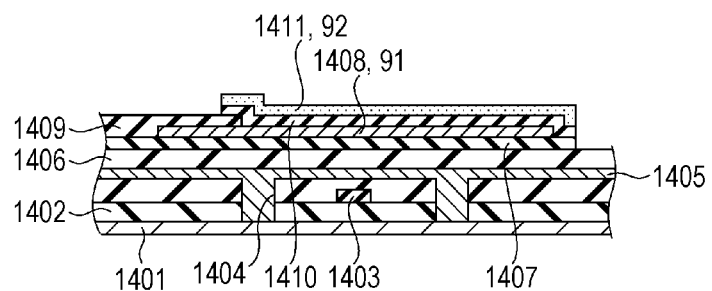
FIG. 24C is a drawing describing a method of manufacturing of an electro-optical device according to Embodiment 2.

Next, as shown in FIGS. 24A to 24C, the process proceeds to the step for performing patterning work on the second conductive film 1411. During the patterning work on the second conductive film 1411, it is preferable that the first protective film 1407 present in the opening region (in the pixel 41, region not overlapping on the fifth conductive film 1401, the second conductive film 1411, or the signal line 43 (refer to FIGS. 30A to 30C) formed thereafter in plan view) of the pixel 41 be removed. By doing so, hydrogen is diffused in the semiconductor film 1403 in the forming gas (gas including hydrogen in an inert gas at a concentration of less than 4%) annealing or hydrogen plasma process performed later and the termination of defects (such as unpaired bonding pairs or stacking defects) in the semiconductor film 1403 is promoted. In this case, the second protective film 1409 functions as an etching stopper. The part of the first electrode 91 (first conductive film 1408) covered by the second protective film 1409 is electrically connected to the common electrode line in a later step. In a case where the second protective film 1409 is not present, during etching of the second electrode 92 (second conductive film 1411), although the first electrode 91 (first conductive film 1408) is subjected to etching and is not easily electrically connected to the common electrode, the electrical connection of the first conductive film 1408 and the common potential line 1471 is reliable by the second protective film 1409 being present. It is preferable that the first protective film 1407, the first conductive film 1408, the first dielectric film 1410 and the second conductive film 1411 be removed from the site at which the third contact hole 1412 (refer to FIGS. 26A to 26C) is later formed.

Figure 25A:
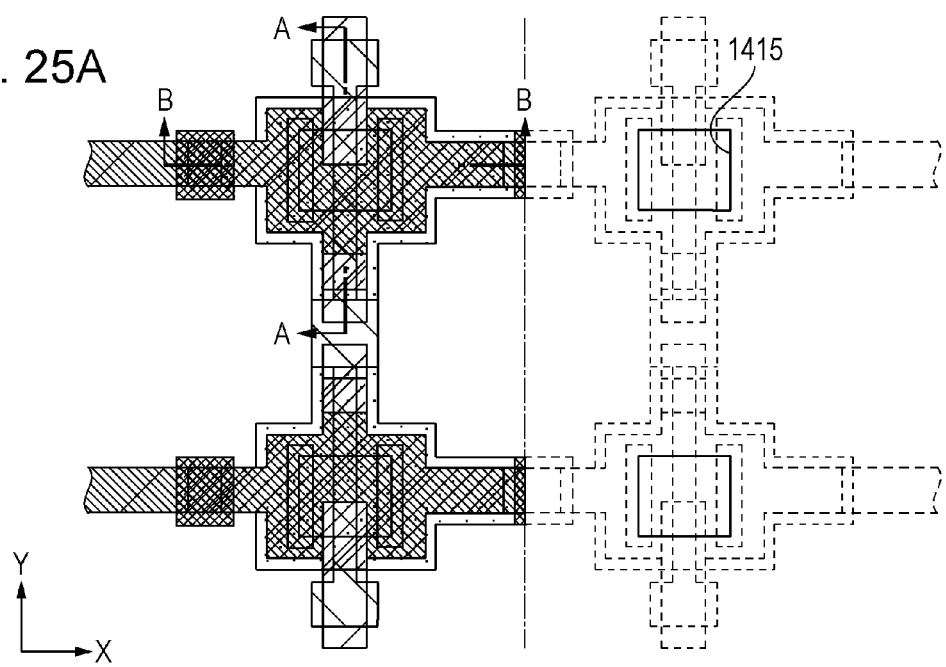
FIG. 25A is a drawing describing a method of manufacturing of an electro-optical device according to Embodiment 2.
Figure 25B:
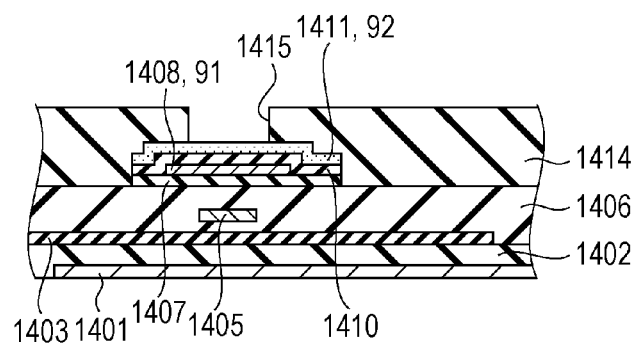
FIG. 25B is a drawing describing a method of manufacturing of an electro-optical device according to Embodiment 2.
Figure 25C:
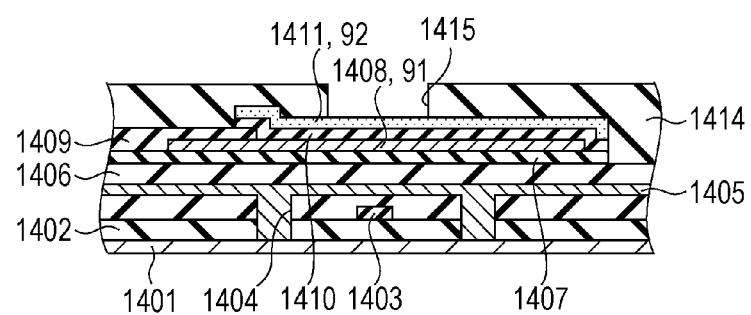
FIG. 25C is a drawing describing a method of manufacturing of an electro-optical device according to Embodiment 2.

Next, as shown in FIGS. 25A to 25C, the process proceeds to the step for forming the second interlayer insulating film 1414 between the step for forming the second conductive film 1411 and the step for opening the third contact hole 1412. The second interlayer insulating film 1414 is formed from an NSG film or a silicon oxide film such as a PSG film, a BSG film, or a BPSG film. The insulating films are formed by a normal pressure CVD method, a reduced pressure CVD method, or a plasma CVD method using silane gas, dichlorosilane, TEOS, TEB, TMOP, or the like. After the second interlayer insulating film 1414 is deposited, the second contact hole 1415 is opened on the inside of the second conductive film 1411.

Figure 26A:
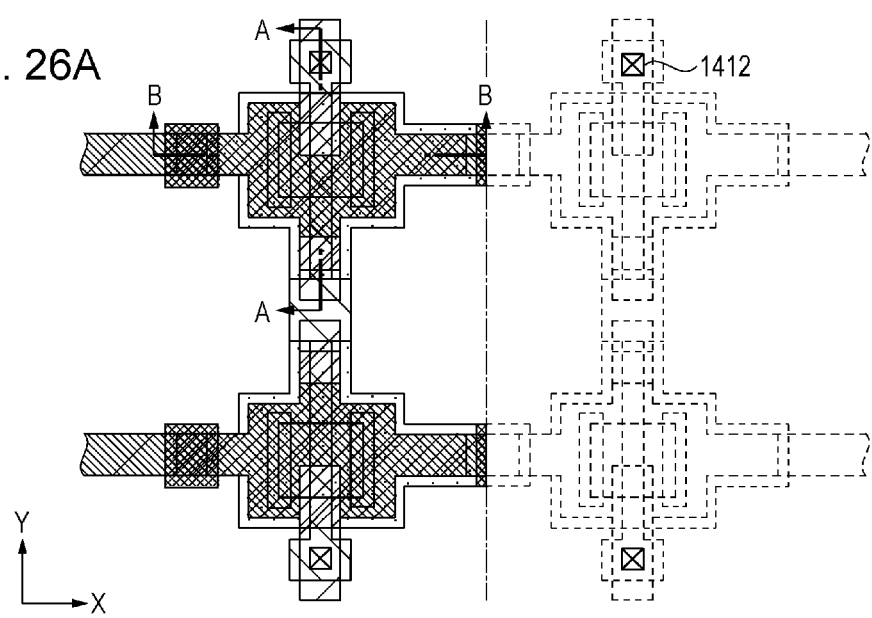
FIG. 26A is a drawing describing a method of manufacturing of an electro-optical device according to Embodiment 2.
Figure 26B:
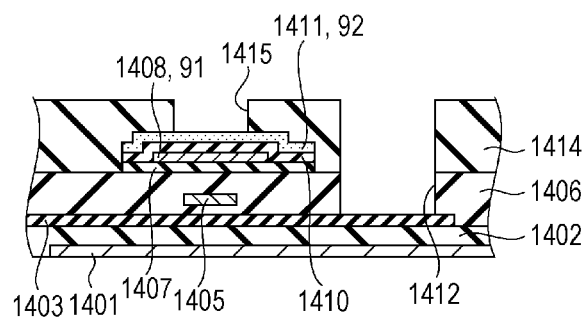
FIG. 26B is a drawing describing a method of manufacturing of an electro-optical device according to Embodiment 2.
Figure 26C:
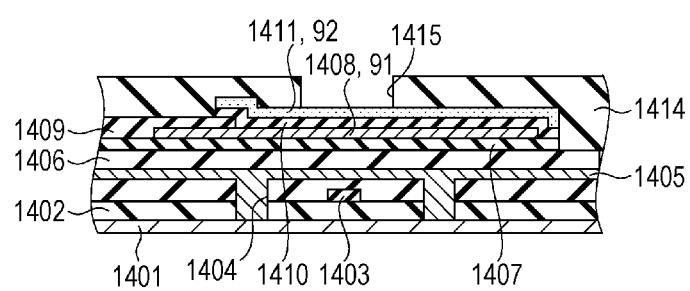
FIG. 26C is a drawing describing a method of manufacturing of an electro-optical device according to Embodiment 2.

Next, as shown in FIGS. 26A to 26C, the third contact hole 1412 that electrically connects the other of the source and drain of the pixel transistor 44 and the second electrode 92 of the capacitive element is opened. In short, the process proceeds to a step for opening the third contact hole 1412 in the second interlayer insulating film 1414, the first interlayer insulating film 1406, and the gate insulating film between the step for forming the second conductive film 1411 and the step for forming the third conductive film 1416. It is possible for the wet etching using the hydrofluoric acid aqueous solution to be applied to the opening of the third contact hole 1412. The second conductive film 1411 also serves a role of protecting the first dielectric film 1410 in this case from the hydrofluoric acid aqueous solution. Since the third contact hole 1412 is opened in the insulating film and the second interlayer insulating film 1414 that cover the semiconductor film, such as the gate insulating film or the first interlayer insulating film 1406, the capacitance value of the third capacitive element 1493 increases.

Figure 27B:
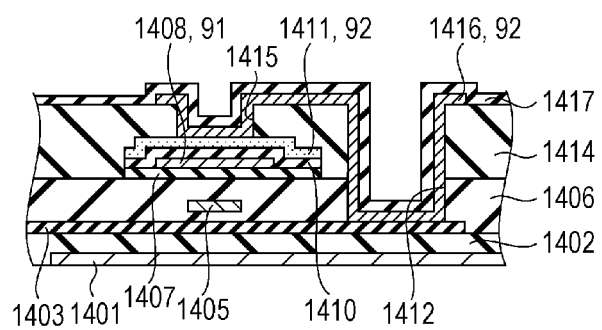
FIG. 27B is a drawing describing a method of manufacturing of an electro-optical device according to Embodiment 2.
Figure 27C:
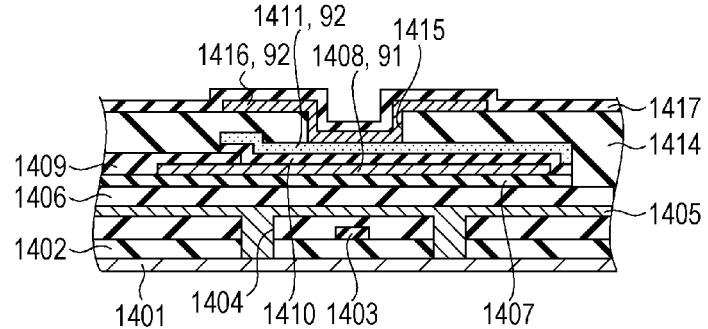
FIG. 27C is a drawing describing a method of manufacturing of an electro-optical device according to Embodiment 2.

Next, as shown in FIGS. 27A to 27C, the process proceeds to a step of forming the third conductive film 1416 on the second conductive film 1411, and a step for forming the second dielectric film 1417. It is possible for the third conductive film 1416 to use a conductive film such as a conductive polysilicon film, a metal silicide film, a metal film, or a metal compound film. The other of the source and drain of the pixel transistor 44 and the second electrode 92 of the capacitive element are electrically connected by the third conductive film 1416. It is possible for the second dielectric film 1417 to use a dielectric layer with a high dielectric constant, such as an aluminum oxide film, a titanium oxide film, a tantalum oxide film, a niobium oxide film, a hafnium oxide film, a lanthanum oxide film, and a zirconium oxide film, in addition being able to use the silicon compounds such as a silicon oxide film and a silicon nitride film. In the embodiment, the third conductive film 1416 is a degenerate semiconductor, and the second dielectric film 1417 is a silicon nitride film. Specifically, the third conductive film 1416 is formed so as to completely cover the second contact hole 1415 in plan view.

Figure 28B:
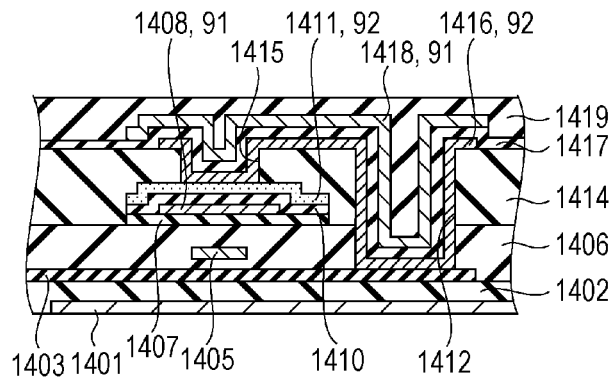
FIG. 28B is a drawing describing a method of manufacturing of an electro-optical device according to Embodiment 2.
Figure 28C:
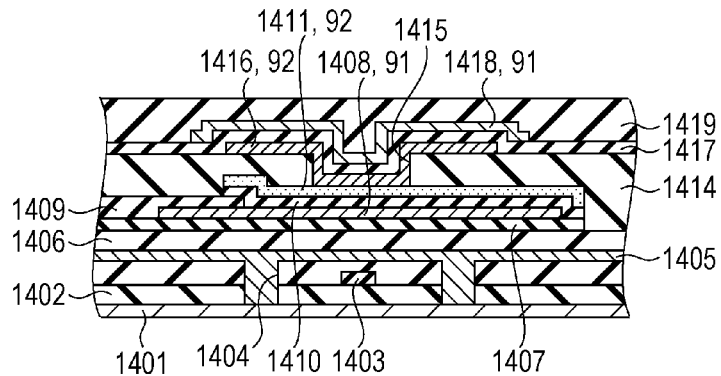
FIG. 28C is a drawing describing a method of manufacturing of an electro-optical device according to Embodiment 2.

Next, as shown in FIGS. 28A to 28C, the process proceeds to the step for forming the fourth conductive film 1418. It is possible for the fourth conductive film 1418 to use a conductive film such as a conductive film polysilicon film or metal silicide film, metal film or metal compound film, and in the embodiment, the fourth conductive film 1418 is a metal film, and, specifically, is a tungsten silicide film. The fourth conductive film 1418 is formed so as to cover the third conductive film 1416 as much as possible in plan view in a range not impairing the aperture ratio (proportion of the opening region in the pixel 41). In so doing, it is possible for the capacitance value of the fifth capacitive element 1495 to be increased. Next, the process proceeds to a step for forming the third interlayer insulating film 1419 after forming the fourth conductive film 1418. The third interlayer insulating film 1419 is formed from an NSG film or a silicon oxide film such as a PSG film, a BSG film, or a BPSG film. The insulating films are formed by a normal pressure CVD method, a reduced pressure CVD method, or a plasma CVD method using silane gas, dichlorosilane, TEOS, TEB, TMOP, or the like.

Figure 29A:
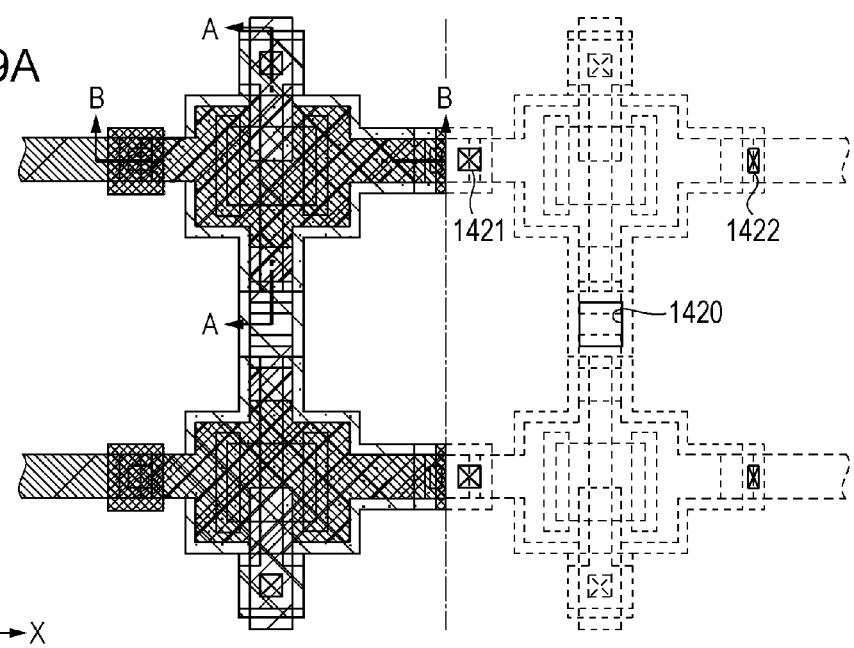
FIG. 29A is a drawing describing a method of manufacturing of an electro-optical device according to Embodiment 2.
Figure 29B:
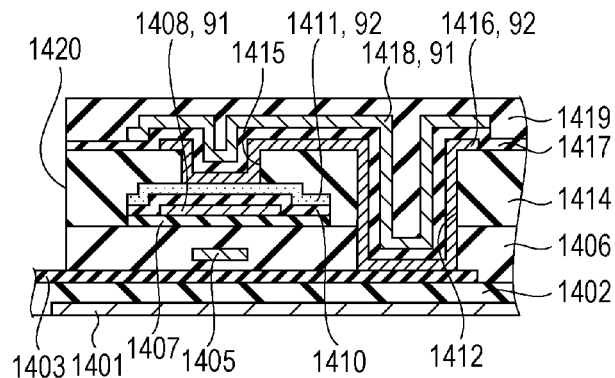
FIG. 29B is a drawing describing a method of manufacturing of an electro-optical device according to Embodiment 2.
Figure 29C:
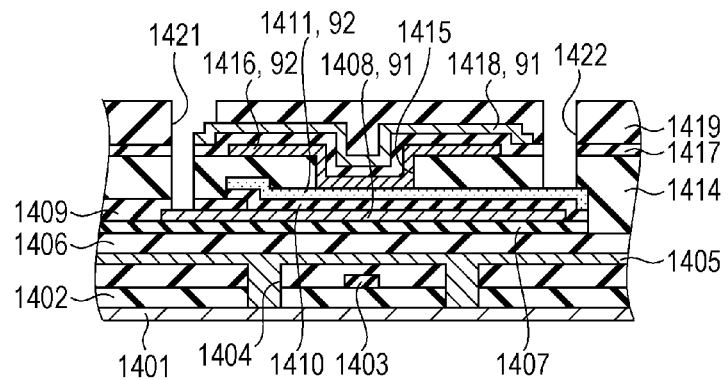
FIG. 29C is a drawing describing a method of manufacturing of an electro-optical device according to Embodiment 2.

Next, as shown in FIGS. 29A to 29C, the process proceeds to a step for opening the fourth contact hole 1420 or the like. In this step, the fifth contact hole 1421 and the sixth contact hole 1422 are also opened in addition to the fourth contact hole 1420. The fourth contact hole 1420 is a contact hole for electrically connecting the signal line 43 and one of the source and drain of the pixel transistor 44. The fifth contact hole 1421 is a contact hole for electrically connecting the first electrode 91 (first conductive film 1408 and fourth conductive film 1418) and the common potential line relay electrode 1472 (refer to FIGS. 30A to 30C). The sixth contact hole 1422 is a contact hole for electrically connecting the second electrode 92 (or second conductive film 1411 and third conductive film 1416 that electrically connect thereto) and the pixel electrode relay electrode 1452 (refer to FIGS. 30A to 30C).

Through the fifth contact hole 1421 that electrically connects the first conductive film 1408 and the fourth conductive film 1418, it is possible for the first conductive film 1408 and the fourth conductive film 1418 provided stacked in a narrow region to be given the same potential. The fifth contact hole 1421 has a site that reaches the first conductive film 1408 passing through the third interlayer insulating film 1419, the second dielectric film 1417, the second interlayer insulating film 1414, and the second protective film 1409, and a site that reaches the fourth conductive film 1418 passing through the third interlayer insulating film 1419. That is, the first conductive film 1408 is exposed in a portion of the inside if the fifth contact hole 1421 and the fourth conductive film 1418 is exposed in another portion of the fifth contact hole 1421. It can be said that the fourth conductive film 1418 extends to another portion of the inside of the fifth contact hole 1421. In short, the first conductive film 1408 and the fourth conductive film 1418 are electrically connected via one fifth contact hole 1421 opened in one step.

Figure 30A:
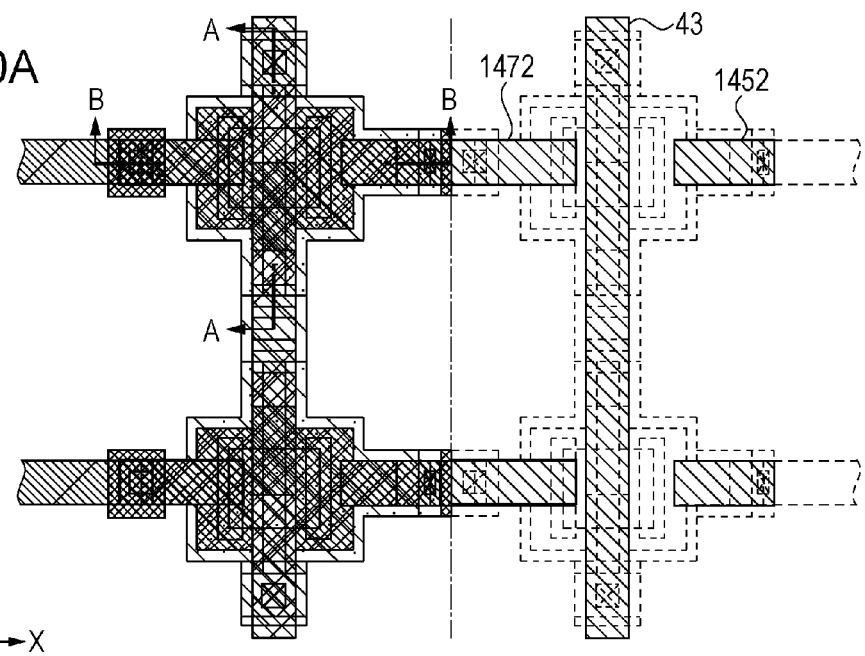
FIG. 30A is a drawing describing a method of manufacturing of an electro-optical device according to Embodiment 2.
Figure 30B:
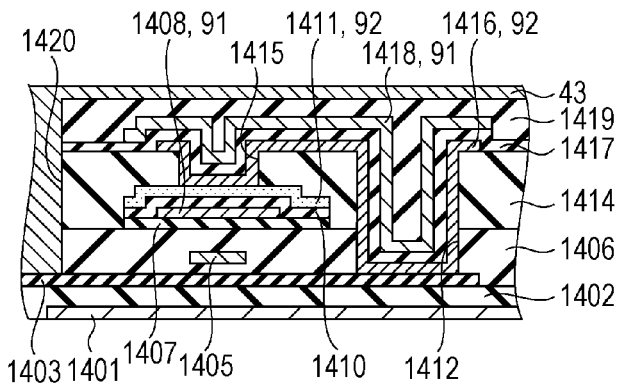
FIG. 30B is a drawing describing a method of manufacturing of an electro-optical device according to Embodiment 2.
Figure 30C:
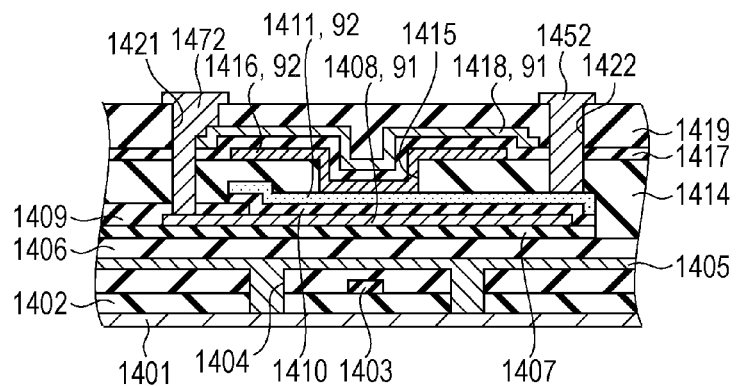
FIG. 30C is a drawing describing a method of manufacturing of an electro-optical device according to Embodiment 2.

Next, as shown in FIGS. 30A to 30C, the process proceeds to the step for forming the signal line 43. In this step, the common potential line relay electrode 1472 and the pixel electrode relay electrode 1452 are formed. The signal line 43, the common potential line relay electrode 1472, and the pixel electrode relay electrode 1452 are formed from a conductive film, such as a conductive polysilicon film, a metal silicide film, a metal film, or a metal compound film. The fourth contact hole 1420 is embedded in the signal line 43, the fifth contact hole 1421 is embedded in the common potential line relay electrode 1472, and the sixth contact hole 1422 is embedded in the pixel electrode relay electrode 1452 by the conductive film. In the embodiment, the signal line 43 and the common potential line relay electrode 1472 or the pixel electrode relay electrode 1452 are formed from an aluminum alloy film or a laminated film with two to four layers of a titanium nitride film and an aluminum film.

A transmissive fourth interlayer insulating film, not shown, formed from a silicon oxide film is formed on the upper layer side of the signal line 43 and the common potential line relay electrode 1472 or the pixel electrode relay electrode 1452, and the surface of the fourth interlayer insulating film is planarized. The common potential line 1471 that includes an aluminum film, an aluminum alloy film or the like is formed on the upper layer side of the fourth interlayer insulating film. The common potential line 1471 is electrically connected to the common potential line relay electrode 1472 via the seventh contact hole, not shown, opened in the fourth interlayer insulating film.

A transmissive fifth interlayer insulating film, not shown, formed from a silicon oxide film is formed on the upper layer side of the common potential line 1471, and the surface of the fifth interlayer insulating film is planarized. A transparent conductive film formed from ITO or the like is formed as the pixel electrode 45 on the upper layer side of the fifth interlayer insulating film. The pixel electrode 45 is electrically connected to the pixel electrode relay electrode 1452 via the eighth contact hole, not shown, opened in the fourth and fifth interlayer insulating films.

Thereafter, the first alignment film. 65 is formed so as to cover the pixel electrode 45 and the element substrate 62 that configures the electro-optical device 200 is completed.

The term "substantially the same" in the description signifies being the same in terms of the design concept. That is, even if a certain number of errors or the like arise, the other intentionally varied in the design concept is said to be "substantially the same".

Embodiment 3

[DAC]

Figure 31:
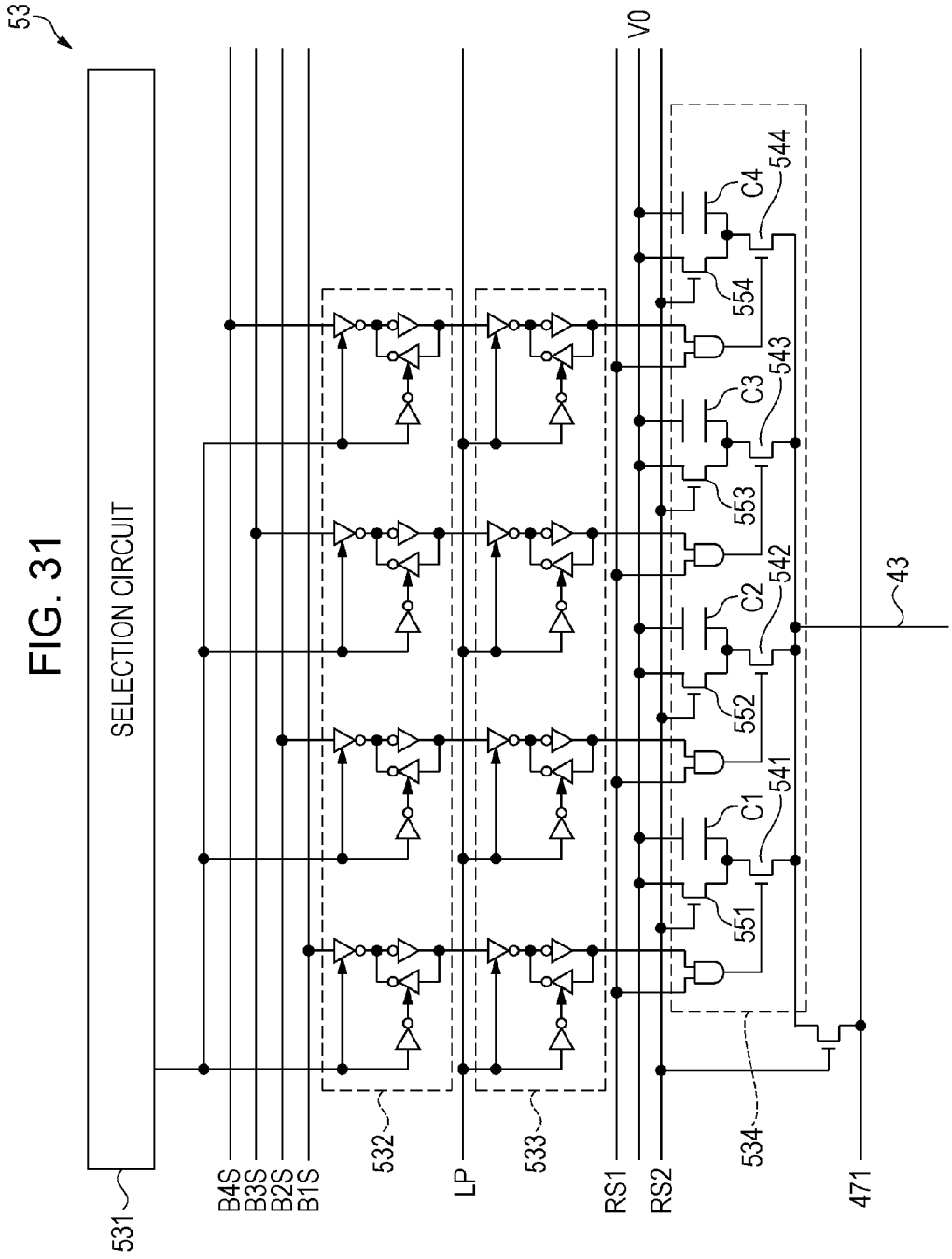
FIG. 31 is a drawing describing a signal line driving circuit according to Embodiment 3.

FIG. 31 is a drawing describing a signal line driving circuit according to Embodiment 3. Next, the electro-optical device 200 using the signal line driving circuit according to Embodiment 3 will be described with reference to FIG. 31. The same constituent parts as Embodiments 1 and 2 are given the same reference symbols and overlapping description will not be made.

In the electro-optical device 200 of the embodiment shown in FIG. 31, a capacitance division DAC is used in signal line driving circuit 53, and the semiconductor circuit described in detail in Embodiment 1 (FIG. 5) is used in the DAC. Other configurations are substantially the same as Embodiment 1.

As shown in FIG. 31, the signal line driving circuit 53 of the embodiment includes a 4-bit digital data driver (4-bit DAC 534). The signal line driving circuit 53 includes a selection circuit 531 including a transistor circuit, not shown, or the like, a digital video signal line that includes a first bit signal line B1S, a second bit signal line B2S, a third bit signal line B3S, and a fourth bit signal line B4S, a first latching circuit 532, a latching pulse line LP, a second latching circuit 533, a first reset signal ling RS1, a reference potential line V0, a second reset signal line RS2, a 4-bit DAC 534, a common potential line 471 or the like. The output of the 4-bit DAC 534 is connected to the signal line 43.

The 4-bit DAC 534 includes a first bit capacitive element (capacitance value indicated by C1) corresponding to the first bit signal, a second capacitive element (capacitance value indicated by C2) corresponding to the second bit signal, a third bit capacitive element (capacitance value indicated by C3) corresponding to the third bit signal, and a fourth bit capacitive element (capacitance value indicated by C4) corresponding to the fourth bit signal. Each capacitance value satisfies the relationship of C1=C2/2=C3/4=C4/8. The digital video signal output from the display signal supply circuit 32 is directly input to the digital video signal line.

The first bit signal controls the operation of the first control transistor 541. The reference potential is charged to the first bit capacitive element via the first reset transistor 551. Similarly, the second bit signal controls the operation of the second control transistor 542. The reference potential is charged to the second bit capacitive element via the second reset transistor 552. Similarly, the third bit signal controls the operation of the third control transistor 543. The reference potential is charged to the third bit capacitive element via the third reset transistor 553. Similarly, the fourth bit signal controls the operation of the fourth control transistor 544. The reference potential is charged to the fourth bit capacitive element via the fourth reset transistor 554.

It is possible for even capacitance value C1 with the smallest capacitance value to be sufficiently increased more than the sum of the capacitance value of the parasitic capacitance of the signal line 43, the capacitance value of the capacitive element of the pixel 41 and the capacitance value of the liquid crystal capacitance for forming an excellent display. Accordingly, the capacitance value of these bit capacitive elements is generally increased by 10 times or more that capacitance of the capacitive element of the pixel 41, and it is necessary to form the large capacitance within the pixel 41 pitch (alternatively, between the signal line 43 and the signal line 43 neighboring thereto).

In the embodiment, the semiconductor circuit described in detail in Embodiment 1 is applied to the 4-bit DAC 534. Specifically, with respect to the first bit signal, the transistor described in Embodiment 1 is at least one of the first control transistor 541 and a first reset transistor 551, and the capacitive element described in Embodiment 1 is the first bit capacitive element. Similarly, with respect to the second bit signal, the transistor described in Embodiment 1 is at least one of the second control transistor 542 and the second reset transistor 552, and the capacitive element described in Embodiment 1 is the second bit capacitive element.

Similarly, with respect to the third bit signal, the transistor described in Embodiment 1 is at least one of the third control transistor 543 and a third reset transistor 553, and the capacitive element described in Embodiment 1 is the third bit capacitive element. Similarly, with respect to the fourth bit signal, the transistor described in Embodiment 1 is at least one of the fourth control transistor 544 and a fourth reset transistor 554, and the capacitive element described in Embodiment 1 is the fourth bit capacitive element. By doing so, it is possible for the digital data driver to be formed in a narrow region between signal lines 43, and possible for an electro-optical device 200 to be realized in which higher definition and gradation expression using digital driving are both realized.

[Other Electronic Apparatuses]

Although the electro-optical device 200 takes the above-described configuration, examples of the electronic equipment to which the electro-optical device 200 is incorporated include a rear projection-type television, a direct-view television, a portable telephone, a portable audio device, a personal computer, a monitor for a video camera, a car navigation device, a pager, an electronic notebook, a calculator, a word processor, a workstation, a video telephone, a POS terminal, and a digital still camera, in addition to the projector described with reference to FIG. 1. In this way, an electronic apparatus provided with an excellent electro-optical device with high resolution and in which display defects are suppressed according to the embodiment is realized.

In a case of incorporating the electro-optical device 200 of the embodiment in a full color mobile tablet terminal, because the 4-bit digital data driver is built into the element substrate 62 and the digital video signal is input from the control device 30 directly to the electro-optical device 200, it is possible to make the consumed power extremely low at the same time as making the circuit configuration simple. Because the electro-optical device 200 is high performance, mobile tablet terminal is an excellent electronic apparatus having an extraordinarily beautiful display screen. According to the embodiment, it is possible for an electronic apparatus provided with an electro-optical device with a high resolution and capable of gradation expression using digital driving to be realized.

Here, the invention is not limited to the above-mentioned embodiments, and various modifications, improvements, and the like can be added to the above-mentioned embodiments.

The entire disclosure of Japanese Patent Application No.: 2014-075179, filed Apr. 1, 2014 and 2014-075180, filed Apr. 1, 2014 and 2014-075181, filed Apr. 1, 2014 is expressly incorporated by reference herein.

REFERENCE SIGNS LIST

20 Mounting region
30 Control device
32 Display signal supply circuit
33 Memory circuit
40 Display region
41 Pixel
42 Scanning line
43 Signal line
44 Pixel transistor
45 Pixel electrode
46 Liquid crystal
47 Common electrode
48 Light blocking layer
50 Driving portion
51 Driving circuit
52 Scanning line driving circuit
53 Signal line driving circuit
62 Element substrate
63 Counter substrate
64 Seal material
65 First alignment film
66 Second alignment film
91 First electrode
92 Second electrode
100 Projection-type display device
110 Illumination optical system
130 Projection optical system
140 Projection surface
200 Electro-optical device
201 First panel
202 Second panel
203 Third panel
401 Sixth conductive film
402 Base insulating film
403 Semiconductor film
404 First contact hole
405 Seventh conductive film
406 First interlayer insulating film 407 First protective film
408 First conductive film
409 Second protective film
410 First dielectric film
411 Second conductive film
412 Second contact hole
413 Fifth conductive film
414 Second interlayer insulating film
415 Third contact hole
416 Third conductive film
417 Second dielectric film
418 Fourth conductive film
419 Third interlayer insulating film
420 Fourth contact hole
421 Fifth contact hole
422 Sixth contact hole
452 Pixel electrode relay electrode
471 Common potential line
472 Common potential line relay electrode
491 First capacitive element
492 Second capacitive element
493 Third capacitive element
494 Fourth capacitive element
495 Fifth capacitive element
496 Sixth capacitive element
497 Seventh capacitive element
531 Selection circuit
532 First latching circuit
533 Second latching circuit
534 4-bit DAC
541 First control transistor
542 Second control transistor
543 Third control transistor
544 Fourth control transistor
551 First reset transistor
552 Second reset transistor
553 Third reset transistor
554 Fourth reset transistor
1401 Fifth conductive film
1402 Base insulating film
1403 Semiconductor film
1404 First contact hole
1405 Sixth conductive film
1406 First interlayer insulating film
1407 First protective film
1408 First conductive film
1409 Second protective film
1410 First dielectric film
1411 Second conductive film
1412 Third contact hole
1414 Second interlayer insulating film
1415 Second contact hole
1416 Third conductive film
1417 Second dielectric film
1418 Fourth conductive film
1419 Third interlayer insulating film
1420 Fourth contact hole
1421 Fifth contact hole
1422 Sixth contact hole
1452 Pixel electrode relay electrode
1471 Common potential line
1472 Common potential line relay electrode
1491 First capacitive element
1492 Second capacitive element
1493 Third capacitive element
1494 Fourth capacitive element
1495 Fifth capacitive element
1496 Sixth capacitive element
1497 Seventh capacitive element
1531 Selection circuit
1532 First latching circuit
1533 Second latching circuit
1534 4-bit DAC
1541 First control transistor
1542 Second control transistor
1543 Third control transistor
1544 Fourth control transistor
1551 First reset transistor
1552 Second reset transistor
1553 Third reset transistor
1554 Fourth reset transistor
100 Projection-type display device
110 Illumination optical system
130 Projection optical system
140 Projection surface

The invention claimed is:

1. An electro-optical device comprising:
a transistor;
a first capacitive element;
a second capacitive element;
a third capacitive element;
a fourth capacitive element; and
a fifth capacitive element,
wherein
the first capacitive element includes a first conductive film, a first part of a second conductive film, and a first dielectric film arranged between the first conductive film and the first part of the second conductive film,
the second capacitive element includes the first conductive film, a second part of the second conductive film, and the first dielectric film arranged between the first conductive film and the second part of the second conductive film,
the third capacitive element includes a third conductive film, a third part of a fourth conductive film, and a second dielectric film arranged between the third conductive film and the third part of the fourth conductive film,
the fourth capacitive element includes the third conductive film, a fourth part of the fourth conductive film, and the second dielectric film arranged between the third conductive film and the fourth part of the fourth conductive film,
the first conductive film includes a first surface and a second surface that intersects the first surface,
the third conductive film includes a fourth surface that intersects the third surface and a fifth surface that intersects the third surface of the third conductive film and is different from the fourth surface,
the fifth capacitive element includes the third conductive film, a fifth part of the fourth conductive film, and the second dielectric film arranged between the third conductive film and the fifth part of the fourth conductive film,
the third conductive film includes a third surface,
the first part is arranged so as to face the first surface,
the second part is arranged so as to face the second surface,
the third part is arranged so as to face the third surface,
the fourth part is arranged so as to face the fourth surface,
a fifth part is arranged so as to face the fifth surface, and the third conductive film and the second conductive film are electrically connected to one of a source and a drain of the transistor by a fifth conductive film that is arranged between the second conductive film and the third conductive film.

2. The electro-optical device according to claim 1, wherein the first capacitive element and the third capacitive element are electrically connected in parallel.

3. The electro-optical device according to claim 1, wherein the thickness of the first conductive film and the third conductive film is 600 nanometers or less.

4. The electro-optical device according to claim 1, further comprising:
a scanning line;
a signal line; and
a pixel transistor,
wherein a gate of the pixel transistor is electrically connected to the scanning line, one of a source and drain of the pixel transistor is electrically connected to the signal line; and
the other of the source and drain of the pixel transistor is electrically connected to the second conductive film.

5. An electronic apparatus comprising the electro-optical device according to claim 1.

6. An electro-optical device comprising:
a transistor;
a first capacitive element;
a second capacitive element; and
a third capacitive element,
wherein
the first capacitive element includes a first conductive film, a first part of a second conductive film, and a first dielectric film arranged between the first conductive film and the first part of the second conductive film,
the first conductive film includes a first surface,
the first part is arranged so as to face the first surface,
the second capacitive element includes a third conductive film, a second part of a fourth conductive film, and a second dielectric film arranged between the third conductive film and the second part of the fourth conductive film,
the third conductive film includes a second surface,
the second part is arranged so as to face the second surface,
the third capacitive element includes the third conductive film, a third part of the fourth conductive film, and the second dielectric film arranged between the third conductive film and the third part of the fourth conductive film,
the third conductive film includes a third surface,
the third part is arranged so as to face the third surface,
an insulating film covers a semiconductor film of the transistor,
a contact hole for electrically connecting one of a source and a drain of the transistor to the second conductive film is formed in the insulating film,
at least a portion of the third surface extends inside of the contact hole and
one of the source and the drain of the transistor and the second conductive film are electrically connected by a fifth conductive film.

7. The electro-optical device according to claim 6, wherein at least one of the first surface of the first conductive film and the first part of the second conductive film covers the transistor.

8. The electro-optical device according to claim 6, wherein at least one of the second surface of the third conductive film and the second part of the fourth conductive film covers the first capacitive element.

9. The electro-optical device according to claim 6, wherein the third conductive film and the fifth conductive film are electrically connected.

10. The electro-optical device according to claim 6, further comprising:
a fourth capacitive element,
wherein
the fourth capacitive element includes the first conductive film, a fourth part of the second conductive film, and the first dielectric film arranged between the first conductive film and the fourth part of the second conductive film,
the first conductive film includes a fourth surface,
the fourth part is arranged so as to face the fourth surface, and
the first surface intersects the fourth surface.

11. The electro-optical device according to claim 6, wherein a first protective film is arranged between the insulating film and the first conductive film.

12. The electro-optical device according to claim 6, further comprising:
a scanning line;
a signal line; and
a pixel switching element,
wherein the pixel switching element includes the transistor,
a gate of the transistor is electrically connected to the scanning line,
one of a source and drain of the transistor is electrically connected to the signal line, and the other of the source and drain of the transistor is electrically connected to the second conductive film.

13. An electro-optical device comprising:
a transistor;
a first capacitive element;
a second capacitive element; and
a third capacitive element,
wherein
the first capacitive element includes a first conductive film, a first part of a second conductive film, and a first dielectric film arranged between the first conductive film and the first part of the second conductive film,
the first conductive film includes a first surface,
the first part is arranged so as to face the first surface,
the second capacitive element includes a third conductive film, a second part of a fourth conductive film, and a second dielectric film arranged between the third conductive film and the second part of the fourth conductive film,
the third conductive film includes a second surface,
the second part is arranged so as to face the second surface,
the third capacitive element includes the third conductive film, a third part of the fourth conductive film, and the second dielectric film arranged between the third conductive film and the third part of the fourth conductive film,
the third conductive film includes a third surface,
the third part is arranged so as to face the third surface,
an insulating film covers a semiconductor film of the transistor,
in cross-sectional view, the first conductive film is arranged between the semiconductor film and the fourth conductive film, the second conductive film is arranged between the first conductive film and the fourth conductive film, and the third conductive film is arranged between the second conductive film and the fourth conductive film, a contact hole for electrically connecting one of a source and a drain of the transistor to the second conductive film is formed in the insulating film, and at least a portion of the third surface extends inside of the contact hole.

14. The electro-optical device according to claim 13, wherein the first capacitive element and the second capacitive element are electrically connected in parallel.

15. The electro-optical device according to claim 13, further comprising:

a contact hole that electrically connects the first conductive film and the fourth conductive film.

* * * * *